United States Patent
Park et al.

(10) Patent No.: US 11,250,768 B2
(45) Date of Patent: Feb. 15, 2022

(54) GATE DRIVING CIRCUIT AND DISPLAY APPARATUS COMPRISING THE SAME

(71) Applicant: LG Display Co., Ltd., Seoul (KR)

(72) Inventors: JaeKyu Park, Paju-si (KR); Sangki Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/130,173

(22) Filed: Dec. 22, 2020

(65) Prior Publication Data
US 2021/0201770 A1    Jul. 1, 2021

(30) Foreign Application Priority Data

Dec. 31, 2019 (KR) .................. 10-2019-0180119

(51) Int. Cl.
*G09G 3/32* (2016.01)

(52) U.S. Cl.
CPC ....... *G09G 3/32* (2013.01); *G09G 2300/0809* (2013.01); *G09G 2310/08* (2013.01)

(58) Field of Classification Search
CPC ....... G09G 2310/08; G09G 2300/0819; G09G 2300/0809; G09G 2310/0286; G09G 3/32; G09G 2310/0251; G09G 2300/0842; G09G 3/3266; G09G 3/3233; G11C 19/28
See application file for complete search history.

(56) References Cited

U.S. PATENT DOCUMENTS

| 8,830,156 B2 * | 9/2014 | Kim ................. G11C 19/28 345/100 |
| 2010/0134399 A1 * | 6/2010 | Ki ..................... G11C 19/28 345/94 |
| 2018/0337682 A1 * | 11/2018 | Takasugi ............. G09G 3/3241 |

FOREIGN PATENT DOCUMENTS

KR    10-2008-0003065 A    1/2008

* cited by examiner

*Primary Examiner* — Muhammad N Edun
(74) *Attorney, Agent, or Firm* — Birch, Stewart, Kolasch & Birch, LLP

(57) ABSTRACT

A gate driving circuit and a display apparatus comprising the same are disclosed, in which a maximum voltage level of a plurality of scan signals output from one stage circuit can be prevented from being deteriorated. The gate driving circuit comprises first to mth stage circuits, wherein each of the first to mth stage circuits includes a logic circuit portion controlling a voltage of each of a first control node and a second control node, a node boosting circuit boosting the voltage of each of the control nodes in accordance with boosting shift clock signals, a scan output circuit outputting each of first to ith scan shift clock signals as first to ith scan signals (i is a natural number of 3 or more) in response to the boosting voltage of the first control node, and a carry output circuit outputting carry shift clock signals as carry signals in response to the boosting voltage of the first control node.

23 Claims, 20 Drawing Sheets

GATE DRIVING CIRCUIT AND DISPLAY APPARATUS COMPRISING THE SAME

CROSS-REFERENCE TO RELATED APPLICATIONS

This application claims the benefit of and priority to the Korean Patent Application No. 10-2019-0180119 filed on Dec. 31, 2019 in the Republic of Korea, the entire contents of which are hereby expressly incorporated by reference as if fully set forth herein into the present application.

BACKGROUND

Technical Field

The present disclosure relates to a gate driving circuit and a display apparatus comprising the same.

Description of the Related Art

Recently, a display apparatus has become more important with the development of multimedia. In this respect, a flat panel display apparatus such as a liquid crystal display apparatus, an organic light emitting display apparatus, and a micro light emitting diode display apparatus has been commercially used.

The flat panel display apparatus includes a display panel including a plurality of pixels each having a thin film transistor connected to data and gate lines, a data driving circuit portion supplying a data voltage to the data line, and a gate driving circuit portion comprised of a shift register having a plurality of stages for supplying a gate signal to the gate line.

Recently, a Gate In Panel (GIP)-type display apparatus, in which a transistor constituting a stage of a shift register is embedded in a non-display area of a display panel in the form of a thin film transistor, has been used simultaneously with a manufacturing process of a thin film transistor of each pixel to simplify a structure of circuit components, reducing the manufacturing cost and reducing a bezel width.

SUMMARY OF THE INVENTION

The inventors of the present disclosure have carried out various experiments for a gate driving circuit of a new structure and a display apparatus comprising the same, in which a plurality of gate lines can be driven by one stage embodied in a gate driving circuit portion to reduce a bezel width of the display apparatus. According to various experiments, the inventors of the present disclosure have recognized a limitation that a maximum voltage level of each of a plurality of scan signals is reduced when one stage sequentially outputs the plurality of scan signals. The inventors of the present disclosure have invented a gate driving circuit of a new structure and a display apparatus comprising the same through various experiments, in which a maximum voltage level of a plurality of scan signals output from one stage can be prevented from being deteriorated.

The present disclosure has been made in view of the above problems and other limitations associated with the related art, and it is an object of the present disclosure to provide a gate driving circuit and a display apparatus comprising the same, in which a maximum voltage level of a plurality of scan signals output from one stage circuit can be prevented from being deteriorated.

It is another object of the present disclosure to provide a gate driving circuit and a display apparatus comprising the same, in which a size of the gate driving circuit is reduced.

It is other object of the present disclosure to provide a display apparatus that can make sure of a data charging time when it is driven at high speed.

In addition to the objects of the present disclosure as mentioned above, additional objects and features of the present disclosure will be clearly understood by those skilled in the art from the following description of the present disclosure.

A gate driving circuit according to one embodiment of the present disclosure comprises first to mth stage circuits (m is a positive number such as a positive integer), wherein each of the first to mth stage circuits includes a logic circuit portion controlling a voltage of each of a first control node and a second control node, a node boosting circuit boosting the voltage of each of the control nodes in accordance with boosting shift clock signals, a scan output circuit outputting each of first to ith scan shift clock signals as first to ith scan signals (i is a natural number of 3 or more) in response to the boosting voltage of the first control node, and a carry output circuit outputting carry shift clock signals as carry signals in response to the boosting voltage of the first control node.

A display apparatus according to one embodiment of the present disclosure comprises a display panel including a plurality of data lines, first to mth gate line groups having first to ith gate lines and a plurality of unit pixels having first to ith subpixels connected to their respective gate lines within the first to mth gate line groups and commonly connected to one data line, a gate driving circuit portion including first to mth stage circuits connected to the first to mth gate line groups, a data driving circuit portion sequentially supplying data voltages respectively corresponding to the first to ith subpixels, to each of the plurality of data lines, and a timing controller supplying subpixel data suitable for a driving order of the first to ith subpixels to the data driving circuit portion and controlling a driving timing of each of the gate driving circuit portion and the data driving circuit portion, wherein each of the first to mth stage circuits can include a logic circuit portion controlling a voltage of each of a first control node and a second control node, a node boosting circuit boosting the voltage of each of the control nodes in accordance with boosting shift clock signals, a scan output circuit outputting each of first to ith scan shift clock signals as first to ith scan signals (i is a natural number of 3 or more) in response to the boosting voltage of the first control node, and a carry output circuit outputting carry shift clock signals as carry signals in response to the boosting voltage of the first control node.

Details according to various embodiments of the present disclosure in addition to the above objects are included in the detailed description and drawings.

According to one embodiment of the present disclosure, a gate driving circuit and a display apparatus comprising the same can be provided, in which a maximum voltage level of a plurality of scan signals output from one stage circuit can be prevented from being deteriorated.

According to one embodiment of the present disclosure, a gate driving circuit and a display apparatus comprising the same can be provided, in which a size of the gate driving circuit is reduced.

According to one embodiment of the present disclosure, a display apparatus can be provided, which can make sure of a data charging time when it is driven at high speed.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
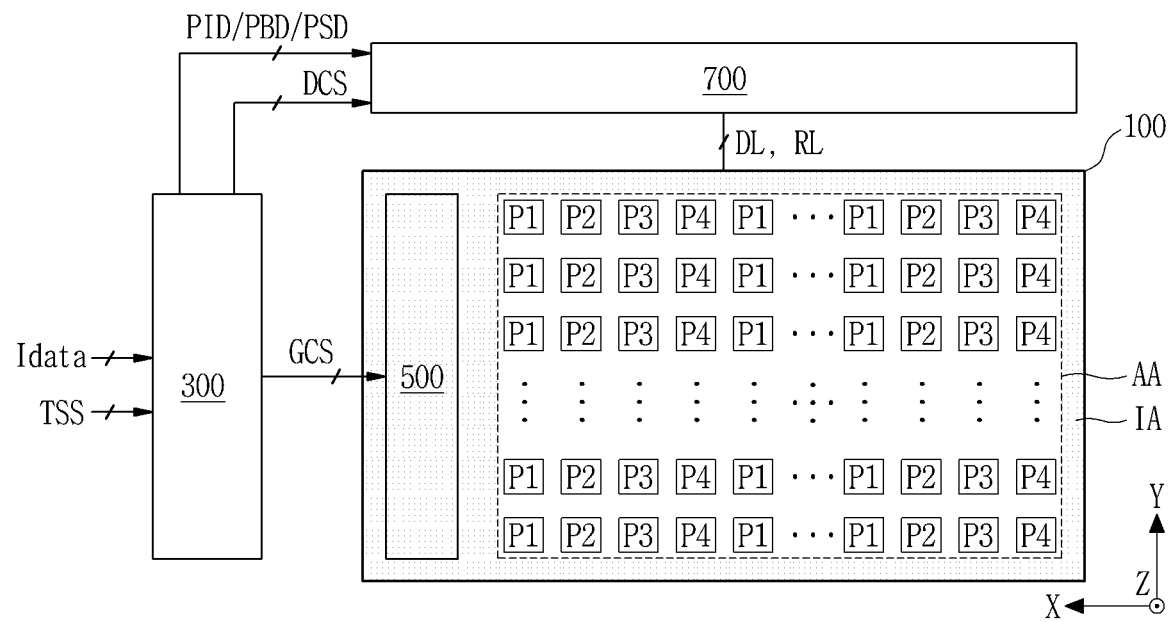
FIG. 1 is a view illustrating a display apparatus according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted or may be brief.

In a case where 'comprise', 'have', and 'include' described in the present disclosure are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

In the present disclosure, a subpixel circuit and a gate driving circuit, which are formed on a substrate of a display panel, can be embodied as n-type MOSFET type thin film transistors but are not limited thereto. The pixel circuit and the gate driving circuit can be embodied as p-type MOSFET type thin film transistors. The thin film transistor can include a gate, a source, and a drain. In the thin film transistor, a carrier moves from the source to the drain. In the n-type thin film transistor, since the carrier is an electron, a source voltage is lower than a drain voltage such that the electron can move from the source to the drain. In the n-type thin film transistor, since the electron moves from the source to the drain, a current moves from the drain to the source. In the p-type thin film transistor, since the carrier is a hole, the source voltage is higher than the drain voltage in order for the hole to move from the source to the drain. In the p-type thin film transistor, since the hole moves from the source to the drain, a current moves from the source to the drain. In the MOSFET type thin film transistor, the source and the drain are not fixed but can be changed depending on a voltage applied thereto. Therefore, in the description of the embodiment according to the present disclosure, a description will be given based on that any one of the source and the drain is referred to as a first source/drain electrode and the other one of the source and the drain is referred to as a second source/drain electrode.

Hereinafter, a gate driving circuit and a display apparatus comprising the gate driving circuit according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
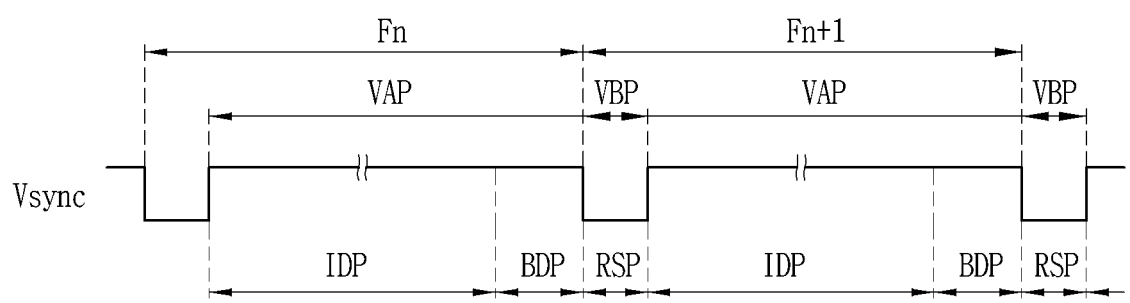
FIG. 2 is a view illustrating an operation period of a display panel shown in FIG. 1.
Figure 3:
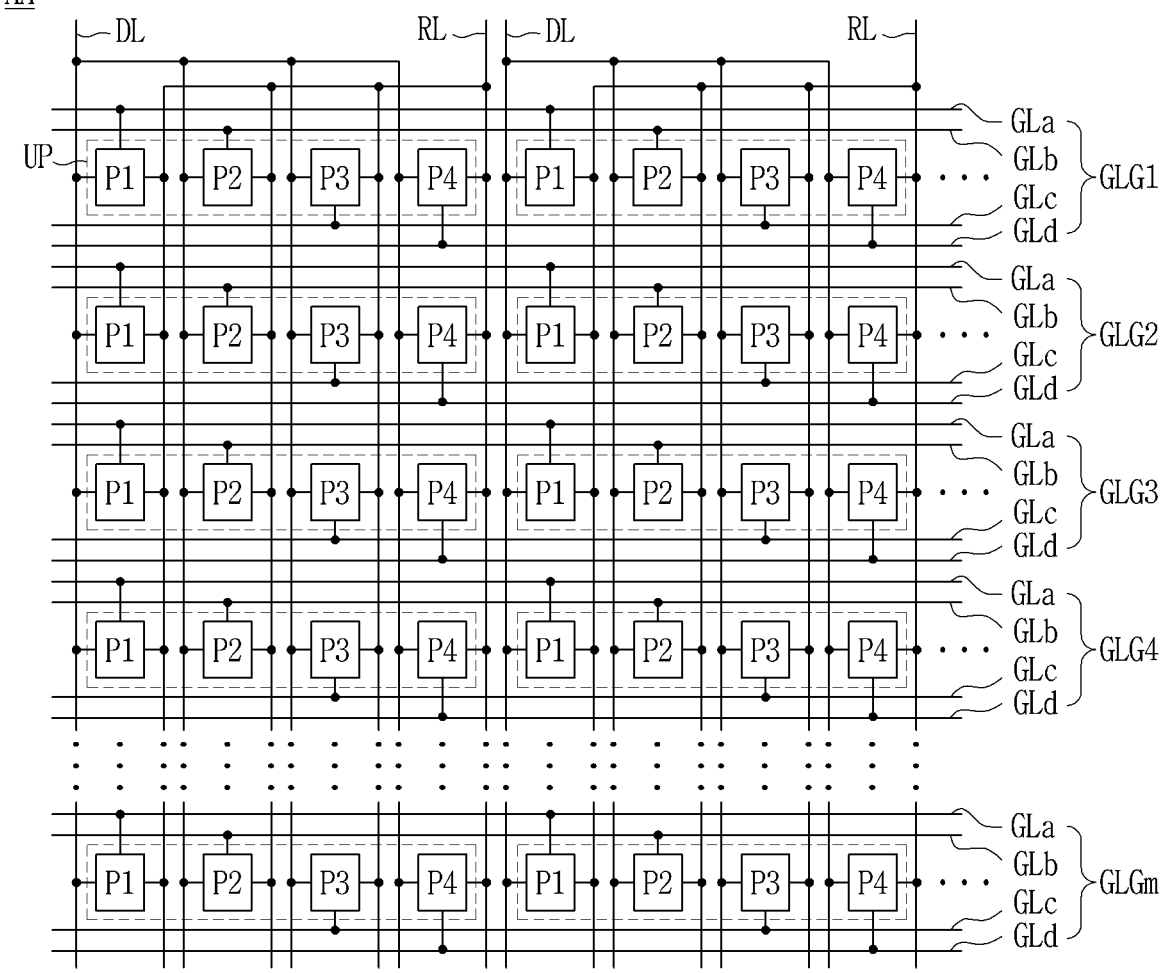
FIG. 3 is a view illustrating an arrangement structure of pixels shown in FIG. 1.

FIG. 1 is a view illustrating a display apparatus according to one embodiment of the present disclosure, FIG. 2 is a view illustrating an operation period of a display panel shown in FIG. 1, and FIG. 3 is a view illustrating an arrangement structure of subpixels shown in FIG. 1. All the components of the display apparatus according to all embodiments of the present disclosure are operatively coupled and configured.

Referring to FIGS. 1 to 3, the display apparatus according to one embodiment of the present disclosure can include a display panel 100, a timing controller 300, a gate driving circuit portion 500, and a data driving circuit portion 700.

The display panel 100 can include a display area AA (or active area) defined on a substrate, and a non-display area IA (or inactive area) surrounding the display area AA.

The display area AA can include a plurality of unit pixels UP, first to mth gate line groups GLG1 to GLGm (m can be a positive number such as a positive integer), a plurality of data lines DL, and a plurality of reference lines RL.

Each of the plurality of unit pixels UP can be disposed on a substrate to be spaced apart from one another along a first direction X and a second direction Y crossing the first direction X.

Each of the plurality of unit pixels UP can include i number of subpixels (i is a natural number of 3 or more).

Each of the plurality of unit pixels UP according to one embodiment can include first to fourth subpixels P1, P2, P3 and P4. For example, the first subpixel P1 can include a red subpixel P1, the second subpixel P2 can include a white subpixel P2, the third subpixel P3 can include a blue subpixel P3, and the fourth subpixel P4 can include a green subpixel P4. Each of the plurality of unit pixels UP according to another embodiment can include first to third subpixels P1, P2 and P3. For example, the first subpixel P1 can include a red subpixel P1, the second subpixel P2 can include a green subpixel P2, and the third subpixel P3 can include a blue subpixel P3.

Each of the first to mth gate line groups GLG1 to GLGm can longitudinally be extended along the first direction X, and can be disposed on the substrate to be spaced apart from another gate line group along the second direction Y crossing the first direction X.

Each of the first to mth gate line groups GLG1 to GLGm according to one embodiment can include i number of gate lines GLa, GLb, GLc and GLd. For example, each of the first to mth gate line groups GLG1 to GLGm can include i number of subpixels P1, P2, P3 and P4 constituting one unit pixel UP and i number of gate lines GLa, GLb, GLc and GLd.

According to one embodiment, in each of the first to mth gate line groups GLG1 to GLGm, the i number of gate lines can be embodied to individually drive the i number subpixels P1, P2, P3 and P4. For example, the i number of subpixels P1, P2, P3 and P4 can be connected to their respective gate lines of the i number of gate lines.

Hereinafter, for convenience of description, a description will be given on the assumption that each of the unit pixels UP includes first to fourth subpixels P1, P2, P3 and P4 and each of the first to mth gate line groups GLG1 to GLGm includes first to fourth gate lines GLa, GLb, GLc and GLd.

According to one embodiment, the first gate line GLa can be embodied to drive the first subpixel P1, the second gate line GLb can be embodied to drive the second subpixel P2, the third gate line GLc can be embodied to drive the third subpixel P3, and the fourth gate line GLd can be embodied to drive the fourth subpixel P4. However, without limitation to this case, the first gate line GLa can be embodied to drive the first subpixel P1, the second gate line GLb can be embodied to drive the third subpixel P3, the third gate line GLc can be embodied to drive the second subpixel P2, and the fourth gate line GLd can be embodied to drive the fourth subpixel P4.

Each of the plurality of data lines DL can longitudinally be extended along the second direction Y, and can be disposed on the substrate to be spaced apart from another data line along the first direction X.

Each of the plurality of data lines DL according to one embodiment can be grouped on a unit pixel (UP) basis. According to one embodiment, four data lines disposed in one unit pixel UP can be connected with one another. For example, the first data line of four data lines disposed in one unit pixel UP can electrically be connected with the other three data lines through a connection line. Therefore, four subpixels P1, P2, P3 and P4 disposed in one unit pixel UP can share one data line DL. Therefore, the number of data lines DL electrically connected with the data driving circuit portion 700 can be reduced to ¼, whereby a size of the data driving circuit portion 700 can be reduced.

Each of the plurality of reference lines RL can be disposed on the substrate to be parallel with each of the plurality of data lines DL. For example, the reference lines RL can be expressed as sensing lines.

Each of the plurality of reference lines RL according to one embodiment can be grouped on a unit pixel (UP) basis in the same manner as the data lines DL. According to one embodiment, four reference lines RL disposed in one unit pixel UP can be connected with one another. For example, the last data line of four reference lines RL disposed in one unit pixel UP can electrically be connected with the other three reference lines RL through a connection line. Therefore, four subpixels P1, P2, P3 and P4 disposed in one unit pixel UP can share one reference line RL. Therefore, the number of reference lines RL electrically connected with the data driving circuit portion 700 can be reduced to ¼, whereby a size of the data driving circuit portion 700 can be reduced.

The timing controller 300 can be embodied to control the display panel 100 in a display mode and a sensing mode based on a vertical synchronization signal and a horizontal synchronization signal of a timing synchronization signal TSS provided from a display driving system (or host controller).

The display mode of the display panel 100 can be driving for sequentially displaying an input image and a black image, which have a certain time difference, in a plurality of horizontal lines. The display mode according to one embodiment can include an image display period (or light emitting display period) IDP for displaying an input image, and a black display period (or impulse non-light emission period) for displaying a black image. The black display period BDP of the display mode can be omitted in accordance with a driving frequency of the display apparatus or motion picture response characteristic of the display apparatus.

The sensing mode (or real-time sensing mode) of the display panel 100 can be real-time sensing driving for sensing a driving characteristic of the subpixels P1, P2, P3 and P4 disposed in one of the plurality of horizontal lines and updating a compensation value per subpixel to compensate for a driving characteristic change of the corresponding subpixels P1, P2, P3 and P4 based on the sensed value, after the image display period (IDP) in one frame. The sensing mode according to one embodiment can sense driving characteristics of the subpixels P1, P2, P3 and P4 disposed in any one of the plurality of horizontal lines in accordance with an irregular order in a vertical blank period VBP of each frame. Since the subpixels P1, P2, P3 and P4 emitting light in accordance with the display mode do not emit light in the sensing mode, line dim can occur due to non-light emission of the sensed horizontal line when the horizontal lines are sensed sequentially in the sensing mode. On the other hand, when the horizontal lines are sensed in the sensing mode in an irregular order or a random order, line dim can be minimized or avoided due to a visual dispersion effect.

According to one embodiment, the timing controller 300 can set each frame Fn, Fn+1 for displaying an image on the display panel 100 to the image display period IDP, the black display period BDP and the real-time sensing period RSP. For example, the timing controller 300 can set a vertical active period VAP of one frame period Fn, Fn+1 to the display period IDP, BDP for the display mode, and can set the vertical blank period VBP to the sensing period (or real-time sensing period) RSP for the sensing mode.

The timing controller 300 can vary a duty (or light emission duty) of the image display period IDP by controlling a start timing of the black display period BDP in one frame Fn, Fn+1. The timing controller 300 according to one embodiment can extract a motion vector of input images by comparing and analyzing the input images on a basis of frame Fn, Fn+1, and can vary the start timing of the black display period BDP in accordance with the motion vector of the images. For example, the timing controller 300 can reduce the duty of the image display period IDP by advancing the start timing of the black display period BDP within one frame Fn, Fn+1 if the motion vector of the images is greater than a reference value, thereby increasing maximum instantaneous luminance of the subpixels P1, P2, P3 and P4. As a result, a motion picture response time can be reduced and at the same time motion blurring can be minimized. On the contrary, the timing controller 300 can increase the duty of the image display period IDP by delaying the start timing of the black display period BDP within one frame Fn, Fn+1 if the motion vector of the images is smaller than the reference value, thereby increasing luminance of the subpixels P1, P2, P3 and P4.

The timing controller 300 can generate and output a gate control signal GCS and a data control signal DCS for driving the display panel 100 in the image display period IDP, the black display period BDP and the sensing period RSP based on the timing synchronization signals TSS provided from the display driving system (or host controller).

According to one embodiment, the timing controller 300 can generate and output the gate control signal GCS and the data control signal DCS for divisionally driving one horizontal period into first to ith time-division periods, based on the timing synchronization signal TSS. For example, the timing controller 300 can divide one horizontal period into first to fourth time-division periods the same as the number of four subpixels constituting the unit pixel UP.

The data control signal DCS can include a source start pulse, a source sampling clock and a source output enable to control the driving timing of the data driving circuit portion 700.

The gate control signal GCS can include a gate start signal, a first reset signal, a second reset signal, a gate driving clock, and a line sensing preparation signal to control the driving timing of the gate driving circuit portion 500.

The timing controller 300 can generate a respective gate driving clock in each of the image display period IDP, the black display period BDP, and the sensing period RSP. For example, the timing controller 300 can generate an image display gate driving clock in the image display period IDP, a black display gate driving clock in the black display period BDP, and a sensing gate driving clock in the sensing period RSP. The image display gate driving clock, the black display gate driving clock and the sensing gate driving clock can be different from one another.

The timing controller 300 can align input data Idata supplied from the display driving system (or host controller) per image display period IDP of the display mode as subpixel image data PID to correspond to a driving order (or given order) of the subpixels P1, P2, P3 and P4 disposed on the display panel 100 and then supply the aligned pixel image data to the data driving circuit portion 700.

According to one embodiment, when the unit pixel UP includes the white subpixel P2, the timing controller 300 can generate white input data based on red, green and blue input data Idata, and can align red, green blue and white input data as subpixel image data PID to correspond to the arrangement structure and the driving order of the subpixels and provide the aligned data to the data driving circuit portion 700. For example, the timing controller 300 can convert red, green and blue input data to four colored data, i.e., red, green, blue and white data in accordance with a data conversion method disclosed in the Korean Laid-Open Patent No. 10-2013-0060476 or 10-2013-0030598, all of these patents being incorporated by reference herein.

The timing controller 300 can align the input data Idata as subpixel image data PID to be displayed for the first to fourth time-division periods of each horizontal period. For example, the timing controller 300 can align the input data Idata as subpixel image data PID to correspond to the driving order of the gate lines included in the first to mth gate line groups GLG1 to GLGm.

For example, since i number of subpixels P1, P2, P3 and P4 disposed in one unit pixel UP are individually connected to i number of gate lines, the timing controller 300 can group the input data Idata into first to ith horizontal line data of i-horizontal period unit, and can align input data to be supplied to the kth subpixel (k is 1 to i) included in the jth horizontal line data (j is 1 to i−1) of the first to ith horizontal line data, to be earlier than input data to be supplied to the kth subpixel included in the (j+1)th horizontal line data. In other words, the timing controller 300 can group the input data Idata into first to ith horizontal line data of i-horizontal period unit, and can sequentially align the first to ith horizontal line data per the same color (or subpixels) to reduce data transition times in the data driving circuit portion, whereby power consumption of the data driving circuit portion 700 and moreover the display apparatus can be reduced.

In the case that one unit pixel UP is embodied by four subpixels P1, P2, P3 and P4 and the timing controller 300 aligns input data to be supplied to the first data line for the first to fourth horizontal periods as subpixel image data PID, the timing controller 300 can group the input data respectively corresponding to the first to fourth horizontal periods, among the input data Idata, into the first to fourth horizontal line data, extract input data (or first input data) to be supplied to the first subpixel P1 among the first to fourth horizontal data to align the extracted data as first to fourth subpixel data, extract input data (or second input data) to be supplied to the second subpixel P2 among the first to fourth horizontal data to align the extracted data as fifth to eighth subpixel data, extract input data (or third input data) to be supplied to the third subpixel P3 among the first to fourth horizontal data to align the extracted data as ninth to twelfth subpixel data, and extract input data (or fourth input data) to be supplied to the fourth subpixel P4 among the first to fourth horizontal data to align the extracted data as thirteenth to fourteenth subpixel data. In other words, the timing controller 300 can respectively align red data of the first horizontal line data as first subpixel data, align red data of the second horizontal line data as second subpixel data, align red data of the third horizontal line data as third subpixel data and align red data of the fourth horizontal line data as fourth subpixel data. Also, the timing controller 300 can respectively align white data of the first horizontal line data as first subpixel data, align red data of the second horizontal line data as second subpixel data, align red data of the third horizontal line data as third subpixel data and align red data of the fourth horizontal line data as fourth subpixel data.

The timing controller 300 can provide subpixel black data PBD per black display period BDP of the display mode and supply the generated pixel black data PBD to the data driving circuit portion 700. For example, the timing controller 300 can generate a preset non-light emitting gray scale value or black gray scale value of the light emitting diode ELD as subpixel black data PBD.

The timing controller 300 can generate subpixel sensing data PSD per sensing period RSP of the sensing mode and supply the generated pixel sensing data PSD to the data driving circuit portion 700. For example, the timing controller 300 can generate a gray scale value, which can turn on the driving thin film transistor of the subpixels P1, P2, P3 and P4 disposed in a horizontal line to be sensed in the sensing period RSP, as subpixel sensing data PSD. At this time, the subpixel sensing data PSD corresponding to the subpixels constituting a unit pixel can have the same gray scale value or respective gray scale values different per subpixel.

The gate driving circuit portion 500 can be disposed in the non-display area IA of the display panel 100 and electrically connected with the plurality of gate line groups GLG. The gate driving circuit portion 500 can drive the first to mth gate line groups GLG1 to GLGm based on the gate control signal GCS supplied from the timing controller 300 in accordance with a given order.

The gate driving circuit portion 500 can generate scan signals respectively corresponding to the image display period IDP, the black display period BDP and the sensing period RSP based on the gate control signal GCS supplied from the timing controller 300, and can supply the generated scan signals to the corresponding gate line. For example, the gate driving circuit portion 500 can supply the scan signals to the gate lines in the vertical active period VAP of each frame period in accordance with a given order.

Also, the gate driving circuit portion 500 can supply the scan signals to any one of the gate lines per vertical black period VBP of each frame period Fn, Fn+1.

According to one embodiment, the gate driving circuit portion 500 can output scan signals having a first scan pulse corresponding to the image display period IDP and a second scan pulse corresponding to the black display period BDP in the display mode in accordance with a given order.

Optionally, the gate driving circuit portion 500 can group the plurality of gate line groups GLG into a plurality of horizontal groups, and can simultaneously supply the second scan pulse of the scan signals on a horizontal group basis in the black display period BDP of the display mode. For example, when the display area AA is virtually divided into a first area and a second area, the gate driving circuit portion 500 can simultaneously supply the second scan pulse of the scan signals to the gate lines disposed in the second area in the display mode, in the middle of sequentially supplying the first scan pulse of the scan signals to the gate lines disposed in the first area.

The gate driving circuit portion 500 can directly be formed or embedded in the non-display area IA of the display panel 100 and thus connected with the of gate lines individually in accordance with the manufacturing process of the thin film transistor.

As an example, the gate driving circuit portion 500 can be embodied in the non-display area IA at a left side of the substrate and drive the gate lines in accordance with a single feeding method in due order.

As another example, the gate driving circuit portion 500 can be embodied in the non-display area IA at each of a left side and a right side of the substrate and drive the gate lines in accordance with a double feeding method or a single feeding method in due order. For example, in the single feeding method, the gate driving circuit portion 500 embodied in the non-display area IA at the left side of the substrate can sequentially drive the odd numbered gate line groups of the gate lines, and the gate driving circuit portion 500 embodied in the non-display area IA at the right side of the substrate can sequentially drive the even numbered gate line groups of the gate lines. In the double feeding method, each of the gate driving circuit portion 500 embodied in the non-display area IA at the left side of the substrate and the gate driving circuit portion 500 embodied in the non-display area IA at the right side of the substrate can sequentially drive the gate lines at the same time.

The data driving circuit portion 700 can be connected with the plurality of data lines DL provided in the display panel 100. The data driving circuit portion 700 according to one embodiment can convert the data PID, PBD and PSD to analog type data voltages Vdata by using the data PID, PBD and PSD and the data control signal DCS supplied from the timing controller 300 and a plurality of reference gamma voltages supplied from a power supply, and can supply the converted data voltages to the corresponding data line DL.

In the image display period IDP of the display mode, the data driving circuit portion 700 can convert the subpixel image data PID to the image data voltage Vdata based on the data control signal DCS supplied from the timing controller 300 and supply the converted image data voltage to the corresponding data line DL, and at the same time can generate a reference voltage and supply the generated reference voltage to the reference line RL. Each of the image data voltage and the reference voltage can be synchronized with the scan pulse of the scan signals supplied to the gate lines corresponding to the image display period IDP of the display mode.

In the black display period BDP of the display mode, the data driving circuit portion 700 can convert the subpixel black data PBD to the black data voltage based on the data control signal DCS supplied from the timing controller 300 and supply the converted black data voltage to the corresponding data line DL. The black data voltage can be synchronized with the second scan pulse of the scan signals supplied to the gate lines corresponding to the black display period BDP of the display mode.

In the sensing period RSP of the sensing mode, the data driving circuit portion 700 can convert the subpixel sensing data PSD to the sensing data voltage based on the data control signal DCS supplied from the timing controller 300 and supply the converted sensing data voltage to the corresponding data line DL, and at the same time can generate a reference voltage and supply the generated reference voltage to the reference line RL. Each of the sensing data voltage and the reference voltage can be synchronized with the third scan pulse of the scan signals supplied to the gate line corresponding to the sensing period RSP of the sensing mode.

In the sensing period RSP of the sensing mode, the data driving circuit portion 700 can sense a driving characteristic of the subpixels P1, P2, P3 and P4 through the plurality of reference lines RL, and can generate sensing low data corresponding to the sensed value and supply the generated sensing low data to the timing controller 300. The data driving circuit portion 700 can generate a restoring data voltage synchronized with the third scan pulse of the scan signals supplied to the gate line corresponding to the sensing period RSP of the sensing mode and supply the generated restoring data voltage to the data line DL, thereby restoring (or recovering) a display state (or driving state) of the subpixels P1, P2, P3 and P4 connected to the gate line corresponding to the sensing period RSP equally to a previous state of the sensing period RSP.

Meanwhile, the timing controller 300 according to one embodiment stores sensing low data per subpixels P1, P2, P3 and P4 supplied from the data driving circuit portion 700 in a storage circuit in accordance with the sensing mode. In the display mode, the timing controller 300 can compensate for the subpixel image data PID to be supplied to the sensed subpixels P1, P2, P3 and P4 based on the sensing low data stored in the storage circuit and supply the compensated subpixel image data to the data driving circuit portion 700. For example, the sensing low data can include sequential change information of each of the driving thin film transistor and the light emitting diode, which are disposed in the subpixels P1, P2, P3 and P4. Therefore, the timing controller 300 can sense a characteristic value (for example, threshold voltage or mobility) of the driving thin film transistor disposed in each subpixel, in the sensing mode, and can compensate for the subpixel image data PDI to be supplied to each of the subpixels P1, P2, P3 and P4, based on the sensed characteristic value, thereby minimizing or avoiding picture quality deterioration based on characteristic value deviation of the driving thin film transistor in the plurality of subpixels P1, P2, P3 and P4. Since the sensing mode of the display apparatus is the technique already known in the art by the applicant of the present disclosure, its detailed description will be omitted or may be brief.

Figure 4:
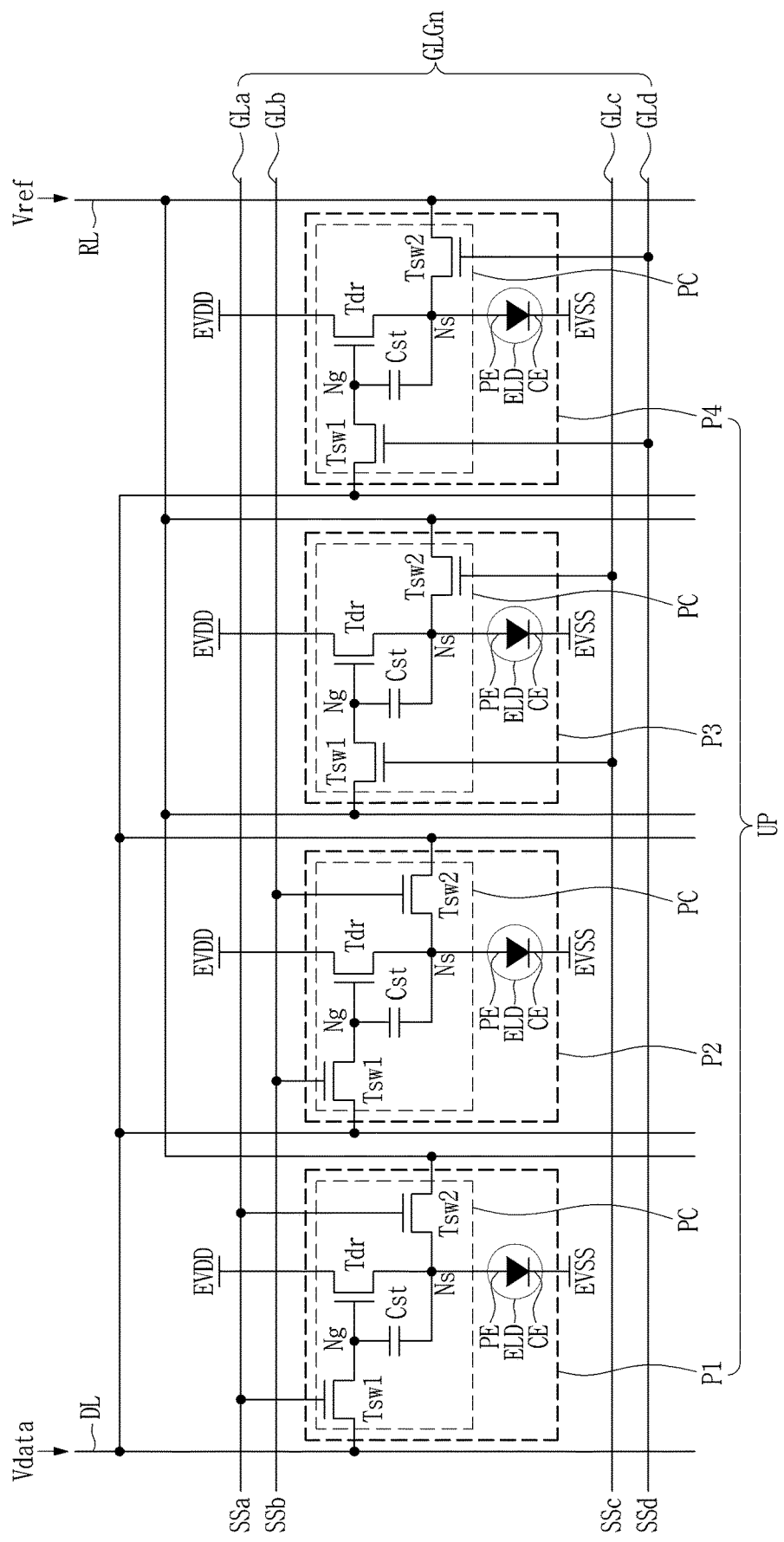
FIG. 4 is an equivalent circuit view illustrating a unit pixel shown in FIG. 3.

FIG. 4 is an equivalent circuit view illustrating an example of a unit pixel shown in FIG. 3.

Referring to FIG. 4, the unit pixel UP according to one embodiment of the present disclosure can include first to fourth subpixels P1, P2, P3 and P4 individually connected to four gate lines GLa, GLb, GLc and GLd and commonly connected to one data line DL and one reference line RL.

According to one embodiment, the first subpixel P1 can be connected to the first gate line GLa, the data line DL and the reference line RL. The second subpixel P2 can be connected to the second gate line GLb, the data line DL and the reference line RL. The third subpixel P3 can be connected to the third gate line GLc, the data line DL and the reference line RL. The fourth subpixel P4 can be connected to the fourth gate line GLd, the data line DL and the reference line RL.

The first gate line GLa can be (4s-3)th gate line (s is a natural number) of the plurality of gate lines disposed on the display panel 100, the second gate line GLb can be (4s-2)th gate line of the plurality of gate lines, the third gate line GLc can be (4s-1)th gate line of the plurality of gate lines, and the fourth gate line GLd can be (4s)th gate line of the plurality of gate lines.

Each of the first to fourth subpixels P1, P2, P3 and P4 can include a light emitting diode ELD, and a subpixel circuit PC for controlling light emission of the light emitting diode ELD.

The subpixel circuit PC can output a data current based on a differential voltage Vdata-Vref of a data voltage Vdata supplied through the data line DL and a reference voltage Vref supplied through the reference line RL adjacent thereto, in response to scan signals SSa, SSb, SSc and SSd supplied through the corresponding gate lines GLa, GLb, GLc and GLd.

The subpixel circuit PC according to one embodiment can include a first switching thin film transistor Tsw1, a second switching thin film transistor Tsw2, a driving thin film transistor Tdr, and a storage capacitor Cst. In the following description, the thin film transistor will be referred to as "TFT".

At least one of the first switching TFT Tsw1, the second switching TFT Tsw2 and the driving TFT Tdr can be a-Si TFT, poly-Si TFT, Oxide TFT, or Organic TFT. For example, in the subpixel circuit PC, some of the first switching TFT Tsw1, the second switching TFT Tsw2 and the driving TFT Tdr can be a TFT that includes a semiconductor layer (or active layer) made of low-temperature poly-Si (LTPS) having an excellent response characteristic, and the other of the first switching TFT Tsw1, the second switching TFT Tsw2 and the driving TFT Tdr can be a TFT that include a semiconductor layer (or active layer) made of oxide having an excellent off current characteristic.

The first switching TFT Tsw1 includes a gate electrode connected to the corresponding gate line GLa, GLb, GLc or GLd, a first source/drain electrode connected to the data line DL, and a second source/drain electrode connected to a gate node Ng of the driving TFT Tdr. The first switching TFT Tsw1 is turned on in accordance with the scan signals SSa, SSb, SSc and SSd of the corresponding gate lines GLa, GLb, GLc and GLd to supply the data voltage Vdata supplied through the data line DL adjacent thereto, to the gate node Ng of the driving TFT Tdr.

The second switching TFT Tsw2 includes a gate electrode connected to the corresponding gate line GLa, GLb, GLc or GLd, a first source/drain electrode connected to a source node Ns of the driving TFT Tdr, and a second source/drain electrode connected to the reference line RL adjacent thereto. The second switching TFT Tsw2 is turned on in accordance with the scan signals SSa, SSb, SSc and SSd of the corresponding gate lines GLa, GLb, GLc and GLd to supply the reference voltage Vref supplied through the reference line RL, to a source node Ns of the driving TFT Tdr.

The storage capacitor Cst can be formed between the gate node Ng and the source node Ns of the driving TFT Tdr. The storage capacitor Cst according to one embodiment can include a first capacitor electrode connected with the gate node Ng of the driving TFT Tdr, a second capacitor electrode connected with the source node Ns of the driving TFT Tdr, and a dielectric layer formed in an overlap area between the first capacitor electrode and the second capacitor electrode. Such a storage capacitor Cst charges a differential voltage between the gate node Ng and the source node Ns of the driving TFT Tdr and then switches the driving TFT Tdr in accordance with the charged voltage.

The driving TFT Tdr can include a gate electrode (or gate node Ng) commonly connected to the second source/drain electrode of the first switching TFT Tsw1 and the first capacitor electrode of the storage capacitor Cst, a first source/drain electrode (or source node Ns) commonly connected to the first source/drain electrode of the second switching TFT Tsw2, the second capacitor electrode of the storage capacitor Cst and the light emitting diode ELD, and a second source/drain electrode (or drain node) connected to a subpixel driving power source EVDD. The driving TFT Tdr can be turned on by the voltage of the storage capacitor Cst to control the amount of a current flowing from the subpixel driving power source EVDD to the light emitting diode ELD.

The gate electrodes of the first and second switching TFTs Tsw1 and Tsw2 disposed in the first subpixel P1 can commonly be connected to the first gate line GLa. The gate electrodes of the first and second switching TFTs Tsw1 and Tsw2 disposed in the second subpixel P2 can commonly be connected to the second gate line GLb. The gate electrodes of the first and second switching TFTs Tsw1 and Tsw2 disposed in the third subpixel P3 can commonly be connected to the third gate line GLc. The gate electrodes of the first and second switching TFTs Tsw1 and Tsw2 disposed in the fourth subpixel P4 can commonly be connected to the fourth gate line GLd.

The light emitting diode ELD emits light in accordance with the data current supplied from the subpixel circuit PC to emit light of luminance corresponding to the data current.

The light emitting diode ELD according to one embodiment can include a subpixel electrode (or anode electrode) PE electrically connected with the subpixel circuit PC, a self-light emitting diode, and a common electrode (or cathode electrode) CE disposed on the self-light emitting diode and connected to a subpixel common power source EVSS.

The subpixel electrode PE can be disposed in a light emitting area (or opening area) defined in the subpixels P1, P2, P3 and P4 and electrically be connected with the source node Ns of the subpixel circuit PC through a contact hole disposed in an insulating layer (or planarization layer) that covers the subpixel circuit PC. The subpixel electrode PE can be made of a transparent conductive metal material or a reflective metal material depending on a top emission structure or a bottom emission structure of the light emitting diode ELD.

The self-light emitting diode is formed on the subpixel electrode PE and is directly in contact with the subpixel electrode PE. This light emitting diode ELD emits light in accordance with the data current supplied from the subpixel circuit PC to emit light of luminance corresponding to the data current.

The self-light emitting diode according to one embodiment can be a common layer commonly formed in each of the plurality of subpixels P1, P2, P3 and P4 so as not to be identified per subpixels P1, P2, P3 and P4. The self-light emitting diode can emit white light by responding to a current flowing between the subpixel electrode PE and the common electrode CE. The self-light emitting diode according to one embodiment can include an organic light emitting diode or an inorganic light emitting diode, or can include a deposited or mixture structure of an organic light emitting diode (or inorganic light emitting diode) and a quantum dot light emitting diode.

The organic light emitting diode according to one embodiment includes two or more light emitting material layers (or light emitting portions) for emitting white light. For example, the organic light emitting diode can include first and second light emitting material layers for emitting white light by mixture of first light and second light. In this case, the first light emitting material layer can include at least one of a blue light emitting material, a green light emitting material, a red light emitting material, a yellow light emitting material, and a yellow-green light emitting material. The second light emitting material layer can include at least one of a blue light emitting material, a green light emitting material, a red light emitting material, a yellow light emitting material, and a yellow-green light emitting material to emit second light which can make white light by mixture with the first light emitted from the first light emitting material layer.

The organic light emitting diode according to one embodiment can further include at least one functional layer for improving light emission efficiency and/or lifetime. For example, the functional layer can be disposed in each of an upper portion and/or a lower portion of the light emitting material layer.

The inorganic light emitting diode according to one embodiment can include a semiconductor light emitting diode, a micro light emitting diode, or a quantum dot light emitting diode. For example, when the light emitting diode ELD is an inorganic light emitting diode, the light emitting diode ELD can have, but not limited to, a scale of 1 to 100 micrometers.

The common electrode CE can be disposed on the display area AA, and can directly be in contact with the self-light emitting diode or electrically and directly be in contact with the self-light emitting diode. The common electrode CE can be made of a transparent conductive metal material or a reflective metal material depending on a top emission structure or a bottom emission structure of the light emitting diode ELD.

Figure 5:
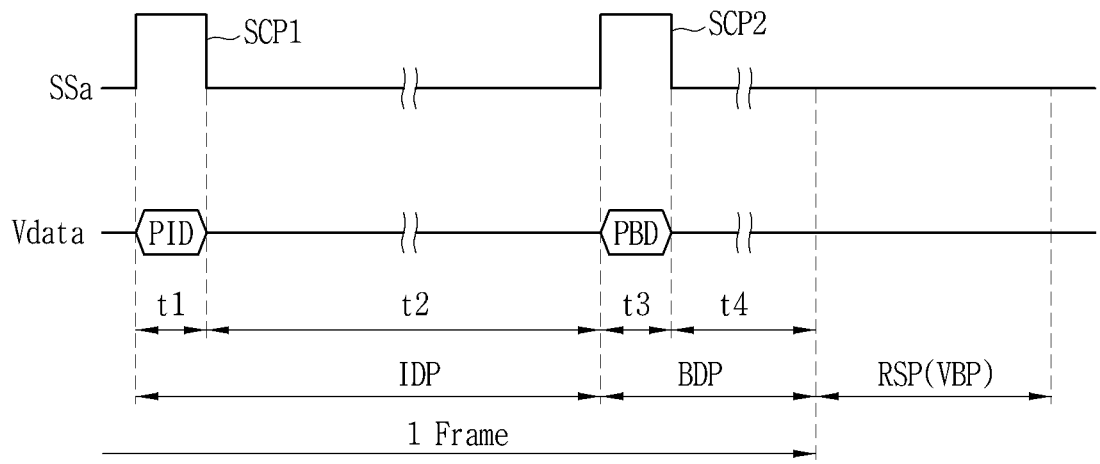
FIG. 5 is a timing view illustrating a scan signal and a data voltage for driving subpixels connected to a first gate line shown in FIG. 4.

FIG. 5 is a timing view illustrating a scan signal and a data voltage for driving subpixels connected to a first gate line shown in FIG. 4.

Referring to FIGS. 4 and 5, the subpixels P1, P2, P3 and P4 according to one embodiment of the present disclosure can be driven (or operated) in the image display period IDP and the black display period BDP for one frame.

The image display period IDP of the subpixels P1, P2, P3 and P4 can include an image data addressing period t1 and a light emission period t2.

At the image data addressing period (or first data addressing period), the first switching TFT Tsw1 and the second switching TFT Tsw2 disposed in each of the subpixels P1, P2, P3 and P4 are turned on at the same time by the first scan pulse SCP1 of the scan signal SSa supplied through the first gate line GLa. Therefore, the image data voltage Vdata of the subpixel image data PID supplied through the data line DL is applied to the gate node Ng of the driving TFT Tdr, and at the same time, the reference voltage Vref supplied through the reference line RL is applied to the source node Ns of the driving TFT Tdr. Therefore, at the image data addressing period t1, a voltage difference Vdata-Vref between the gate node Ng and the source node Ns of the driving TFT Tdr can be set to a voltage higher than the threshold voltage of the driving TFT Tdr, and the storage capacitor Cst can store a differential voltage Vdata-Vref of the image data voltage Vdata and the reference voltage Vref. In this case, the image data voltage Vdata can have a voltage level in which the threshold voltage of the driving TFT Tdr sensed through the sensing mode is reflected in an actual data voltage or compensated.

At the light emission period t2, each of the first and second switching TFTs Tsw1 and Tsw2 disposed in each of the subpixels P1, P2, P3 and P4 is turned off by the scan signal SSa of TFT off voltage level, whereby the driving TFT Tdr is turned on by the voltage Vdata-Vref charged in the storage capacitor Cst. Therefore, the driving TFT Tdr supplies the data current determined by the differential voltage Vdata-Vref of the image data voltage Vdata and the reference voltage Vref to the light emitting diode ELD to allow the light emitting diode ELD to emit light in proportion to the data current flowing from the subpixel driving power source EVDD to the subpixel common power source EVSS. For example, at the light emission period t2, if the first and second switching TFTs Tsw1 and Tsw2 are turned off, a current flows to the driving TFT Tdr and the light emitting diode ELD starts to emit light in proportion to the current, whereby a voltage of the source node Ns of the driving TFT Tdr is increased and a voltage of the gate node Ng of the driving TFT Tdr is increased by the storage capacitor Cst as much as the voltage increase of the source node Ns of the driving TFT Tdr. As a result, a gate-source voltage Vgs of the driving TFT Tdr can continuously be maintained by the voltage of the storage capacitor Cst, and light emission of the light emitting diode ELD can be sustained to reach the start timing of the black display period BDP. The light emission period of the light emitting diode ELD can correspond to a light emission duty.

The black display period BDP of the subpixels P1, P2, P3 and P4 can include a black data addressing period t3 and a non-light emission period t4.

At the black data addressing period (or second data addressing period) t3, each of the first and the second switching TFTs Tsw1 and Tsw2 disposed in each of subpixels P1, P2, P3 and P4 is turned on at the same time by the second scan pulse SCP2 of the scan signal SSa supplied through the first gate line GLa. Therefore, the black data voltage Vdata of the subpixel black data PBD supplied through the data line DL is applied to the gate node Ng of the driving TFT Tdr. At this time, the source node Ns of the driving TFT Tdr can be maintained at an operation voltage level (or non-light emitting start voltage) of the light emitting diode ELD in accordance with the turn-off state of the second switching TFT Tsw2. The black data voltage Vdata can have a voltage level lower than an operation voltage level (or non-light emitting voltage level) of the light emitting diode ELD or a voltage level lower than the threshold voltage of the driving TFT Tdr. Therefore, at the black data addressing period t3, the driving TFT Tdr is turned off as the voltage Vgs between the gate node Ng and the source node Ns is varied to be lower than the threshold voltage of the driving TFT Tdr by the black data voltage Vdata. For this reason, as the data current supplied from the driving TFT Tdr to the light emitting diode ELD is cut off, light emission of the light emitting diode ELD is stopped, whereby the pixel P displays a black image due to non-light emission of the light emitting diode ELD.

At the non-light emission period t4, each the first and second switching TFTs Tsw1 and Tsw2 disposed in each of the subpixels P1, P2, P3 and P4 is turned off by scan signal SSa of TFT off voltage level, whereby the driving TFT Tdr maintains the turn-off state. For this reason, the light emitting diode ELD can maintain the non-light emission state, and non-light emission of the light emitting diode ELD can be sustained to reach the image data addressing period t1 of next frame or the start timing of the sensing period RSP. The non-light emission period of the light emitting diode ELD can correspond to a black duty or a non-light emission duty.

Meanwhile, the subpixels P1, P2, P3 and P4 disposed in the other horizontal line except any one specific horizontal line to be sensed among the plurality of horizontal lines disposed in the display area can be driven in the image display period IDP and the black display period BDP substantially equally to the subpixels P1, P2, P3 and P4 disposed in the aforementioned first gate line GLa.

Figure 6:
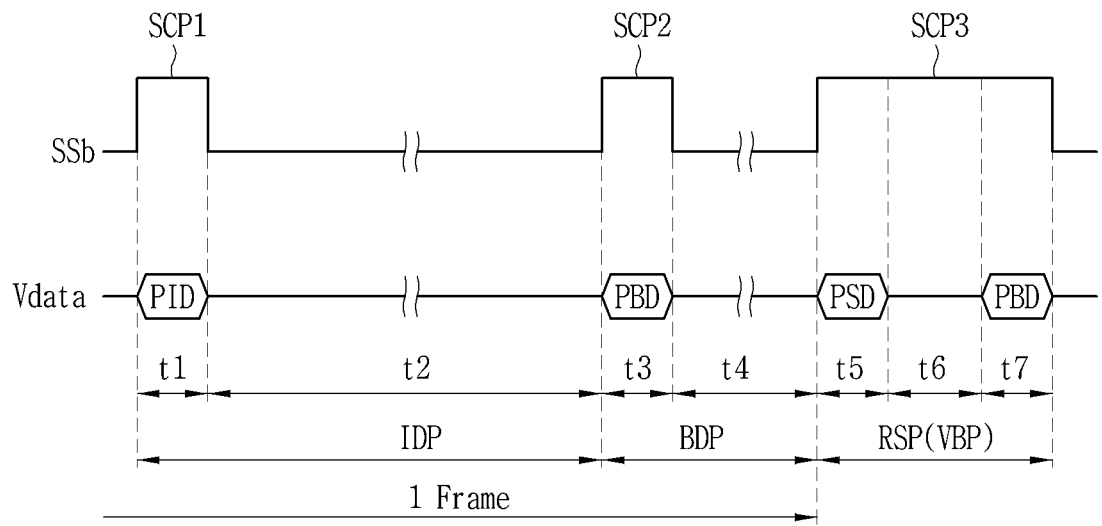
FIG. 6 is a timing view illustrating a scan signal and a data voltage for driving subpixels connected to a second gate line shown in FIG. 4.

FIG. 6 is a timing view illustrating a scan signal and a data voltage for driving subpixels connected to the second gate line shown in FIG. 4.

Referring to FIGS. 4 and 6, the subpixels P1, P2, P3 and P4 according to one embodiment of the present disclosure can be driven (or operated) in the image display period IDP, the black display period BDP and the sensing period RSP for one frame.

The image display period IDP of the subpixels P1, P2, P3 and P4 can include an image data addressing period t1 and a light emission period t2. Since the image data addressing period t1 and the light emission period t2 are substantially equal to those described with reference to FIG. 5, their repeated description will be omitted or may be brief.

The black display period BDP of the subpixels P1, P2, P3 and P4 can include a black data addressing period t3 and a non-light emission period t4. Since the black data addressing period t3 and the non-light emission period t4 are substantially equal to those described with reference to FIG. 5, their repeated description will be omitted or may be brief.

The sensing period RSP of the subpixels P1, P2, P3 and P4 can include a sensing data addressing period t5 and a sampling period t6.

At the sensing data addressing period (or third data addressing period) t5, each of the first and the second switching TFTs Tsw1 and Tsw2 disposed in each of the subpixels P1, P2, P3 and P4 is turned on as the same time by the third scan pulse SCP3 of the scan signal SSa supplied through the first gate line GLa. Therefore, the sensing data voltage Vdata of the subpixel sensing data PSD supplied through the data line DL is applied to the gate node Ng of the driving TFT Tdr, and at the same time, the reference voltage Vref supplied through the reference line RL is applied to the source node Ns of the driving TFT Tdr. Therefore, at the sensing data addressing period t5, a voltage Vgs between the gate node Ng and the source node Ns of the driving TFT Tdr is set to correspond to the sensing data voltage. For example, the sensing data voltage Vdata can have a level of a target voltage set to sense the threshold voltage of the driving TFT Tdr.

At the sampling period t6 (or real-time sensing period), each of the first and the second switching TFTs Tsw1 and Tsw2 in each of the subpixels P1, P2, P3 and P4 maintains the turn-on state by the third scan pulse SCP3 of the scan signal SSa supplied through the first gate line GLa. The reference line RL is electrically connected to a sensing unit embedded in the data driving circuit. Therefore, the sensing unit of the data driving circuit can sample a sensing subpixel current or sensing subpixel voltage supplied through the source node Ns of the driving TFT Tdr and the second switching TFT Tsw2 and the reference line RL, and can convert the sampled sampling signal through analog-digital conversion to generate sensing low data and supply the generated sensing low data to the timing controller 300.

The sensing period RSP of the subpixels P1, P2, P3 and P4 according to one embodiment of the present disclosure can further include a data restoring period t7.

At the data restoring period t7 (or real-time sensing period), each of the first and the second switching TFTs Tsw1 and Tsw2 in each of the subpixels P1, P2, P3 and P4 maintains the turn-on state by the third scan pulse SCP3 of the scan signal SSa supplied through the first gate line GLa. The reference line RL is electrically detached from the sensing unit of the data driving circuit and electrically connected with a reference power source. Therefore, the restoring data voltage Vdata of the pixel black data PBD supplied through the data line DL is applied to the gate node Ng of the driving TFT Tdr and at the same time, the reference voltage Vref supplied through the reference line RL is applied to the source node Ns of the driving TFT Tdr. Therefore, at the data restoring period t7, the voltage between the gate node Ng and the source node Ns of the driving TFT Tdr is restored to a previous state of the sensing period RSP, whereby the pixels P can again emit light and re-emission of the light emitting diode ELD can be sustained to reach the image data addressing period t1 of next frame Fn+1.

FIGS. 7A to 7D are views illustrating a driving method of subpixels according to the present disclosure, and are intended to describe an operation of each of the gate driving circuit portion and the data driving circuit portion for first to fourth horizontal periods of one frame.

Figure 7A:
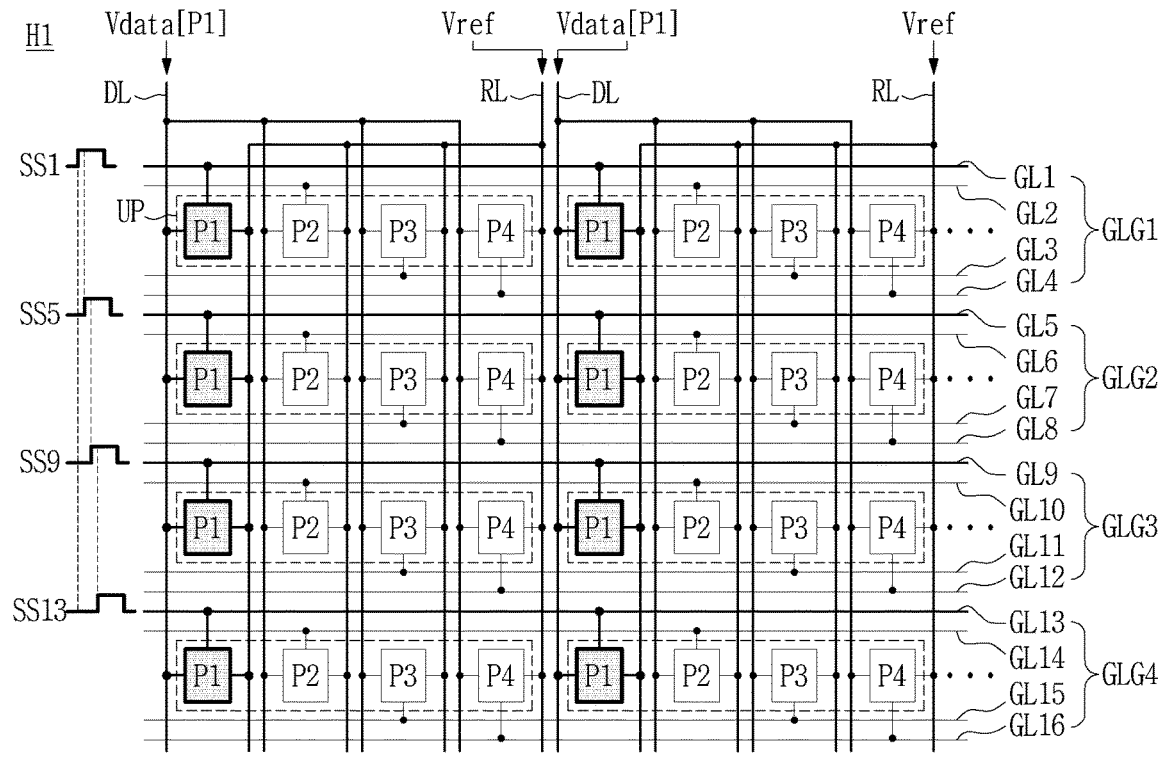
FIGS. 7A to 7D are views illustrating a driving method of subpixels according to one or more embodiments of the present disclosure.

Referring to FIGS. 1 and 7A, the gate driving circuit portion 500 according to the present disclosure can sequentially supply scan signals SS1, SS5, SS9 and SS13 to the first gate lines GL1, GL5, GL9 and GL13 of the first to fourth gate line groups GLG1 to GLG4 for the first horizontal period. At this time, the scan signals SS1, SS5, SS9 and SS13 respectively supplied to the first gate lines GL1, GL5, GL9 and GL13 of the first to fourth gate line groups GLG1 to GLG4 can sequentially be shifted and overlapped for a certain time period. The data driving circuit portion 700 according to the present disclosure can sequentially supply each first pixel data voltage Vdata[P1] (for example, red pixel data voltage) corresponding to each first subpixel P1 disposed in each of the first to fourth horizontal lines, to the data line DL. Therefore, the first subpixel P1 of the first to fourth subpixels P1, P2, P3 and P4 respectively disposed in the first to fourth horizontal lines for the first horizontal period can display an image corresponding to the first pixel data voltage Vdata[P1].

Figure 7B:
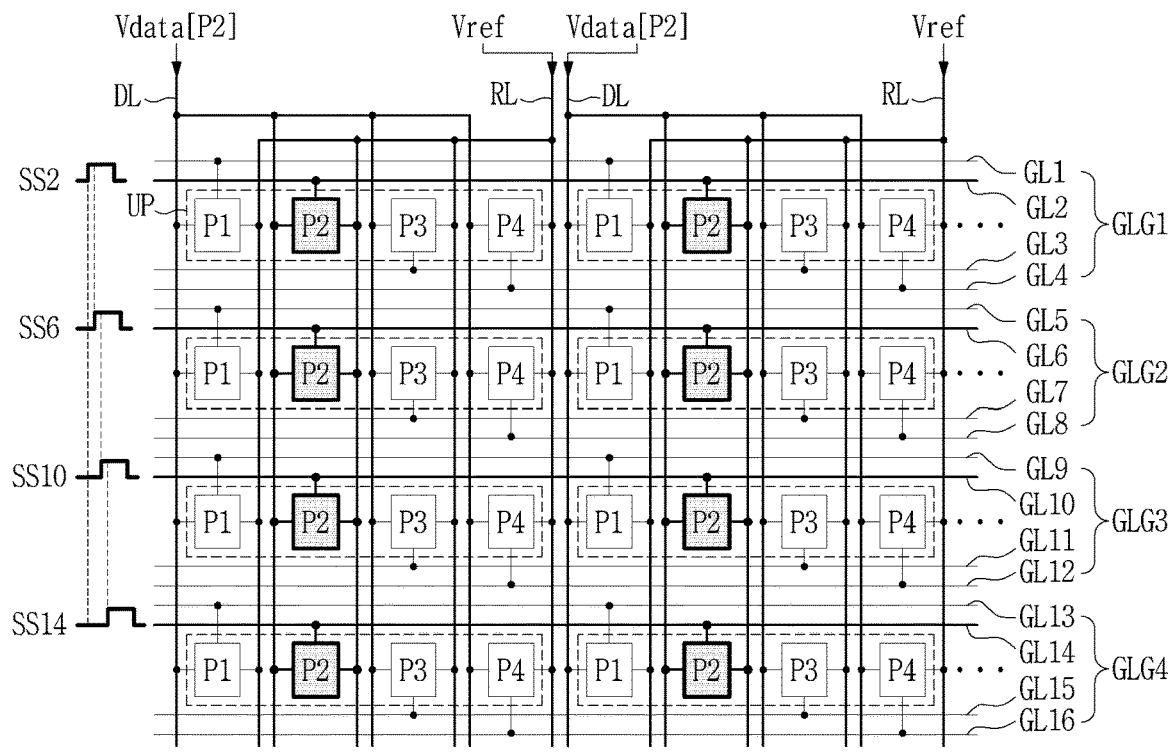

Referring to FIGS. 1 and 7B, the gate driving circuit portion 500 according to the present disclosure can sequentially supply scan signals SS2, SS6, SS10 and SS14 to each of the second gate lines GL2, GL6, GL10 and GL14 of the first to fourth gate line groups GLG1 to GLG4 for the second horizontal period. At this time, the scan signals SS2, SS6, SS10 and SS14 respectively supplied to the second gate lines GL2, GL6, GL10 and GL14 of the first to fourth gate line groups GLG1 to GLG4 can sequentially be shifted and overlapped for a certain time period. The data driving circuit portion 700 according to the present disclosure can sequentially supply each second pixel data voltage Vdata[P2] (for example, white pixel data voltage) corresponding to each second subpixel P2 disposed in each of the first to fourth horizontal lines, to the data line DL. Therefore, the second subpixel P2 of the first to fourth subpixels P1, P2, P3 and P4 respectively disposed in the first to fourth horizontal lines for the second horizontal period can display an image corresponding to the second pixel data voltage Vdata[P2] of the first to fourth subpixels P1, P2, P3 and P4 for the second horizontal period.

Figure 7C:
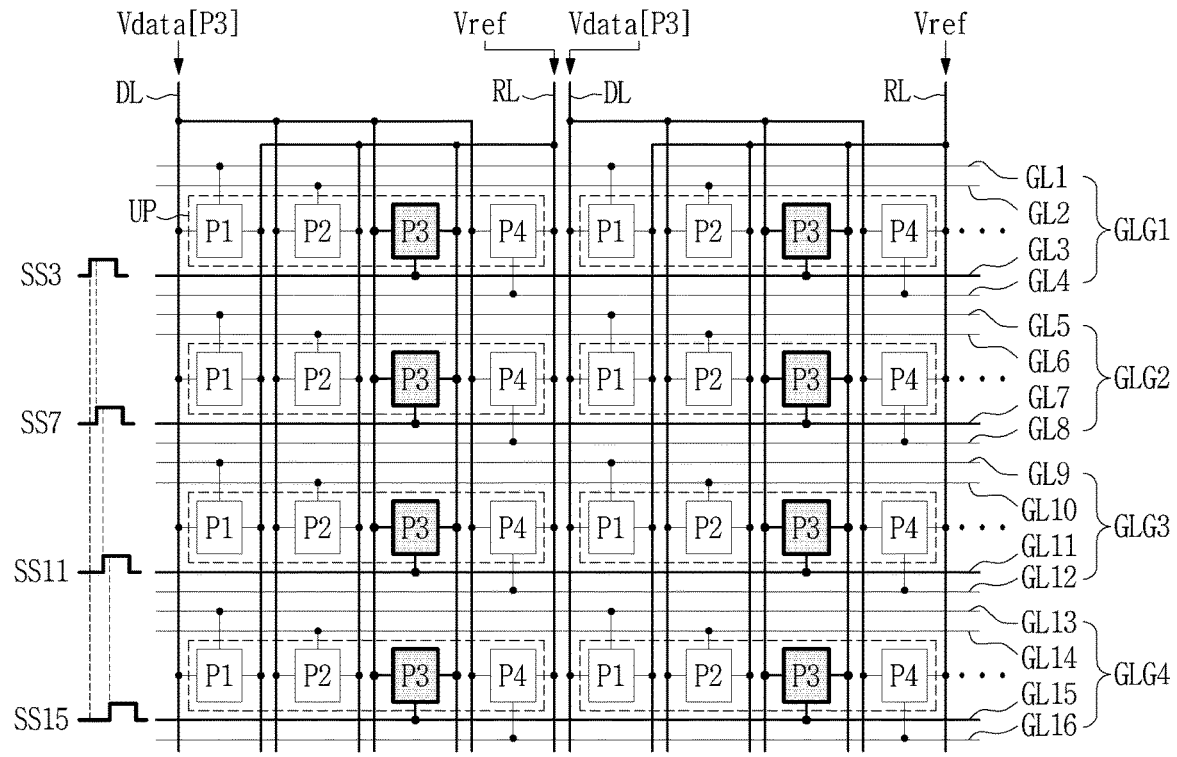

Referring to FIGS. 1 and 7C, the gate driving circuit portion 500 according to the present disclosure can sequentially supply scan signals SS3, SS7, SS11 and SS15 to the third gate lines GL3, GL7, GL11 and GL15 of the first to fourth gate line groups GLG1 to GLG4 for the third horizontal period. At this time, the scan signals SS3, SS7, SS11 and SS15 respectively supplied to the third gate lines GL3, GL7, GL11 and GL15 of the first to fourth gate line groups GLG1 to GLG4 can sequentially be shifted and overlapped for a certain time period. The data driving circuit portion 700 according to the present disclosure can sequentially supply each third pixel data voltage Vdata[P3] (for example, blue pixel data voltage) corresponding to each third subpixel P3 disposed in each of the first to fourth horizontal lines, to the data line DL. Therefore, the third subpixel P3 of the first to fourth subpixels P1, P2, P3 and P4 respectively disposed in the first to fourth horizontal lines for the third horizontal period can display an image corresponding to the third pixel data voltage Vdata[P3].

Figure 7D:
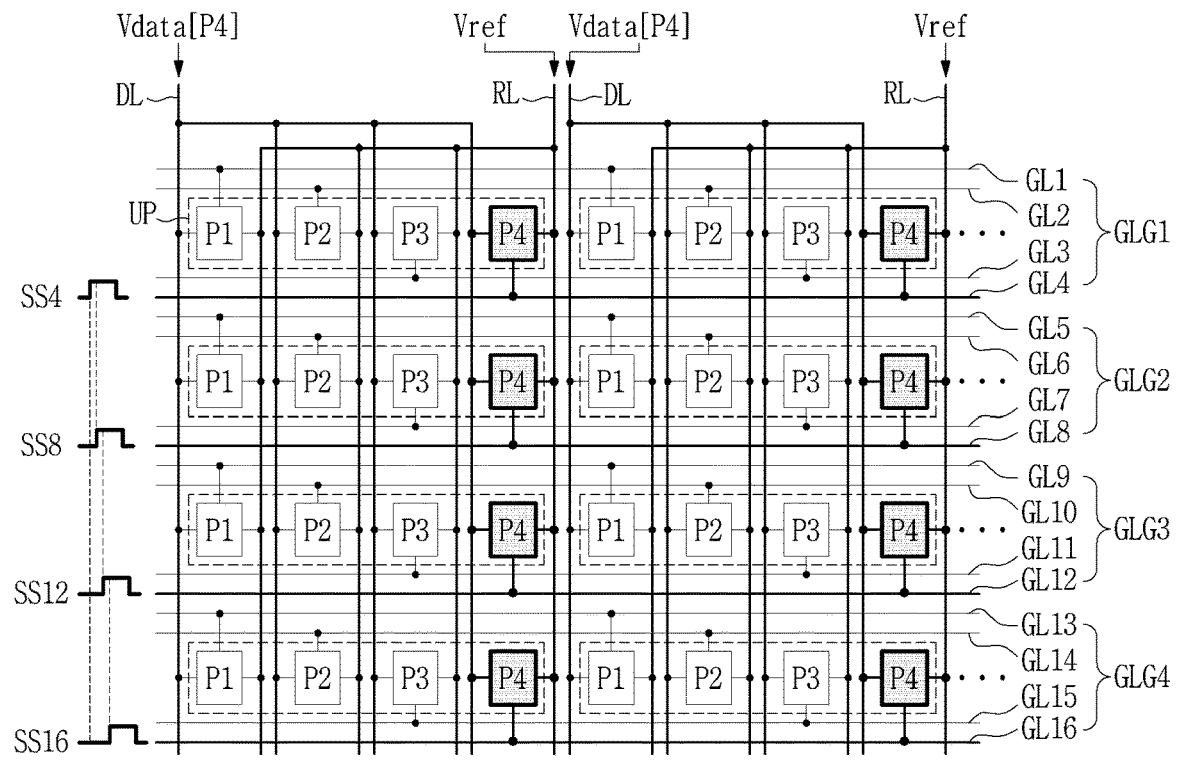

Referring to FIGS. 1 and 7D, the gate driving circuit portion 500 according to the present disclosure can sequentially supply scan signals SS4, SS8, SS12 and SS16 to the fourth gate lines GL4, GL8, GL12 and GL16 of the first to fourth gate line groups GLG1 to GLG4 for the fourth horizontal period. At this time, the scan signals SS4, SS8, SS12 and SS16 respectively supplied to the fourth gate lines GL4, GL8, GL12 and GL16 of the first to fourth gate line groups GLG1 to GLG4 can sequentially be shifted and overlapped for a certain time period. The data driving circuit portion 700 according to the present disclosure can sequentially supply each fourth pixel data voltage Vdata[P4] (for example, green pixel data voltage) corresponding to each fourth subpixel P4 disposed in each of the first to fourth horizontal lines, to the data line DL. Therefore, the fourth subpixel P4 of the first to fourth subpixels P1, P2, P3 and P4 respectively disposed in the first to fourth horizontal lines for the fourth horizontal period can display an image corresponding to the fourth pixel data voltage Vdata[P4].

In the aforementioned driving method of the subpixels according to the present disclosure, when one unit pixel UP is driven by one data line DL and four gate lines, the driving order of the gate lines included in the first to fourth gate line groups GLG1 to GLG4 can be changed to sequentially drive the same subpixels connected to different gate lines, within the same horizontal period, whereby data transition in the data driving circuit portion can be reduced and thus power consumption in the data driving circuit portion can be reduced.

Figure 8:
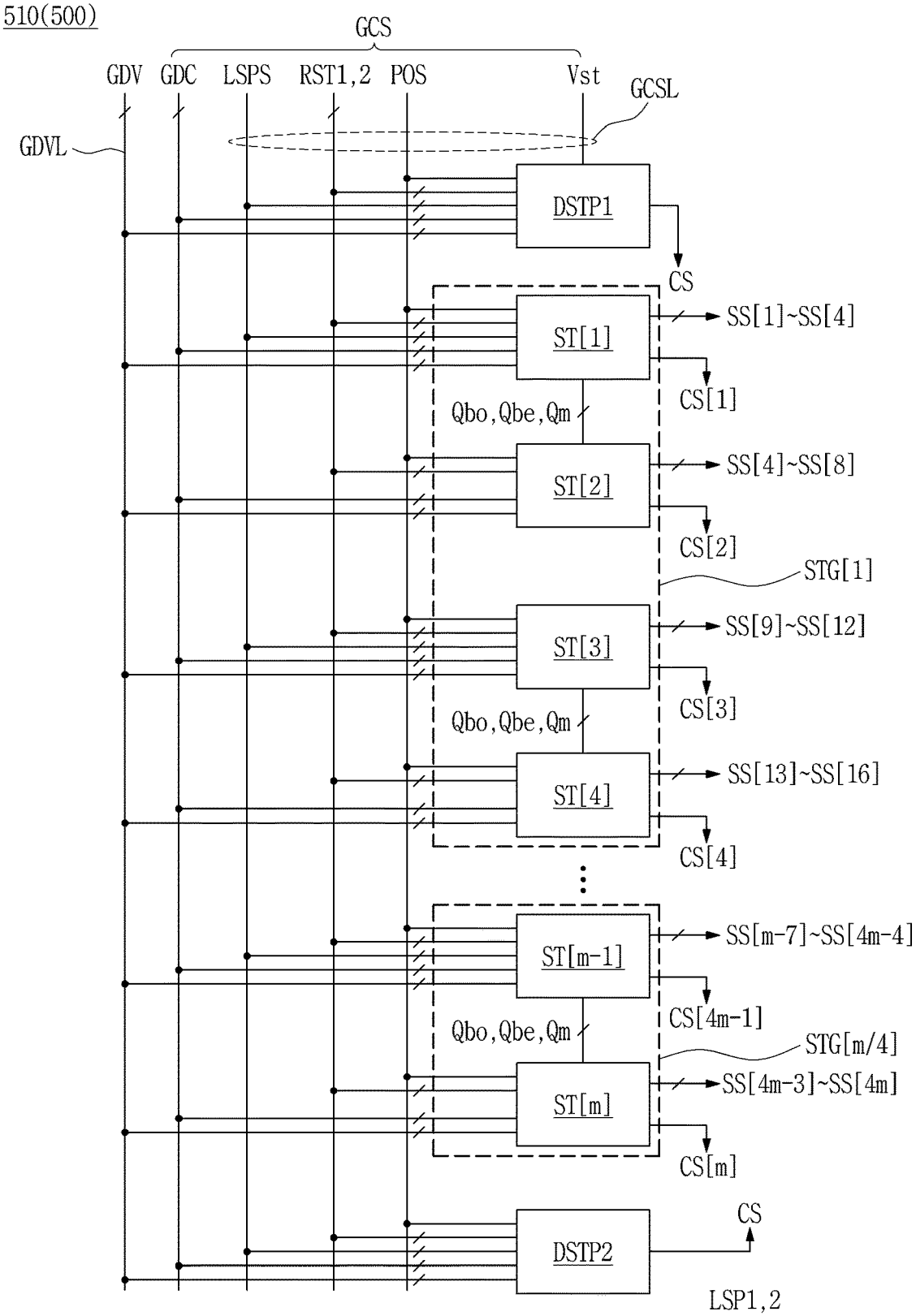
FIG. 8 is a view illustrating a gate driving circuit portion according to one embodiment of the present disclosure, which is shown in FIG. 1.

FIG. 8 is a view illustrating a gate driving circuit according to one embodiment of the present disclosure, which is shown in FIG. 1.

Referring to FIGS. 1, 2 and 8, the gate driving circuit portion 500 according to one embodiment of the present disclosure can include a gate driving circuit 510.

The gate driving circuit 510 can include a gate control signal line GCSL, a gate driving voltage line GDVL, and first to mth stage circuits ST[1] to ST[m]. The gate driving circuit 510 can further include a front dummy stage circuit portion DSTP1 disposed at a front end of the first stage circuit ST[1], and a rear dummy stage circuit portion DSTP2 disposed at a rear end of the mth stage circuit ST[m].

The gate control signal line GCSL receives the gate control signal GCS supplied from the timing controller 300. The gate control signal line GCSL according to one embodiment can include a gate start signal line, a first reset signal line, a second reset signal line, a plurality of gate driving clock lines, a display panel on signal line, and a sensing preparation signal line.

The gate start signal line can receive a gate start signal Vst supplied from the timing controller 300. For example, the gate start signal line can be connected to the front dummy stage circuit portion DSTP1.

The gate start signal Vst is a signal for controlling a start timing of each of the image display period IDP and the black display period BDP of every frame, and can be generated just before each of the image display period IDP and the black display period BDP starts. For example, the gate start signal Vst can be generated twice per frame.

The gate start signal Vst according to one embodiment can include a first gate start pulse (or image display gate start pulse) Vst1 generated just before the image display period IDP starts within one frame, and a second gate start pulse (or black display gate start pulse) Vst2 generated just before the black display period BDP starts.

The first reset signal line can receive a first reset signal RST1 supplied from the timing controller 300. The second reset signal line can receive a second reset signal RST2 supplied from the timing controller 300. For example, each of the first and second reset signal lines can commonly be connected to the front dummy stage circuit portion DSTP1, the first to mth stage circuits ST[1] to ST[m], and the rear dummy stage circuit portion DSTP2.

The first reset signal RST1 can be generated at the time when the sensing mode starts. The second reset signal RST2 can be generated at the time when the sensing mode ends. Optionally, the second reset signal RST2 can be omitted or equal to the first rest signal RST1.

The plurality of gate driving clock lines can include a plurality of carry shift clock lines, a plurality of scan shift clock lines and a plurality of boosting shift clock lines, which respectively receive a plurality of carry shift clocks, a plurality of scan shift clocks and a plurality of boosting shift clocks. The clock lines included in the plurality of gate driving clock lines can selectively be connected to the front dummy stage circuit portion DSTP1, the first to mth stage circuits ST[1] to ST[m], and the rear dummy stage circuit portion DSTP2. In the present disclosure, the term "clocks" (or the like) preferably means or includes clock signals.

The plurality of gate driving clock lines according to one embodiment can include four carry shift clock lines, 32 scan shift clock lines and four boosting shift clock lines but are not limited thereto.

The display panel on signal line can receive a display panel on signal POS supplied from the timing controller 300. For example, the display panel on signal line can commonly be connected to the front dummy stage circuit portion DSTP1 and the first to mth stage circuits ST[1] to ST[m].

The display panel on signal POS can be generated when the light emitting display apparatus is powered on. The display panel on signal POS can commonly be supplied to all the stage circuits embodied in the gate driving circuit 510. Therefore, all the stage circuits embodied in the gate driving circuit 510 can simultaneously be initialized or reset by the display panel on signal POS of a high voltage.

The sensing preparation signal line can receive a line sensing preparation signal LSPS supplied from the timing controller 300. For example, the sensing preparation signal line can commonly be connected to the first to mth stage circuits ST[1] to ST[m]. Optionally, the sensing preparation signal line can additionally be connected to the front dummy stage circuit portion DSTP1.

The line sensing preparation signal LSPS can be generated irregularly or randomly within the image display period IDP of every frame. The each of the line sensing preparation signals LSPS generated per frame can be different from a start timing of one frame.

The line sensing preparation signal LSPS according to one embodiment can include a line sensing selection pulse and a line sensing release pulse.

The line sensing selection pulse can be a signal for selecting any one horizontal line to be sensed among a plurality of horizontal lines. The line sensing selection pulse can be synchronized with a gate start pulse or a front carry signal supplied to any one of the stage circuits ST[1] to ST[m] as a gate start signal. The line sensing selection pulse can be expressed as a sensing line precharging control signal.

The line sensing release pulse can be a signal for releasing line sensing for a horizontal line which is completely sensed. The line sensing release pulse can be generated between an end timing of the sensing period RSP and a start timing of the line sensing selection pulse.

The gate driving voltage line GDVL can include first to fourth gate high potential voltage lines respectively receiving first to fourth gate high potential voltages having their respective voltage levels different from one another, from a power supply circuit, and first to third gate low potential voltage lines respectively receiving first to third gate low potential voltages having their respective voltage levels different from one another, from the power supply circuit.

According to one embodiment, the first gate high potential voltage can have a voltage level higher than that of the second gate high potential voltage. The third and fourth gate high potential voltages can be swung to be opposite to each other or reversed with respect to each other for alternating current driving between a high voltage (or TFT on voltage or first voltage) and a low voltage (or TFT off voltage or second voltage). For example, when the third gate high potential voltage (or gate odd high potential voltage) has a high voltage, the fourth gate high potential voltage (or gate even high potential voltage) can have a low voltage. When the third gate high potential voltage has a low voltage, the fourth gate high potential voltage can have a high voltage.

Each of the first and second gate high potential voltage lines can commonly be connected to the first to mth stage circuits ST[1] to ST[m], the front dummy stage circuit portion DSTP1 and the rear dummy stage circuit portion DSTP2.

The third gate high potential voltage line can commonly be connected to odd numbered stage circuits of the first to mth stage circuits ST[1] to ST[m], and can commonly be connected to odd numbered dummy stage circuits of each of the front dummy stage circuit portion DSTP1 and the rear dummy stage circuit portion DSTP2.

The fourth gate high potential voltage line can commonly be connected to even numbered stage circuits of the first to mth stage circuits ST[1] to ST[m], and can commonly be connected to even numbered dummy stage circuits of each of the front dummy stage circuit portion DSTP1 and the rear dummy stage circuit portion DSTP2.

According to one embodiment, the first gate low potential voltage and the second gate low potential voltage can substantially have the same voltage level. The third gate low potential voltage can have a TFT off voltage level. The first gate low potential voltage can have a voltage level higher than that of the third gate low potential voltage. In one embodiment of the present disclosure, the first gate low potential voltage can be set to a voltage level higher than that of the third gate low potential voltage, whereby an off current of a TFT having a gate electrode connected to a control node of a stage circuit, which will be described later, can certainly be cut off to make sure of stability and reliability in the operation of the corresponding TFT.

The first to third gate low potential voltage lines can commonly be connected to the first to mth stage circuits ST[1] to ST[m].

The front dummy stage circuit portion DSTP1 can be switched in accordance with the gate start signal Vst supplied from the timing controller 300 to sequentially generate a plurality of front carry signals, thereby supplying the generated front carry signals to any one of the rear stages as the front carry signals or the gate start signals.

The rear dummy stage circuit portion DSTP2 can sequentially generate a plurality of rear carry signals to supply the rear carry signals (or stage reset signals) to any one of the front stages.

The first to mth stage circuits ST[1] to ST[m] can be connected to one another to be mutually dependent upon one another. The first to mth stage circuits ST[1] to ST[m] can generate first to 4mth scan signals SC[1] to SC[4m] and output the generated signals to the corresponding gate lines disposed on the light emitting display panel 100. The first to mth stage circuits ST[1] to ST[m] can generate first to mth carry signals CS[1] to CS[m] and supply the generated signals to any one of the rear stages as the front carry signals (or gate start signals) and at the same time supply the generated signals to any one of the front stages as the rear carry signals (or stage reset signals).

Each of the first to mth stage circuits ST[1] to ST[m] can be embodied to sequentially output i number of scan signals corresponding to a given order in a unit of i number of gate lines among 4m number of gate lines. For example, the first stage circuit ST[1] can individually output first to fourth scan signals, which are sequentially shifted while being non-overlapped, to the first to fourth gate lines.

In each of the first to mth stage circuits ST[1] to ST[m], the i number of scan signals can be output at their respective horizontal periods different from one another. For example, among the first to fourth scan signals output from the first stage circuit ST[1], the first scan signal can be output for the first horizontal period, the second scan signal can be output for the second horizontal period, the third scan signal can be output for the third horizontal period, and the fourth scan signal can be output for the fourth horizontal period.

The first to mth stage circuits ST[1] to ST[m] can be grouped into m/i number of stage groups having i number of adjacent stage circuits. For example, when one unit pixel UP has four subpixels, the first to mth stage circuits ST[1] to ST[m] can be grouped into m/4 number of stage groups STG[1] to STG[m/4] having four stage circuits. For example, the first to fourth stage circuits ST[1] to ST[4] of the first to mth stage circuits ST[1] to ST[m] can be grouped into the first stage group STG[1].

In the m/4 number of stage groups STG[1] to STG[m/4], kth scan signal SS[k] (k is 1 to 4) output from the jth stage circuit ST[j] (j is 1 to 3) of the first to fourth stage circuits ST[1] to ST[4] can be output to be earlier than the kth scan signal SS[k] output from the (j+1)th stage circuit ST[j+1]. At this time, the kth scan signals SS[k] output from the first to fourth stage circuits ST[1] to ST[4] can be overlapped with one another as much as 1.5-horizontal period. For example, in the first stage group STG[1], the first scan signals SS[1], SS[5], SS[9] and SS[13] can sequentially be output from the first to fourth stage circuits ST[1] to ST[4] and thus can be overlapped with one another for a certain time period. At this time, the first scan signal SS[1] output from the first stage circuit ST[1] can be output to be earlier than the first scan signal SS[2] output from the second stage circuit ST[2], and the first scan signal SS[4] output from the fourth stage circuit ST[4] can be output to be earlier than the first scan signal SS[3] output from the third stage circuit ST[3]. The first scan signal SS[4] output from the fourth stage circuit ST[4] can be output to be earlier than the second scan signal SS[2] output from the first stage circuit ST[1].

Two adjacent stages ST[n] and ST[n+1] of the first to mth stage circuits ST[1] to ST[m] can mutually share some of a sensing control circuit and control nodes Qbo, Qbe, Qm, whereby circuit configuration of the gate driving circuit 500 can be simplified, and an area occupied by the gate driving circuit portion 500 in the display panel 100 can be reduced.

Figure 9:
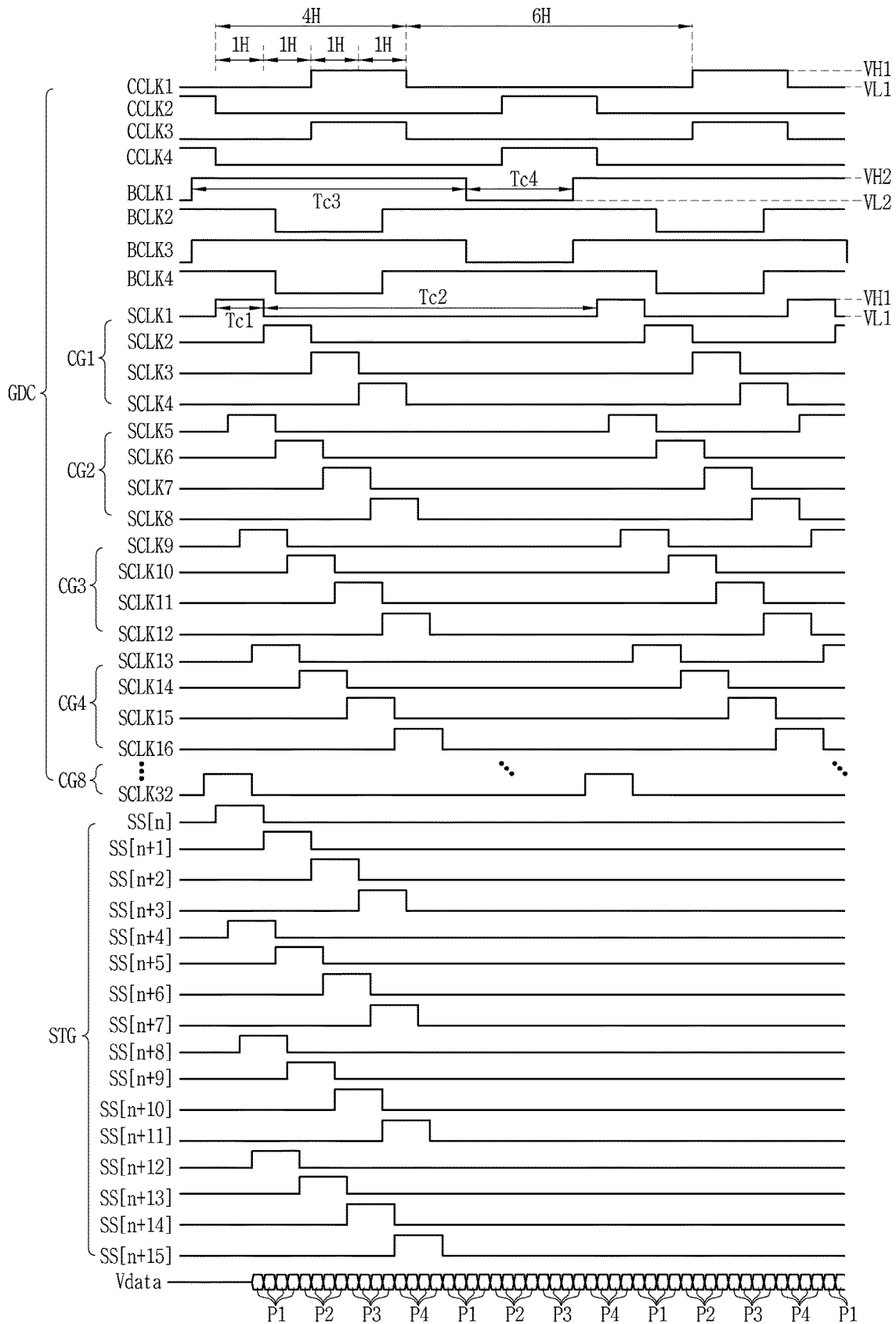
FIG. 9 is a waveform illustrating scan signals output from a first stage group and a plurality of gate driving clocks shown in FIG. 8.

FIG. 9 is a waveform illustrating scan signals output from a first stage group and a plurality of gate driving clocks shown in FIG. 8.

Referring to FIGS. 8 and 9, the plurality of gate driving clocks GDC according to one embodiment of the present disclosure include first to fourth carry shift clocks CCLK[1] to CCLK[4] having their respective phases different from one another or sequentially shifted phases, first to 32nd scan shift clocks SCLK[1] to SCLK[32] having their respective phases different from one another or sequentially shifted phases, and first to fourth boosting shift clocks BCLK[1] to BCLK[4] having their respective phases different from one another or sequentially shifted phases.

The carry shift clocks CCLK1 to CCLK4 can be clock signals for generating carry signals, the scan shift clocks SCLK1 to SCLK32 are clock signals for generating scan signals having scan pulses, and the boost shift clocks BCLK1 to BCLK4 are clock signals used to only boost a voltage of a first control node embodied in each of the stage circuits ST[1] to ST[m].

The carry shift clocks CCLK1 to CCLK4 can be swung between the first high voltage VH1 and the first low voltage VL1. The first high voltage of each of the first to fourth carry shift clocks CCLK1 to CCLK4 can be shifted as much as a period of the first high voltage VH1. According to one embodiment, in the carry shift clocks CCLK1 to CCLK4, the period of the first high voltage VH1 can correspond to 2-horizontal period, and the period of the first low voltage VL1 can correspond to 8-horizontal period. For example, the third carry shift clock CCLK3 can be the same as the first carry shift clock CCLK1. The fourth carry shift clock CCLK4 can be the same as the second carry shift clock CCLK2. For example, the first high voltage VH1 of the carry shift clocks CCLK1 to CCLK4 can have the same voltage level as that of the first gate low potential voltage.

According to one embodiment, the first and third carry shift clocks CCLK1 and CCLK3 can be supplied to odd numbered stage groups of m/i number of stage groups STG[1] to STG[m/i], and the second and fourth carry shift clocks CCLK2 and CCLK4 can be supplied to even numbered stage groups of m/i number of stage groups STG[1] to STG[m/i]. For example, the first and third carry shift clocks CCLK1 and CCLK3 have the same shape for load dispersion. Therefore, the first carry shift clock CCLK1 can be supplied to two of four stage circuits grouped in the odd numbered stage groups, and the third carry shift clock CCLK3 can commonly be supplied to the other two of four stage circuits grouped in the odd numbered stage groups. Likewise, the second and fourth carry shift clocks CCLK2 and CCLK4 have the same shape for load dispersion. Therefore, the second carry shift clock CCLK2 can be supplied to two of four stage circuits grouped in the even numbered stage groups, and the fourth carry shift clock CCLK4 can commonly be supplied to the other two of four stage circuits grouped in the even numbered stage groups.

The scan shift clocks SCLK1 to SCLK32 can be swung between the first high voltage VH1 and the first low voltage VL1. The scan shift clocks SCLK1 to SCLK32 according to one embodiment can include a first high voltage VH1 of a first period Tc1 and a first low voltage VL1 of a second period Tc2. For example, in each of the first to 32rd scan shift clocks SCLK1 to SCLK32, the first period Tc1 of the first high voltage VH1 can correspond to 1-horizontal period, and the second period Tc2 of the first low voltage VL1 can correspond to 7-horizontal period. The first high voltage of each of the first to 32rd scan shift clocks SCLK1 to SCLK32 can have the same voltage level as that of the first gate high potential voltage. The first low voltage VL1 of each of the first to 32rd scan shift clocks SCLK1 to SCLK32 can have the same voltage level as that of the first gate low potential voltage.

The first high voltage VH1 of each of the first to 32rd scan shift clocks SCLK1 to SCLK32 according to one embodiment can be shifted to correspond to the driving order of the subpixels disposed on the display panel. The first to 32rd scan shift clocks SCLK1 to SCLK32 can be overlapped to make surface a sufficient charging time during high speed driving. The first high voltages VH1 of adjacent clocks can be overlapped as much as the set period.

According to one embodiment, the first to 32rd scan shift clocks SCLK1 to SCLK32 can be grouped into first to eighth clock groups CG1 to CG8 having four clocks. The first to eighth clock groups CG1 to CG8 can be grouped into higher and lower clock groups having four clock groups.

According to one embodiment, the first to fourth scan shift clocks SCLK1 to SCLK4 grouped into the first clock group CG1 can be shifted to (8a-7)th stage circuit ST[8a-7] (a is a natural number 1 to m/8) of the first to mth stage circuits ST[1] to ST[m]. The fifth to eighth scan shift clocks SCLK5 to SCLK8 grouped into the second clock group CG2 can be supplied to (8a-6)th stage circuit ST[8a-6]. The fifth to eighth scan shift clocks SCLK5 to SCLK8 grouped into the second clock group CG2 can be shifted to (8a-6)th stage circuit ST[8a-6]. Likewise, each of the scan shift clocks SCLK9 to SCLK32 grouped into each of the third to eighth clock groups CG3 to CG8 can respectively be supplied to (8a-5)th, (8a-4)th, (8a-3)th, (8a-2)th, (8a-1)th, and (8a)th stage circuits ST[8a-5], ST[8a-4], ST[8a-3], ST[8a-2], ST[8a-1] and ST[8a].

Four scan shift clocks grouped into the first to eighth clock groups CG1 to CG8 can sequentially be shifted on 1-horizontal period basis.

The kth scan shift clock (k is 1 to 4) of the jth clock group CG[j] (is 1 to 3) of the first to fourth clock groups CG1 to CG4 grouped into the higher clock group can be generated (or risen) to be earlier than the kth scan shift clock of the (j+1)th clock group CG[+1]. For example, the kth scan shift clocks of the first to fourth clock groups CG1 to CG4 can be overlapped with one another as much as 1.5-horizontal period. For example, the first scan shift clocks of the first to fourth clock groups CG1 to CG4 can sequentially be shifted to be overlapped with one another. At this time, the first scan shift clocks of the first clock group CG1 can be generated to be earlier than the first scan shift clocks of the second clock group CG2, and the first scan shift clocks of the fourth clock group CG4 can be generated to be later than the first scan shift clock of the third clock group CG3. The first scan shift clocks of the fourth clock group CG4 can be generated to be earlier than the first scan shift clocks of the first clock group CG1

The first scan shift clocks of the fifth clock group CG5 grouped into the lower clock group can be generated to be later than the fourth scan shift clocks of the fourth clock group CG4. At this time, the first scan shift clocks of the fifth clock group CG5 can be overlapped with the fourth scan shift clocks of the fourth clock group CG5 as much as 1.5-horizontal period.

The kth scan shift clock of the jth clock group CG[j] of the fifth to eighth clock groups CG5 to CG8 grouped into the lower clock group can be output to be earlier than the kth scan shift clock of the (j+1)th clock group CG[+1]. The scan shift clocks of the fifth to eighth clock groups CG5 to CG8 can be generated in the same order as those grouped into the higher clock group, and their description will be omitted or may be brief.

According to one embodiment, the scan shift clocks of the first to fourth clock groups CG1 to CG4 grouped into the higher clock group can be supplied to odd numbered stage groups of m/i (or m/4) number of stage groups STG[1] to STG[m/i]. The scan shift clocks of the fifth to eighth clock groups CG5 to CG8 grouped into the lower clock group can be supplied to even numbered stage groups of m/i (or m/4) number of stage groups STG[1] to STG[m/i].

For the display mode, each of the scan shift clocks SCLK1 to SCLK32 can be swung. For the sensing mode, a specific one of the scan shift clocks SCLK1 to SCLK32 can be swung for the output of the third scan pulse and the others can maintain the first low voltage VL1.

Boosting shift clocks BCLK1 to BCLK4 can be swung between the second high voltage VH2 and the second low voltage VL2. A voltage swing width of the boosting shift clocks BCLK1 to BCLK4 can be greater than that of the carry shift clocks CCLK1 to CCLK4 and/or the scan shift clocks SCLK1 to SCLK4. For the sensing mode, a specific one of the boosting shift clocks BCLK1 to BCLK32 can be swung for boosting of the first control node for the output of the third scan pulse.

The boosting shift clocks BCLK1 to BCLK4 according to one embodiment can include a second high voltage VH2 of a third period TC3 different from the first period Tc1 and a second low voltage VL2 of a fourth period Tc4 different from the second period Tc2. For example, in each of the first to fourth boosting shift clocks BCLK1 to BCLK4, the second high voltage VH2 can have a voltage level higher than that of the first high voltage VH1, and the second low voltage VL2 can have the same voltage level as that of the first low voltage VL1 or can have a voltage level lower than that of the first low voltage VL1.

In the first to fourth boosting shift clocks BCLK1 to BCLK4, a sum of the third period Tc3 and the fourth period Tc4 can correspond to 8-horizontal period, and the third period Tc3 can be long than 5-horizontal period or shorter than 6-horizontal period. A first voltage shift timing (or rising timing) shifted from the second low voltage VL2 to the second high voltage VH2 can be overlapped with the first high voltage VH1 of the second and fourth carry shift clocks CCLK2 and CCLK4. A second voltage shift timing (or falling timing) shifted from the second high voltage VH2 to the second low voltage VL2 can be overlapped with the first low voltage VL1 just before the first high voltage VH1 of the second and fourth carry shift clocks CCLK2 and CCLK4.

The first to fourth boosting shift clocks BCLK1 to BCLK4 can sequentially be shifted as much as 4-horizontal period. For example, the first boosting shift clock BCLK1 can be the same as the third boosting shift clock BCLK3. The second boosting shift clock BCLK2 can be the same as the fourth boosting shift clock BCLK4.

The third period Tc3 of each of the first boosting shift clock BCLK1 and the third boosting shift clock BCLK3 can be overlapped with all the first high voltages VH1 of the scan shift clocks of the first to fourth clock groups CG1 to CG4 grouped into the higher clock group. The third period Tc3 of each of the second boosting shift clock BCLK2 and the fourth boosting shift clock BCLK4 can be overlapped with all the first high voltages VH1 of the scan shift clocks of the fifth to eighth clock groups CG5 to CG8 grouped into the higher clock group.

According to one embodiment, the first and third boosting shift clocks BCLK1 and BCLK3 can be supplied to odd numbered stage groups of m/i number of stage groups STG[1] to STG[m/i], and the second and fourth boosting shift clocks BCLK2 and BCLK4 can be supplied to even numbered stage groups of m/i number of stage groups STG[1] to STG[m/i]. For example, the first and third boosting shift clocks BCLK1 and BCLK3 have the same shape for load dispersion. Therefore, the first boosting shift clock BCLK1 can be supplied to two of four stage circuits grouped in the odd numbered stage groups, and the third boosting shift clock BCLK3 can commonly be supplied to the other two of four stage circuits grouped in the odd numbered stage groups. Likewise, the second and fourth boosting shift clocks BCLK2 and BCLK4 have the same shape for load dispersion. Therefore, the second boosting shift clock BCLK2 can be supplied to two of four stage circuits grouped in the even numbered stage groups, and the fourth boosting shift clock BCLK4 can commonly be supplied to the other two of four stage circuits grouped in the even numbered stage groups.

Figure 10:
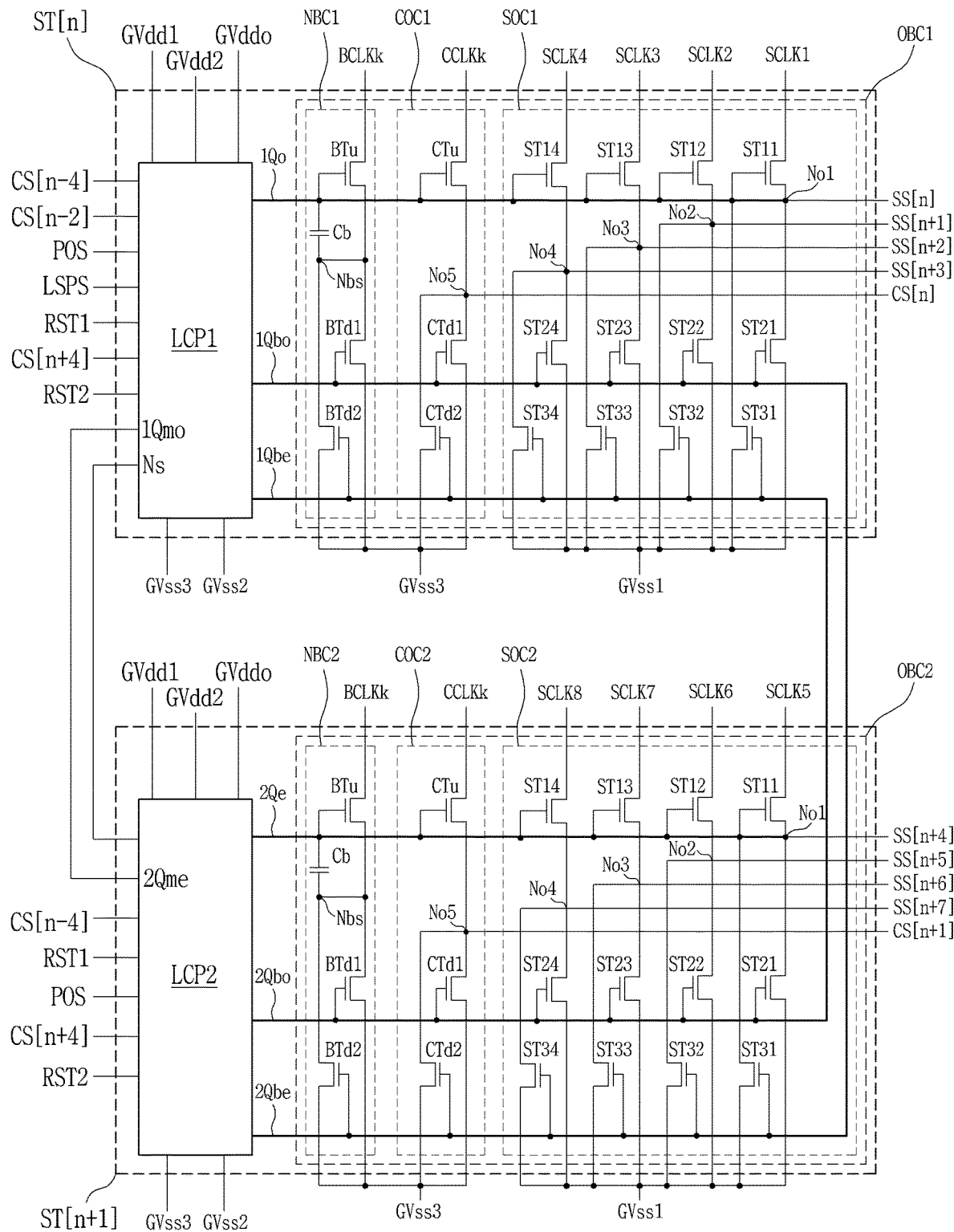
FIG. 10 is a block view illustrating an nth stage circuit and an (n+1)th stage circuit of first to mth stage circuits shown in FIG. 8.

FIG. 10 is a block view illustrating an nth stage circuit and an (n+1)th stage circuit of first to mth stage circuits shown in FIG. 8.

Referring to FIGS. 8 to 10, the nth stage circuit ST[n] according to one embodiment of the present disclosure can be the odd numbered stage circuit of the first to mth stage circuits ST[1] to ST[m] or the first stage circuit of i number of stage circuits respectively grouped into the plurality of stage groups STG1 to STGm/4.

The nth stage circuit ST[n] according to one embodiment can include a first logic circuit portion LCP1 controlling the voltage of each of the first odd control node 1Qo and the second odd control node 1Qbo, and a first output buffer circuit OBC1 boosting the voltage of the first odd control node 1Qo in accordance with the kth boosting shift clock BCLKk and outputting i number of scan signals SS[n] to SS[n+3] and one nth carry signal CS[n] in response to the boosting voltage of the first odd control node 1Qo.

The nth stage circuit ST[n] according to one embodiment can further include a third odd control node 1Qbe and an odd memory node 1Qmo.

Each of the first to third odd control nodes 1Qo, 1Qbo and 1Qbe can commonly be connected to the first logic circuit portion LCP1 and the first output buffer circuit OBC1.

The odd memory node 1Qmo can be connected with the first logic circuit portion LCP1 and the (n+1)th stage circuit ST[n+1].

The first logic circuit portion LCP1 can be embodied to control the voltage of each of the first odd control node 1Qo and the second odd control node 1Qbo in response to the (n−4)th carry signal CS[n−4] (first front carry signal). For example, the first logic circuit portion LCP1 can charge the first gate high potential voltage GVdd1 in the first odd control node 1Qo in response to the (n−4)th carry signal CS[n−4], and can discharge or reset the voltage of the first odd control node 1Qo to the third gate low potential voltage GVss3 in response to the (n+4)th carry signal CS[n+4]. The first logic circuit portion LCP1 can charge the first gate high potential voltage GVdd1 in the first odd control node 1Qo in response to the first reset signal RST1 for initiation of the sensing mode. The first logic circuit portion LCP1 can discharge or reset the voltage of the first odd control node 1Qo to the third gate low potential voltage GVss3 in response to the display panel on signal POS or the second reset signal RST2 for ending of the sensing mode. The first logic circuit portion LCP1 can discharge or reset the voltage of the second odd control node 1Qbo to the third gate low potential voltage GVss3 in response to the voltage of the first odd control node 1Qo or the first reset signal RST1. The first logic circuit portion LCP1 can control the voltage of the odd memory node 1Qmo in response to the (n−2)th carry signal CS[n−2] (second front carry signal) and the line sensing preparation signal LSPS. The first logic circuit portion LCP1 can discharge or reset the voltage of the first odd control node 1Qo to the third gate low potential voltage GVss3 in response to the second reset signal RST2 and the voltage of the odd memory node 1Qmo.

The first output buffer circuit OBC1 can include a first node boosting circuit NBC1 for boosting the voltage of the first odd control node 1Qo in accordance with the kth boosting shift clock BCLKk, a first scan output circuit SOC1 sequentially outputting i number of scan signals SS[n] to SS[n+3] in accordance with a given order in response to the boosting voltage of the first odd control node 1Qo, and a first carry output circuit COC1 outputting the nth carry signal CS[n] in response to the boosting voltage of the first odd control node 1Qo.

The first node boosting circuit NBC1 is only embodied to boost the voltage of the first odd control node 1Qo in accordance with the kth boosting shift clock BCLKk, whereby the kth boosting shift clock BCLKk is not output to the front or rear stage circuit.

The first node boosting circuit NBC1 according to one embodiment can include a boosting pull-up TFT BTu1, a first boosting pull-down TFT BTd1, a second boosting pull-down TFT BTd2, and a boosting capacitor Cb.

The boosting pull-up TFT (or odd boosting pull-up TFT) BTu1 can be embodied to boost the charging voltage of the first odd control node 1Qo by supplying the second high voltage of the kth boosting shift clock BCLKk to a boosting source node Nbs in response to the charging voltage of the first odd control node 1Qo. For example, the boosting pull-up TFT BTu1 can include a gate electrode connected to the first odd control node 1Qo, a first source/drain electrode connected to the boosting source node Nbs, and a second source/drain electrode connected to a kth boosting shift clock line for transferring the kth boosting shift clock BCLKk.

The first boosting pull-down TFT (or (1-1)th boosting pull-down TFT) BTd1 can be embodied to supply the first gate low potential voltage GVss1 to the boosting source node Nbs in accordance with the voltage of the second odd control node 1Qbo. For example, the first boosting pull-down TFT BTd1 can include a gate electrode connected to the second odd control node 1Qbo, a first source/drain electrode connected to the boosting source node Nbs, and a second source/drain electrode connected to the first gate low potential voltage line.

The second boosting pull-down TFT (or (1-2)th boosting pull-down TFT) BTd2 can be embodied to supply the first gate low potential voltage GVss1 to the boosting source node Nbs in accordance with the voltage of the third odd control node 1Qbe. For example, the second boosting pull-down TFT BTd2 can include a gate electrode connected to the third odd control node 1Qbe, a first source/drain electrode connected to the boosting source node Nbs, and a second source/drain electrode connected to the first gate low potential voltage line.

The boosting capacitor Cb can be embodied between the first odd control node 1Qo and the boosting source node Nbs. The boosting capacitor Cb can generate bootstrapping in the first odd control node 1Qo in accordance with phase shift (or transition) of the kth boosting shift clock BCLKk. The boosting capacitor Cb can enhance the boosting voltage of the first odd control node 1Qo because it is not affected by the scan shift clocks SCLK1 to SCLK4.

For example, if the voltage of the first odd control node 1Qo is boosted using scan shift clocks, since three of four scan shift clocks have a first low voltage, the boosting voltage of the first odd control node 1Qo is reduced to ¼, whereby the voltage of the first odd control node 1Qo may not be boosted sufficiently. As a result, a maximum voltage level of a scan signal can be more lowered than the first high voltage of the scan shift clocks.

Also, if the voltage of the first odd control node 1Qo is boosted using carry shift clocks, an error can occur in a boosting operation of the first odd control node 1Qo in accordance with a boosting operation of a rear stage circuit due to overlap between different carry shift clocks supplied to the rear stage circuit.

On the contrary, since the kth boosting shift clock BCLKk which is not affected by the scan shift clocks and the carry shift clocks is used for the boosting operation of the first odd control node 1Qo according to one embodiment of the present disclosure, boosting capacity of the first odd control node 1Qo can be improved. Particularly, the kth boosting shift clock BCLKk is only used to boost the voltage of the first odd control node 1Qo, and the second high voltage of the kth boosting shift clock BCLKk is higher than that of the scan shift clock or the carry shift clock. Therefore, the boosting operation of the first odd control node 1Qo using the kth boosting shift clock BCLKk can remarkably enhance the boosting voltage of the first odd control node 1Qo, whereby the maximum voltage level of the scan signal can correspond to the maximum voltage level of the scan shift clocks.

Each of the boosting pull-up TFT BTu1 and the first boosting pull-down TFT BTd1 is only used to boost the voltage of the first odd control node 1Qo and therefore can have a size relatively smaller than that of the TFT embodying the first scan output circuit SOC1. For example, each of the boosting pull-up TFT BTu1 and the first boosting pull-down TFT BTd1 can have a size of ¼ of the TFT embodying the first scan output circuit SOC1

Since the first boosting pull-down TFT BTd1 and the second boosting pull-down TFT BTd2 are maintained at the turn-on state for a relatively longer time period than that of the boosting pull-up TFT Btu, a degradation speed can be relatively faster than that of the boosting pull-up TFT BTu. Therefore, the first boosting pull-down TFT BTd1 and the second boosting pull-down TFT BTd2 according to the present disclosure can be driven alternately on a certain time period basis in accordance with an opposite voltage of each of the second odd control node 1Qbo and the third odd control node 1Qbe, whereby the degradation speed can be delayed. For example, when the first boosting pull-down TFT BTd1 is maintained at the turn-on state, the second boosting pull-down TFT BTd2 can be maintained at the turn-off state. On the contrary, when the first boosting pull-down TFT BTd1 is maintained at the turn-off state, the second boosting pull-down TFT BTd2 can be maintained at the turn-on state.

The first scan output circuit SOC1 can output the first to fourth scan shift clocks SCLK1 to SCLK4 as the nth to (n+3)th scan signals SS[n] to SS[n+3] in accordance with a given order in response to the boosting voltage of the first odd control node 1Qo.

The first scan output circuit SOC1 according to one embodiment can include first to fourth scan pull-up TFTs ST11 to ST14, first to fourth odd scan pull-down TFTs ST21 to ST24, and first to fourth even scan pull-down TFTs ST31 to ST34.

The first scan pull-up TFT ST11, the first odd scan pull-down TFT ST21 and the first even scan pull-down TFT ST31 can be embodied to output the first scan shift clock SCLK1 as the nth scan signal SC[n] in response to the voltage of each of the first to third odd control nodes 1Qo, 1Qbo and 1Qbe. For example, the first scan pull-up TFT ST11, the first odd scan pull-down TFT ST21 and the first even scan pull-down TFT ST31 can be expressed as the nth scan signal output portions.

The first scan pull-up TFT (or (1-1)th pull-up TFT) ST11 can output the nth scan signal SC[n] having a scan pulse of a first high voltage corresponding to the first scan shift clock SCLK1 to the first output node No1 in response to the boosting voltage of the first odd control node 1Qo, thereby supplying the scan pulse of the nth scan signal SC[n] to the nth gate line. For example, the first scan pull-up TFT ST11 can include a gate electrode connected to the first odd control node 1Qo, a first source/drain electrode connected to the first output node No1 (or first scan output terminal), and a second source/drain electrode connected to the first scan clock line. The first scan pull-up TFT ST11 can completely be turned on by the boosting voltage of the first odd control node 1Qo boosted in accordance with the first node boosting circuit NBC1, whereby the first scan shift clock SCLK1 of the first high voltage can be output as the scan pulse of the nth scan signal SC[n] through the first scan pull-up TFT ST11, which is completely turned on, without loss. Therefore, the maximum voltage level of the nth scan signal SC[n] can have the maximum voltage level of the first scan shift clock SCLK1.

According to one embodiment, based on the first scan shift clock SCLK1, the first scan-pull TFT ST11 can supply the first scan pulse SCP1 to the nth gate line at the image display period IDP of the display mode shown in FIG. 5 or 6, and can supply the second scan pulse SCP2 to the nth gate line at the black display period BDP of the display mode. The first scan-pull TFT ST11 can additionally supply the third scan pulse SCP3 to the nth gate line at the sensing period shown in FIG. 6, based on the first scan shift clock SCLK1, when sensing driving characteristics of the subpixels embodied in the nth horizontal line at the sensing mode.

The first odd scan pull-down TFT (or (2-1)th pull-down TFT) ST21 can output the nth scan signal SC[n] of a low voltage corresponding to the first gate low potential voltage GVss1 to the first output node No1 in accordance with the voltage of the second odd control node 1Qbo, thereby supplying the nth scan signal SC[n] of the low voltage to the nth gate line. For example, the first odd scan pull-down TFT ST21 can include a gate electrode connected to the second odd control node 1Qbo, a first source/drain electrode connected to the first output node No1, and a second source/drain electrode connected to the first gate low potential voltage line.

The first even scan pull-down TFT (or (3-1)th pull-down TFT) ST31 can output the nth scan signal SC[n] of a low voltage corresponding to the first gate low potential voltage GVss1 to the first output node No1 in accordance with the voltage of the third odd control node 1Qbe, thereby supplying the nth scan signal SC[n] of the low voltage to the nth gate line. For example, the first even scan pull-down TFT ST31 can include a gate electrode connected to the third odd control node 1Qbe, a first source/drain electrode connected to the first output node No1, and a second source/drain electrode connected to the first gate low potential voltage line.

The first odd scan pull-down TFT ST21 and the first even scan pull-down TFT ST31 can be driven alternately on a certain time period basis in accordance with an opposite voltage of each of the second odd control node 1Qbo and the third odd control node 1Qbe, whereby the degradation speed can be delayed.

The second scan pull-up TFT ST12, the second odd scan pull-down TFT ST22 and the second even scan pull-down TFT ST32 can be embodied to output the second scan shift clock SCLK2 as the (n+1)th scan signal SC[n+1] in response to the voltage of each of the first to third odd control nodes 1Qo, 1Qbo and 1Qbe. For example, the second scan pull-up TFT ST12, the second odd scan pull-down TFT ST22 and the second even scan pull-down TFT ST32 can be expressed as the (n+1)th scan signal output portions.

The second scan pull-up TFT (or (1-2)th pull-up TFT) ST12 can output the (n+1)th scan signal SC[n+1] having a scan pulse of a first high voltage corresponding to the second scan shift clock SCLK2 to the second output node No2 in response to the boosting voltage of the first odd control node 1Qo, thereby supplying the scan pulse of the (n+1)th scan signal SC[n+1] to the (n+1)th gate line. For example, the second scan pull-up TFT ST12 can include a gate electrode connected to the first odd control node 1Qo, a first source/drain electrode connected to the second output node No2 (or second scan output terminal), and a second source/drain electrode connected to the second scan clock line. The second scan pull-up TFT ST12 can completely be turned on by the boosting voltage of the first odd control node 1Qo boosted in accordance with the first node boosting circuit NBC1, whereby the second scan shift clock SCLK2 of the first high voltage can be output as the scan pulse of the (n+1)th scan signal SC[n+1] through the second scan pull-up TFT ST12, which is completely turned on, without loss. Therefore, the maximum voltage level of the (n+1)th scan signal SC[n+1] can have the maximum voltage level of the second scan shift clock SCLK2.

According to one embodiment, based on the second scan shift clock SCLK2, the second scan-pull TFT ST12 can supply the first scan pulse SCP1 to the (n+1)th gate line at the image display period IDP of the display mode shown in FIG. 5 or 6, and can supply the second scan pulse SCP2 to the (n+1)th gate line at the black display period BDP of the display mode. The second scan-pull TFT ST12 can additionally supply the third scan pulse SCP3 to the (n+1)th gate line at the sensing period RSP shown in FIG. 6, based on the second scan shift clock SCLK2, when sensing driving characteristics of the subpixels embodied in the (n+1)th horizontal line at the sensing mode.

The second odd scan pull-down TFT (or (2-2)th pull-down TFT) ST22 can output the (n+1)th scan signal SC[n+1] of a low voltage corresponding to the first gate low potential voltage GVss1 to the second output node No2 in accordance with the voltage of the second odd control node 1Qbo, thereby supplying the (n+1)th scan signal SC[n+1] of the low voltage to the (n+1)th gate line. For example, the second odd scan pull-down TFT ST22 can include a gate electrode connected to the second odd control node 1Qbo, a first source/drain electrode connected to the second output node No2, and a second source/drain electrode connected to the first gate low potential voltage line.

The second even scan pull-down TFT (or (3-2)th pull-down TFT) ST32 can output the (n+1)th scan signal SC[n+1] of a low voltage corresponding to the first gate low potential voltage GVss1 to the second output node No2 in accordance with the voltage of the third odd control node 1Qbe, thereby supplying the (n+1)th scan signal SC[n+1] of the low voltage to the (n+1)th gate line. For example, the second even scan pull-down TFT ST32 can include a gate electrode connected to the third odd control node 1Qbe, a first source/drain electrode connected to the second output node No2, and a second source/drain electrode connected to the first gate low potential voltage line.

The second odd scan pull-down TFT ST22 and the second even scan pull-down TFT ST32 can be driven alternately on a certain time period basis in accordance with an opposite voltage of each of the second odd control node 1Qbo and the third odd control node 1Qbe, whereby the degradation speed can be delayed.

The third scan pull-up TFT ST13, the third odd scan pull-down TFT ST23 and the third even scan pull-down TFT ST33 can be embodied to output the third scan shift clock SCLK3 as the (n+2)th scan signal SC[n+2] in response to the voltage of each of the first to third odd control nodes 1Qo, 1Qbo and 1Qbe. For example, the third scan pull-up TFT ST13, the third odd scan pull-down TFT ST23 and the third even scan pull-down TFT ST33 can be expressed as the (n+2)th scan signal output portions.

The third scan pull-up TFT (or (1-3)th pull-up TFT) ST13 can output the (n+2)th scan signal SC[n+2] having a scan pulse of a first high voltage corresponding to the third scan shift clock SCLK3 to the third output node No3 in response to the boosting voltage of the first odd control node 1Qo, thereby supplying the scan pulse of the (n+2)th scan signal SC[n+2] to the (n+2)th gate line. For example, the third scan pull-up TFT ST13 can include a gate electrode connected to the first odd control node 1Qo, a first source/drain electrode connected to the third output node No3 (or third scan output terminal), and a second source/drain electrode connected to the third scan clock line. The third scan pull-up TFT ST13 can completely be turned on by the boosting voltage of the first odd control node 1Qo boosted in accordance with the first node boosting circuit NBC1, whereby the third scan shift clock SCLK3 of the first high voltage can be output as the scan pulse of the (n+2)th scan signal SC[n+2] through the third scan pull-up TFT ST13, which is completely turned on, without loss. Therefore, the maximum voltage level of the (n+2)th scan signal SC[n+2] can have the maximum voltage level of the third scan shift clock SCLK3.

According to one embodiment, based on the third scan shift clock SCLK3, the third scan-pull TFT ST13 can supply the first scan pulse SCP1 to the (n+2)th gate line at the image display period IDP of the display mode shown in FIG. 5 or 6, and can supply the third scan pulse SCP3 to the (n+2)th gate line at the black display period BDP of the display mode. The third scan-pull TFT ST13 can additionally supply the third scan pulse SCP3 to the (n+2)th gate line at the sensing period RSP shown in FIG. 6, based on the third scan shift clock SCLK3, when sensing driving characteristics of the subpixels embodied in the (n+2)th horizontal line at the sensing mode.

The third odd scan pull-down TFT (or (2-3)th pull-down TFT) ST23 can output the (n+2)th scan signal SC[n+2] of a low voltage corresponding to the first gate low potential voltage GVss1 to the third output node No3 in accordance with the voltage of the second odd control node 1Qbo, thereby supplying the (n+2)th scan signal SC[n+2] of the low voltage to the (n+2)th gate line. For example, the third odd scan pull-down TFT ST23 can include a gate electrode connected to the third odd control node 1Qbe, a first source/drain electrode connected to the third output node No3, and a second source/drain electrode connected to the first gate low potential voltage line.

The third even scan pull-down TFT (or (3-3)th pull-down TFT) ST33 can output the (n+2)th scan signal SC[n+2] of a low voltage corresponding to the first gate low potential voltage GVss1 to the third output node No3 in accordance with the voltage of the third odd control node 1Qbe, thereby supplying the (n+2)th scan signal SC[n+2] of the low voltage to the (n+2)th gate line. For example, the third even scan pull-down TFT ST33 can include a gate electrode connected to the third odd control node 1Qbe, a first source/drain electrode connected to the third output node No3, and a second source/drain electrode connected to the first gate low potential voltage line.

The third odd scan pull-down TFT ST23 and the third even scan pull-down TFT ST33 can be driven alternately on a certain time period basis in accordance with an opposite voltage of each of the second odd control node 1Qbo and the third odd control node 1Qbe, whereby the degradation speed can be delayed.

The fourth scan pull-up TFT ST14, the fourth odd scan pull-down TFT ST24 and the fourth even scan pull-down TFT ST34 can be embodied to output the fourth scan shift clock SCLK4 as the (n+3)th scan signal SC[n+3] in response to the voltage of each of the first to third odd control nodes 1Qo, 1Qbo and 1Qbe. For example, the fourth scan pull-up TFT ST14, the fourth odd scan pull-down TFT ST24 and the fourth even scan pull-down TFT ST34 can be expressed as the (n+3)th scan signal output portions.

The fourth scan pull-up TFT (or (1-4)th pull-up TFT) ST14 can output the (n+3)th scan signal SC[n+3] having a scan pulse of a first high voltage corresponding to the fourth scan shift clock SCLK4 to the fourth output node No4 in response to the boosting voltage of the first odd control node 1Qo, thereby supplying the scan pulse of the (n+3)th scan signal SC[n+3] to the (n+3)th gate line. For example, the fourth scan pull-up TFT ST14 can include a gate electrode connected to the first odd control node 1Qo, a first source/drain electrode connected to the fourth output node No4 (or fourth scan output terminal), and a second source/drain electrode connected to the fourth scan clock line. The fourth scan pull-up TFT ST14 can completely be turned on by the boosting voltage of the first odd control node 1Qo boosted in accordance with the first node boosting circuit NBC1, whereby the fourth scan shift clock SCLK4 of the first high voltage can be output as the scan pulse of the (n+3)th scan signal SC[n+3] through the fourth scan pull-up TFT ST14, which is completely turned on, without loss. Therefore, the maximum voltage level of the (n+3)th scan signal SC[n+3] can have the maximum voltage level of the fourth scan shift clock SCLK4.

According to one embodiment, based on the fourth scan shift clock SCLK4, the fourth scan-pull TFT ST14 can supply the first scan pulse SCP1 to the (n+3)th gate line at the image display period IDP of the display mode shown in FIG. 5 or 6, and can supply the third scan pulse SCP3 to the (n+3)th gate line at the black display period BDP of the display mode. The fourth scan-pull TFT ST14 can additionally supply the third scan pulse SCP3 to the (n+3)th gate line at the sensing period RSP shown in FIG. 6, based on the fourth scan shift clock SCLK4, when sensing driving characteristics of the subpixels embodied in the (n+3)th horizontal line at the sensing mode.

The fourth odd scan pull-down TFT (or (2-4)th pull-down TFT) ST24 can output the (n+3)th scan signal SC[n+3] of a low voltage corresponding to the first gate low potential voltage GVss1 to the fourth output node No4 in accordance with the voltage of the second odd control node 1Qbo, thereby supplying the (n+3)th scan signal SC[n+3] of the low voltage to the (n+3)th gate line. For example, the fourth odd scan pull-down TFT ST24 can include a gate electrode connected to the second odd control node 1Qbo, a first source/drain electrode connected to the fourth output node No4, and a second source/drain electrode connected to the first gate low potential voltage line.

The fourth even scan pull-down TFT (or (3-4)th pull-down TFT) ST34 can output the (n+3)th scan signal SC[n+3] of a low voltage corresponding to the first gate low potential voltage GVss1 to the fourth output node No4 in accordance with the voltage of the third odd control node 1Qbe, thereby supplying the (n+3)th scan signal SC[n+3] of the low voltage to the (n+3)th gate line. For example, the fourth even scan pull-down TFT ST34 can include a gate electrode connected to the third odd control node 1Qbe, a first source/drain electrode connected to the fourth output node No4, and a second source/drain electrode connected to the first gate low potential voltage line.

The fourth odd scan pull-down TFT ST24 and the fourth even scan pull-down TFT ST34 can be driven alternately on a certain time period basis in accordance with an opposite voltage of each of the second odd control node 1Qbo and the third odd control node 1Qbe, whereby the degradation speed can be delayed.

The first carry output circuit COC1 can output the kth carry shift clock CCLKk as the nth carry signal in response to the boosting voltage of the first odd control node 1Qo.

The first carry output circuit COC1 according to one embodiment can include a carry pull-up TFT CTu, a first carry pull-down TFT CTd1, and a second carry pull-down TFT CTd2.

The carry pull-up TFT CTu can output the nth carry signal CS[n] having a first high voltage corresponding to the kth carry shift clock CCLKk, to the fifth output node No5 in response to the boosting voltage of the first odd control node 1Qo, thereby supplying the nth carry signal CS[n] of the first high voltage to the front or rear stage circuit. For example, the carry pull-up TFT CTu can include a gate electrode connected to the first odd control node 1Qo, a first source/drain electrode connected to the fifth output node No5, and a second source/drain electrode connected to a kth carry shift clock line.

The first carry pull-down TFT (or (1-1)th carry pull-down TFT) CTd1 can output the nth carry signal CS[n] of a low voltage corresponding to the first gate low potential voltage GVss1 to the fifth output node No5 in accordance with the voltage of the second odd control node 1Qbo, thereby supplying the nth carry signal CS[n] of the low voltage to the front or rear stage circuit. For example, the first carry pull-down TFT CTd1 can include a gate electrode connected to the second odd control node 1Qbo, a first source/drain electrode connected to the fifth output node No5, and a second source/drain electrode connected to the first gate low potential voltage line.

The second carry pull-down TFT (or (1-2)th carry pull-down TFT) CTd2 can output the nth carry signal CS[n] of a low voltage corresponding to the first gate low potential voltage GVss1 to the fifth output node No5 in accordance with the voltage of the third odd control node 1Qbe, thereby supplying the nth carry signal CS[n] of the low voltage to the front or rear stage circuit. For example, the second carry pull-down TFT CTd2 can include a gate electrode connected to the third odd control node 1Qbe, a first source/drain electrode connected to the fifth output node No5, and a second source/drain electrode connected to the first gate low potential voltage line.

The first carry pull-down TFT CTd1 and the second carry pull-down TFT CTd2 can be driven alternately on a certain time period basis in accordance with an opposite voltage of each of the second odd control node 1Qbo and the third odd control node 1Qbe, whereby the degradation speed can be delayed.

The (n+1)th stage circuit ST[n+1] according to one embodiment can include a second logic circuit portion LCP2 controlling the voltage of each of the first even control node 2Qe and the second even control node 2Qbo, and a second output buffer circuit OBC2 boosting the voltage of the first even control node 2Qe in accordance with the kth boosting shift clock BCLKk and outputting i number of scan signals SS[n+4] to SS[n+7] and one (n+1)th carry signal CS[n+1] in response to the boosting voltage of the first even control node 2Qe.

The (n+1)th stage circuit ST[n+1] according to one embodiment can further include a third even control node 2Qbe and an even memory node 2Qme.

Each of the first to third even control nodes 2Qo, 2Qbo and 2Qbe can commonly be connected to the second logic circuit portion LCP2 and the second output buffer circuit OBC2.

The even memory node 2Qme can be connected with the second logic circuit portion LCP2 and the odd memory node 1Qmo of the nth stage circuit ST[n].

The second logic circuit portion LCP2 can be embodied to control the voltage of each of the first even control node 2Qe and the second even control node 2Qbe in response to the (n−4)th carry signal CS[n−4]. For example, the second logic circuit portion LCP2 can charge the first gate high potential voltage GVdd1 in the first even control node 2Qe in response to the (n−4)th carry signal CS[n−4], and can discharge or reset the voltage of the first even control node 2Qe to the third gate low potential voltage GVss3 in response to the (n+4)th carry signal CS[n+4]. The second logic circuit portion LCP2 can charge the first gate high potential voltage GVdd1 supplied from the first logic circuit portion LCP1 of the nth stage circuit ST[n] in the second even control node 2Qe in response to the first reset signal RST1 for initiation of the sensing mode. The second logic circuit portion LCP2 can discharge or reset the voltage of the first even control node 2Qe to the third gate low potential voltage GVss3 in response to the display panel on signal POS or the second reset signal RST2. The second logic circuit portion LCP2 can discharge or reset the voltage of the second even control node 2Qbe in response to the voltage of the first even control node 2Qe or the first reset signal RST1. The second logic circuit portion LCP2 can discharge or reset the voltage of the first even control node 2Qe to the third gate low potential voltage GVss3 in accordance with the voltage of the even memory node 2Qme connected to the odd memory node 1Qmo of the nth stage circuit ST[n] and the second reset signal RST2.

The second output buffer circuit OBC2 can include a second node boosting circuit NBC2 for boosting the voltage of the first even control node 2Qe in accordance with the kth boosting shift clock BCLKk, a second scan output circuit SOC2 sequentially outputting i number of scan signals SS[n+4] to SS[n+7] in accordance with a given order in response to the boosting voltage of the first even control node 2Qe, and a second carry output circuit COC2 outputting the (n+1)th carry signal CS[n+1] in response to the boosting voltage of the first even control node 2Qe.

The second node boosting circuit NBC2 is only embodied to boost the voltage of the first even control node 2Qe in accordance with the kth boosting shift clock BCLKk, whereby the kth boosting shift clock BCLKk is not output to the front or rear stage circuit.

The second node boosting circuit NBC2 according to one embodiment can include a boosting pull-up TFT BTu1, a first boosting pull-down TFT BTd1, a second boosting pull-down TFT BTd2, and a boosting capacitor Cb. Since the second node boosting circuit NBC2 is substantially the same as the first node boosting circuit NBC1 of the nth stage circuit ST[n] except that it is connected to the first to third even control nodes 2Qe, 2Qbo and 2Qbe and boosts the voltage of the first even control node 2Qe in accordance with the kth boosting shift clock BCLKk, the same reference numerals as those of the first node boosting circuit NBC1 will be given to elements of the second node boosting circuit NBC2 and their repeated description will be omitted or may be brief.

The second scan output circuit SOC2 can output the fifth to eighth scan shift clocks SCLK5 to SCLK8 as the (n+4)th to (n+7)th scan signals SS[n+4] to SS[n+7] in accordance with a given order in response to the boosting voltage of the first even control node 2Qe.

The second scan output circuit SOC2 according to one embodiment can include first to fourth scan pull-up TFTs ST11 to ST14, first to fourth odd scan pull-down TFTs ST21 to ST24, and first to fourth even scan pull-down TFTs ST31 to ST34. Since the second scan output circuit SOC2 provided as above substantially has the same TFT connection structure as the second scan output circuit SOC2 of the nth stage circuit ST[n] except that it outputs the fifth to eighth scan shift clocks SCLK5 to SCLK8 as the (n+4)th to (n+7)th scan signals SS[n+4] to SS[n+7] in accordance with a given order in response to the boosting voltage of the first even control node 2Qe, the same reference numerals as those of the second scan output circuit SOC2 of the nth stage circuit ST[n] will be given to elements of the second scan output circuit SOC2 and their repeated description will be omitted or may be brief.

Figure 11:
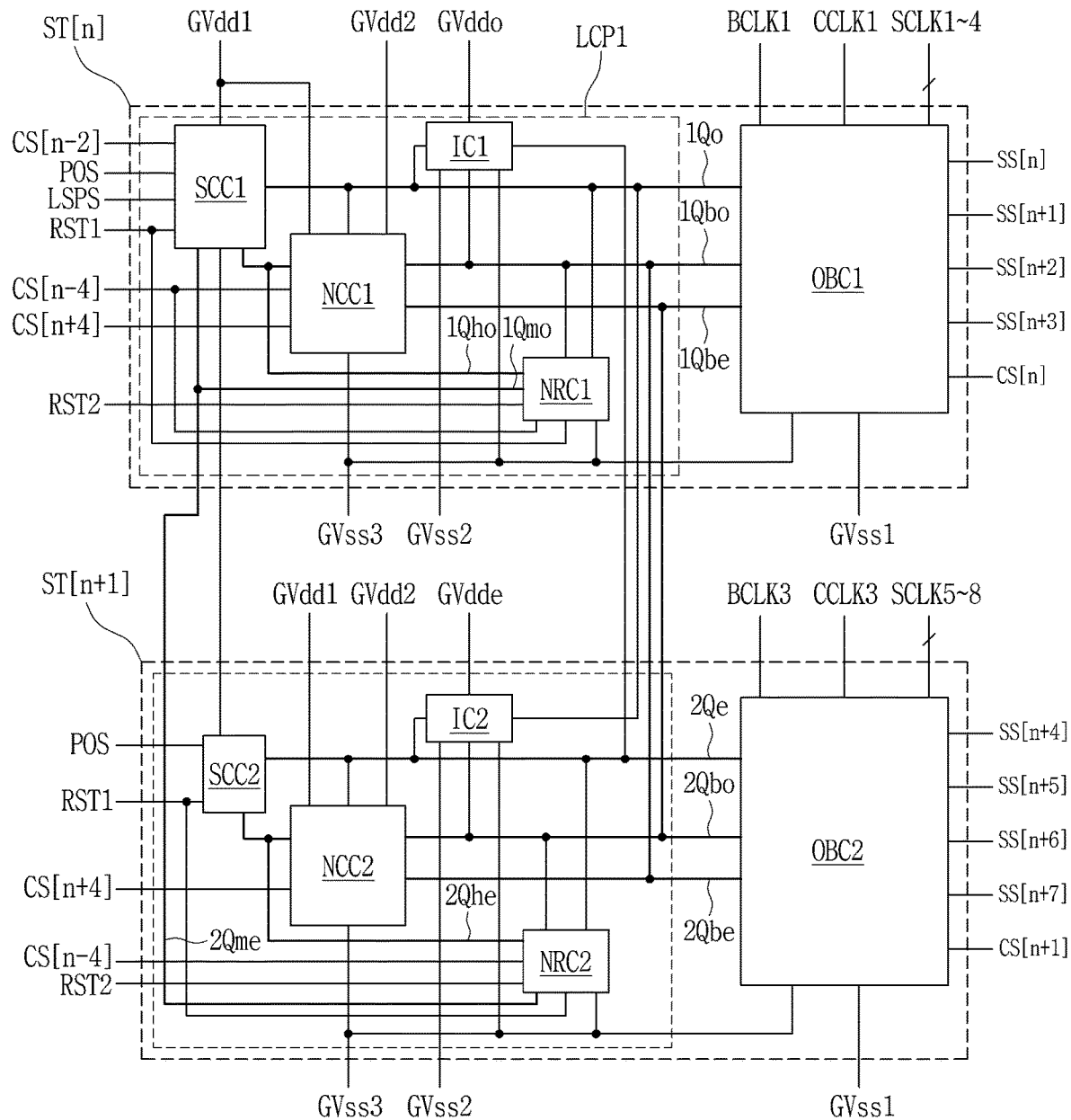
FIG. 11 is a circuit view illustrating first and second logic circuit portions shown in FIG. 10.

FIG. 11 is a circuit view illustrating first and second logic circuit portions shown in FIG. 10.

Referring to FIG. 11, the first logic circuit portion NCP1 of the nth stage circuit ST[n] according to one embodiment can include a first sensing control circuit SCC1, a first node control circuit NCC1, a first inverter circuit IC1, and a first node reset circuit NRC1.

The first sensing control circuit SCC1 can be embodied to control the potential of the odd memory node 1Qmo through the first gate high potential voltage GVdd1 in response to the line sensing preparation signal LSPS and the (n−2)th carry signal CS[n−2] (second front carry signal) and control the potential of the first odd control node 1Qo through the first gate high potential voltage GVdd1 in response to the voltage of the odd memory node 1Qmo and the first reset signal RST1. The first sensing control circuit SCC1 can be embodied to discharge or reset the potential of the first odd control node 1Qo to the third gate low potential voltage GVss3 in response to the display panel on signal POS supplied when the light emitting display apparatus is powered on.

The first node control circuit NCC1 can be embodied to control the voltage of each of the first to third odd control nodes 1Qo, 1Qbo and 1Qbe.

The first node control circuit NCC1 can be embodied to control the potential of the first odd control node 1Qo through the first gate high potential voltage GVdd1 in response to the (n−4)th carry signal CS[n−4] and control the potential of each of the first odd control node 1Qo and an odd voltage hold node 1Gho through the third gate low potential voltage GVss3 in response to the (n+4)th carry signal CS[n+4]. Optionally, the first node control circuit NCC1 can be embodied to control the potential of each of the first odd control node 1Qo and the odd voltage hold node 1Qho through the third gate low potential voltage GVss3 in response to the (n+3)th carry signal CS[n+3] (or first rear carry signal).

The first node control circuit NCC1 can be embodied to control the potential of the odd voltage hold node 1Qho through the first gate high potential voltage GVdd1 in response to the voltage of the first odd control node 1Qo. The first node control circuit NCC1 can be embodied to control the potential of each of the first odd control node 1Qo and the odd voltage hold node 1Qho through the third gate low potential voltage GVss3 in response to the voltage of the second odd control node 1Qbo or the voltage of the third odd control node 1Qbe.

The first inverter circuit IC1 can be embodied to control the potential of the second odd control node 1Qbo through the third gate high potential voltage GVddo or the third gate low potential voltage GVss3 in response to the voltage of the first odd control node 1Qo. For example, when the potential of the first odd control node 1Qo is a high voltage or more, the first inverter circuit IC1 can control the potential of the second odd control node 1Qbo through the third gate low potential voltage GVss3. The first inverter circuit IC1 can be embodied to control the potential of the second odd control node 1Qbo through the third gate high potential voltage GVddo or the third gate low potential voltage GVss3 in response to the voltage of the first even control node 2Qe of the (n+1)th stage circuit ST[n+1]. For example, when the potential of the first even control node 2Qe of the (n+1)th stage circuit ST[n+1] is a low voltage, the first inverter circuit IC1 can control the potential of the second odd control node 1Qbo through the third gate high potential voltage GVddo.

The first node reset circuit NRC1 can be embodied to control the potential of the second odd control node 1Qbo through the third gate low potential voltage GVss3 in response to the (n−4)th carry signal CS[n−4]. The first node reset circuit NRC1 can be embodied to control the potential of the second odd control node 1Qbo through the third gate low potential voltage GVss3 in response to the voltage of the odd memory node 1Qmo and the first reset signal RST1. The first node reset circuit NRC1 can be embodied to control the potential of the first odd control node 1Qo through the third gate low potential voltage GVss3 in response to the voltage of the odd voltage hold node 1Qho, the voltage of the odd memory node 1Qmo and the second reset signal RST2.

The second logic circuit portion NCP2 of the (n+1)th stage circuit ST[n+1] according to one embodiment of the present disclosure can include a second sensing control circuit SCC2, a second node control circuit NCC2, a second inverter circuit IC2, and a second node reset circuit NRC2.

The second sensing control circuit SCC2 can share the potential of the odd memory node 1Qmo of the first sensing control circuit SCC1 embodied in the nth stage circuit ST[n]. For example, the second sensing control circuit SCC2 can share a circuit embodied to control the potential of the odd memory node 1Qmo through the first gate high potential voltage GVdd1 in response to the line sensing preparation signal LSPS and the (n−2)th carry signal CS[n−2], in the first sensing control circuit SCC1 embodied in the nth stage circuit ST[n].

The second sensing control circuit SCC2 can be embodied to control the potential of the first even control node 2Qe through the first gate high potential voltage GVdd1 supplied from the first sensing control circuit SCC1 of the nth stage circuit ST[n] in response to the first reset signal RST1.

The second sensing control circuit SCC2 can be embodied to discharge or reset the potential of the first even control node 2Qe to the third gate low potential voltage GVss3 in response to the display panel on signal POS supplied when the light emitting display apparatus is powered on.

The second node control circuit NCC2 can be embodied to control the voltage of each of the first to third even control nodes 2Qe, 2Qbo and 2Qbe.

The second node control circuit NCC2 can be embodied to control the potential of the first even control node 2Qe through the first gate high potential voltage GVdd1 in response to the (n−4)th carry signal CS[n−4], and can be embodied to control the potential of each of the first even control node 2Qe and the even voltage hold node 2Qhe through the third gate low potential voltage GVss3 in response to the (n+4)th carry signal CS[n+4].

The second node control circuit NCC2 can be embodied to control the potential of the even voltage hold node 2Qhe through the first gate high potential voltage GVdd1 in response to the voltage of the first even control node 2Qe. The second node control circuit NCC2 can be embodied to control the potential of each of the first even control node 2Qe and the even voltage hold node 2Qhe through the third gate low potential voltage GVss3 in response to the voltage of the second even control node 2Qbo or the voltage of the third even control node 2Qbe.

The second inverter circuit IC2 can be embodied to control the potential of the second even control node 2Qbo through the fourth gate high potential voltage GVdde or the third gate low potential voltage GVss3 in response to the voltage of the first even control node 2Qe. For example, when the potential of the first even control node 2Qe is a high voltage or more, the second inverter circuit IC2 can control the potential of the second even control node 2Qbo through the third gate low potential voltage GVss3. The second inverter circuit IC2 can be embodied to control the potential of the second even control node 2Qbo through the third gate high potential voltage GVddo or the third gate low potential voltage GVss3 in response to the voltage of the first odd control node 1Qo of the nth stage circuit ST[n]. For example, when the potential of the first odd control node 1Qo of the nth stage circuit ST[n] is a low voltage, the second inverter circuit IC2 can control the potential of the second even control node 2Qbo through the fourth gate high potential voltage GVdde.

The second node reset circuit NRC2 can be embodied to control the potential of the second even control node 2Qbo through the third gate low potential voltage GVss3 in response to the (n−4)th carry signal CS[n−4]. The second node reset circuit NRC2 can be embodied to control the potential of the second even control node 2Qbo through the third gate low potential voltage GVss3 in response to the voltage of the even memory node 2Qme and the first reset signal RST1. The second node reset circuit NRC2 can be embodied to control the potential of the first even control node 2Qe through the third gate low potential voltage GVss3 in response to a voltage of an even voltage hold node 2Qhe, the voltage of the even memory node 2Qme and the second reset signal RST2.

In the gate driving circuit 510 according to one embodiment of the present disclosure, the voltages of the first control nodes 1Qo and 2qe can be boosted using a separate boosting clock without using the scan shift clock SCLKs or the carry shift clock CCLK, whereby the maximum voltage level of the scan signal SS can be prevented from being deteriorated. Also, in the gate driving circuit 510 according to one embodiment of the present disclosure, some circuit that includes the odd memory node 1Qmo in the sensing control circuits SCC1 and SCC2 embodied in the nth stage circuit ST[n] can be shared with the (n+1)th stage circuit ST[n+1] adjacent thereto, whereby circuit configuration for the sensing mode can be simplified. In the gate driving circuit according to one embodiment of the present disclosure, the nth stage circuit ST[n] and the (n+1)th stage circuit ST[n+1], which are adjacent to each other, can mutually share the second and third control nodes 1Qbo, 1Qbe, 2Qbo and 2Qbe, which are alternately driven, whereby configuration of the inverter circuits IC1 and IC2 of the stage circuits can be simplified.

Meanwhile, for convenience of description, the aforementioned description of FIGS. 10 and 11 is based on that the control node embodied in each of the nth stage circuit ST[n] and the (n+1)th stage circuit ST[n+1] is divided into the odd and the even, but is not limited thereto. For example, it is to be understood that each of the first to mth stage circuits ST[1] to ST[m] includes first to third control nodes, a voltage hold node, and memory node.

Figure 12:
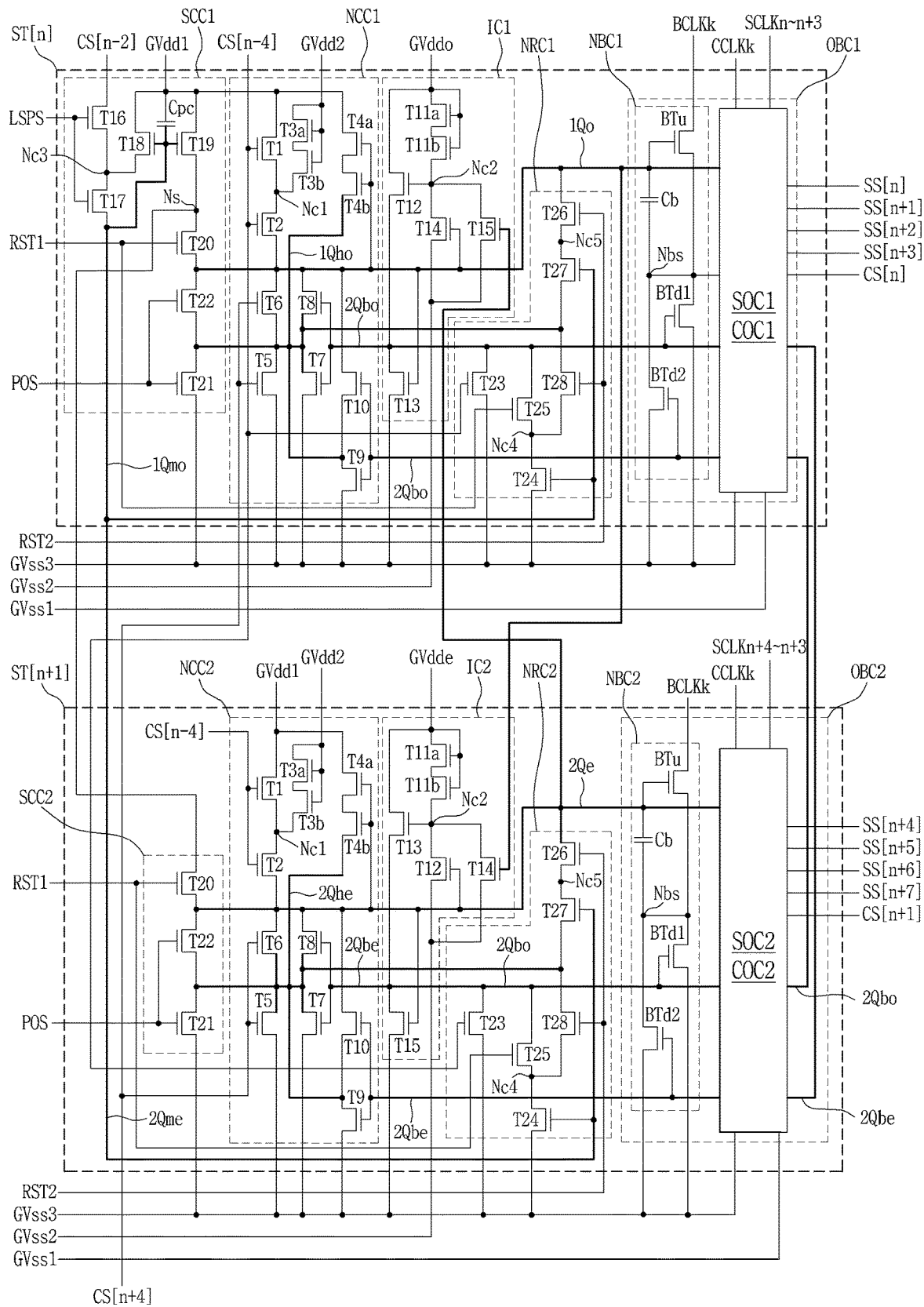
FIG. 12 is a circuit view illustrating an nth stage circuit and an (n+1)th stage circuit shown in FIGS. 10 and 11.

FIG. 12 is a circuit view illustrating an nth stage circuit and an (n+1)th stage circuit shown in FIGS. 10 and 11.

Referring to FIGS. 10 to 12, the nth stage circuit ST[n] according to one embodiment of the present disclosure can include a first sensing control circuit SCC1, a first node control circuit NCC1, a first inverter circuit IC1, a first node reset circuit NRC1 and a first output buffer circuit OBC1, which are selectively connected to the first to odd memory nodes 1Qo, 1Qbo and 1Qbe, the odd voltage hold node 1Qho and the odd memory node 1Qmo.

The first node control circuit NCC1 according to one embodiment can include first to tenth TFTs T1 to T10.

The first to fourth TFTs T1, T2, T3a, T3b, T4a and T4b serve to control or setup the potential of the first odd control node 1Qo, and thus can be expressed as first node setup circuits.

The first TFT T1 and the second TFT T2 can be electrically connected between the first gate high potential voltage line for transferring the first gate high potential voltage GVdd1 and the first odd control node 1Qo in series, and can be embodied to charge the first gate high potential voltage GVdd1 in the first odd control node 1Qo in response to the (n−4)th carry signal CS[n−4].

In this case, the (n−4)th carry signal CS[n−4] can be a first front carry signal.

The first TFT T1 can output the first gate high potential voltage GVdd1 to a first connection node Nd1 in response to the (n−4)th carry signal CS[n−4] supplied through a front carry input line. For example, the first TFT T1 can be turned on in accordance with the (n−4)th carry signal CS[n−4] of a high voltage to output the first gate high potential voltage GVdd1 to the first connection node Nc1.

The second TFT T2 can electrically connect the first connection node N1 to the first odd control node 1Qo in response to the (n−4)th carry signal CS[n−4]. For example, the second TFT T2 can be turned on in accordance with the (n−4)th carry signal CS[n−4] of a high voltage simultaneously with the first TFT T1 to supply the first gate high potential voltage GVdd1 supplied through the first connection node Ne1 to the first odd control node 1Qo.

The third TFTs T3a and T3b can supply the second gate high potential voltage GVdd2 to the first connection node N1 in response to the second gate high potential voltage GVdd2. For example, the third TFTs T3a and T3b can be turned on in accordance with the second gate high potential voltage GVdd2 to always supply the second gate high potential voltage GVdd2 to the first connection node N1 between the first TFT T1 and the second TFT T2, thereby preventing off current of the first TFT T1 and current leakage of the first odd control node 1Qo from occurring. For example, the third TFTs T3a and T3b can completely turn off the first TFT T1 turned off by the (n−4)th carry signal CS[n−4] having a low voltage by increasing a voltage difference between the gate voltage of the first TFT T1 and the first connection node Nc1. As a result, voltage drop (or current leakage) of the first odd control node 1Qo by off current of the first TFT T1 which is turned off can be prevented from occurring, whereby the voltage of the first odd control node 1Qo can stably be maintained. For example, when the threshold voltage of the first TFT T1 has a negative polarity (−), the gate-source voltage Vgs of the first TFT T1 can be fixed to the negative polarity (−) by the second gate high potential voltage GVdd2 supplied to the drain electrode. For this reason, the first TFT T1 which is turned off can become a complete off state, whereby current leakage based on the off current can be prevented from occurring.

The second gate high potential voltage GVdd2 is set to a voltage level lower than the first gate high potential voltage GVdd1. Resistance of the second gate high potential voltage GVdd2 is set to be higher than that of the first gate high potential voltage GVdd1 to reduce a voltage drop of the first gate high potential voltage GVdd1. The second gate high potential voltage line for supplying the second gate high potential voltage GVdd2 can be used as a path through which a leakage current of the third TFTs T3a and T3b flows, whereby the voltage drop of the first gate high potential voltage GVdd1 can be reduced. Therefore, in one embodiment of the present disclosure, the first gate high potential voltage line and the second gate high potential voltage line can be detached from each other to independently configure voltage drop components of the first gate high potential voltage line and the second gate high potential voltage line, whereby the voltage drop of the first gate high potential voltage line can be minimized. As a result, an error operation of the gate driving circuit, which is generated due to the voltage drop of the first gate high potential voltage line, can be avoided.

The third TFTs T3a and T3b according to one embodiment can include (3-1)th and (3-2)th TFTs T3a and T3b electrically connected with each other in series between the second gate high potential voltage line and the first connection node Nc1 to prevent the leakage current due to the off current from occurring.

The (3-1)th TFT T3a can be turned on by the second gate high potential voltage GVdd2 to supply the second gate high potential voltage GVdd2 to the (3-2)th TFT T3b. For example, the (3-1)th TFT T3a can be connected to the second gate high potential voltage line in the form of diode.

The (3-2)th TFT T3b can be turned on by the second gate high potential voltage GVdd2 simultaneously with the (3-1)th TFT T3a to supply the second gate high potential voltage GVdd2 supplied through the (3-1)th TFT T3a, to the first connection node Nc1.

The fourth TFTs T4a and T4b can supply the first gate high potential voltage GVdd1 to the odd voltage hold node 1Qho in response to the first odd control node 1Qo. For example, the fourth TFTs T4a and T4b can be turned on in accordance with the high voltage of the first odd control node 1Qo to supply the first gate high potential voltage GVdd1 to the odd voltage hold node 1Qho.

The fourth TFTs T4a and T4b according to one embodiment can include (4-1)th and (4-2)th TFTs T4a and T4b electrically connected with each other in series between the first gate high potential voltage line and the odd voltage hold node 1Qho to prevent the leakage current due to the off current from occurring.

The (4-1)th TFT T4a can be turned on by the high voltage of the first odd control node 1Qo to supply the first gate high potential voltage GVdd1 to the (4-2)th TFT T4b.

The (4-2)th TFT T4b can be turned on by the high voltage of the first odd control node 1Qo simultaneously with the (4-1)th TFT T4a to supply the first gate high potential voltage GVdd1 supplied through the (4-1)th TFT T4a, to the odd voltage hold node 1Qho.

The fifth and sixth TFTs T5 and T6 can be embodied to control the potential of each of the first odd control node 1Qo and the odd voltage hold node 1Qho through the third gate low potential voltage GVss3 in response to the (n+4)th carry signal CS[n+4]. The fifth and sixth TFTs T5 and T6 can be expressed as first odd discharge circuits.

The fifth TFT T5 can be embodied to control the potential of the odd voltage hold node 1Qho through the third gate low potential voltage GVss3 in response to the (n+4)th carry signal CS[n+4]. For example, the fifth TFT T5 can be turned on in accordance with the (n+4)th carry signal CS[n+4] of a high voltage to discharge or reset the potential of the odd voltage hold node 1Qho to the third gate low potential voltage GVss3.

The sixth TFT T6 can electrically connect the first odd control node 1Qo with the odd voltage hold node 1Qho in response to the (n+4)th carry signal CS[n+4]. For example, the sixth TFT T6 can be turned on in accordance with the (n+4)th carry signal CS[n+4] of a high voltage simultaneously with the fifth TFT T5 to supply the third gate low potential voltage GVss3 supplied through the fifth TFT T5 and the odd voltage hold node 1Qho, to the first odd control node 1Qo, thereby discharging or resetting the potential of the first odd control node 1Qo to the third gate low potential voltage GVss3.

The odd voltage hold node 1Qho between the fifth TFT T5 and the sixth TFT T6 can be supplied with the first gate high potential voltage GVdd1 through the fourth TFTs T4a and T4b. Therefore, the fourth TFTs T4a and T4b can completely turn off the sixth TFT T6 turned off by the (n+4)th carry signal CS[n+4] of a low voltage by increasing a voltage difference between the gate voltage of the sixth TFT T6 and the odd voltage hold node 1Qho. As a result, a voltage drop (or current leakage) of the first odd control node 1Qo through the sixth TFT T6 which is turned off can be prevented from occurring, whereby the voltage of the first odd control node 1Qo can stably be maintained.

The seventh and eighth TFTs T7 and T8 can be embodied to control the potential of each of the first odd control node 1Qo and the odd voltage hold node 1Qho through the third gate low potential voltage GVss3 in response to the voltage of the second odd control node 1Qbo. The seventh and eighth TFTs T7 and T8 can be expressed as second odd discharge circuits.

The seventh TFT T7 can be embodied to control the potential of the odd voltage hold node 1Qho through the third gate low potential voltage GVss3 in response to the voltage of the second odd control node 1Qbo. For example, the seventh TFT T7 can be turned on in accordance with the high voltage of the second odd control node 1Qbo to discharge or reset the potential of the odd voltage hold node 1Qho to the third gate low potential voltage GVss3.

The eighth TFT T8 can electrically connect the first odd control node 1Qo with the odd voltage hold node 1Qho in response to the voltage of the second odd control node 1Qbo. For example, the eighth TFT T8 can be turned on by the high voltage of the second odd control node 1Qbo simultaneously with the seventh TFT T7 to supply the third gate low potential voltage GVss3 supplied through the seventh TFT T7 and the odd voltage hold node 1Qho, to the first odd control node 1Qo, thereby discharging or resetting the potential of the first odd control node 1Qo to the third gate low potential voltage GVss3.

The odd voltage hold node 1Qho between the seventh TFT T7 and the eighth TFT T8 can be supplied with the first gate high potential voltage GVdd1 through the fourth TFTs T4a and T4b. Therefore, the fourth TFTs T4a and T4b can completely turn off the eighth TFT T8 turned off by the (n+4)th carry signal CS[n+4] of a low voltage by increasing a voltage difference between the gate voltage of the eighth TFT T8 and the odd voltage hold node 1Qho. As a result, a voltage drop (or current leakage) of the first odd control node 1Qo through the eighth TFT T8 which is turned off can be prevented from occurring, whereby the voltage of the first odd control node 1Qo can stably be maintained.

The ninth and tenth TFTs T9 and T10 can be embodied to control the potential of each of the first odd control node 1Qo and the odd voltage hold node 1Qho through the third gate low potential voltage GVss3 in response to the voltage of the third odd control node 1Qbe. The ninth and tenth TFTs T9 and T10 can be expressed as third odd discharge circuits.

The ninth TFT T9 can be embodied to control the potential of the odd voltage hold node 1Qho through the third gate low potential voltage GVss3 in response to the voltage of the third odd control node 1Qbe. For example, the ninth TFT T9 can be turned on in accordance with the high voltage of the third odd control node 1Qbe to discharge or reset the potential of the odd voltage hold node 1Qho to the third gate low potential voltage GVss3.

The tenth TFT T10 can electrically connect the first odd control node 1Qo with the odd voltage hold node 1Qho in response to the voltage of the third odd control node 1Qbe. For example, the tenth TFT T10 can be turned on by the high voltage of the third odd control node 1Qbe simultaneously with the ninth TFT T9 to supply the third gate low potential voltage GVss3 supplied through the ninth TFT T9 and the odd voltage hold node 1Qho, to the first odd control node 1Qo, thereby discharging or resetting the potential of the first odd control node 1Qo to the third gate low potential voltage GVss3.

The odd voltage hold node 1Qho between the ninth TFT T9 and the tenth TFT T10 can be supplied with the first gate high potential voltage GVdd1 through the fourth TFTs T4a and T4b. Therefore, the fourth TFTs T4a and T4b can completely turn off the tenth TFT T10 turned off by the (n+4)th carry signal CS[n+4] of a low voltage by increasing a voltage difference between the gate voltage of the tenth TFT T10 and the odd voltage hold node 1Qho. As a result, a voltage drop (or current leakage) of the first odd control node 1Qo through the tenth TFT T10 which is turned off can be prevented from occurring, whereby the voltage of the first odd control node 1Qo can stably be maintained.

The first inverter circuit IC1 according to one embodiment can include 11th to 15th TFTs T11a, T11b, T12, T13, T14 and T15.

The 11th TFTs T11a and T11b can supply the third gate high potential voltage GVddo to a second connection node Nc2 in response to the third gate high potential voltage GVddo. The 11th TFTs T11a and T11b according to one embodiment can include (11-1)th and (11-2)th TFTs T11a and T11b electrically connected with each other in series between the third gate high potential voltage line and the second connection node Nc2 to prevent the leakage current due to the off current from occurring.

The (11-1)th TFT T11a can be turned on by the third gate high potential voltage GVddo to supply the third gate high potential voltage GVddo to the (11-2)th TFT T11b. For example, the (11-1)th TFT T11a can be connected to the third gate high potential voltage line in the form of diode.

The (11-2)th TFT T11b can be turned on by the third gate high potential voltage GVddo simultaneously with the (11-1)th TFT T11a to supply the third gate high potential voltage GVddo supplied through the (11-1)th TFT T11a, to the second connection node Nc2.

The 12th TFT T12 can be turned on or turned off in accordance with a voltage of the second connection node Nc2, and can supply the third gate high potential voltage GVddo to the second odd control node 1Qbo when it is turned on.

The 13th TFT T13 can be turned on or turned off in accordance with the voltage of the first odd control node 1Qo, and can discharge or reset the potential of the second odd control node 1Qbo to the third gate low potential voltage GVss3 when it is turned on.

The 14th TFT T14 can be turned on or turned off in accordance with the voltage of the first odd control node 1Qo, and can discharge or reset the potential of the second connection node Nc2 to the second gate low potential voltage GVss2 when it is turned on.

The 15th TFT T15 can be turned on or turned off in accordance with the voltage of the first even control node 2Qe of the (n+1)th stage circuit ST[n+1], and can discharge or reset the potential of the second connection node Nc2 to the second gate low potential voltage GVss2 when it is turned on.

The first sensing control circuit SCC1 according to one embodiment can include 16th to 222nd TFTs T16 to T22, and a precharging capacitor Cpc.

The 16th to 18th TFTs T16 to T18 and the precharging capacitor Cpc can be embodied to control the odd memory node 1Qmo through the (n−2)th carry signal CS[n−2] in response to the line sensing preparation signal LSPS and the (n−2)th carry signal CS[n−2]. The 16th to 18th TFTs T16 to T18 and the precharging capacitor Cpc can be expressed as line sensing preparation circuits or line sensing precharging circuits for precharging the voltage of the odd memory node 1Qmo in the display mode. For example, the odd memory node 1Qmo can be expressed as a precharging node for the sensing mode.

The 16th TFT T16 can output the (n−2)th carry signal CS[n−2] to a third connection node Nc3 in response to the line sensing preparation signal LSPS. For example, in the image display mode, the 16th TFT T16 can be turned on in accordance with the line sensing selection pulse LSP1 transferred through the sensing preparation signal line, to output the (n−2)th carry signal CS[n−2] of a high voltage synchronized with the line sensing selection pulse LSP1 to the third connection node Nc3. In the image display mode, the 16th TFT T16 can be turned on in accordance with the line sensing release pulse LSP2 transferred through the sensing preparation signal line, to output the (n−2)th carry signal CS[n−2] of a low voltage to the third connection node Nc3.

The 17th TFT T17 can electrically connect the third connection node Nc3 with the odd memory node 1Qmo in response to the line sensing preparation signal LSPS. For example, the 17th TFT T17 can be turned on in accordance with the line sensing preparation signal LSP of a high voltage simultaneously with the 16th TFT T16 to supply the (n−2)th carry signal CS[n−2] supplied through the 17th TFT T17 and the third connection node Nc3, to the odd memory node 1Qmo. The third connection node Nc3 can be a connection line between the 16th TFT T16 and the 17th TFT T17.

The 18th TFT T18 can supply the first gate high potential voltage GVdd1 to the third connection node Nc3 in response to the voltage of the odd memory node 1Qmo. For example, the 18th TFT T18 can be turned on in accordance with the high voltage of the odd memory node 1Qmo to supply the first gate high potential voltage GVdd1 to the third connection node Nc3, thereby preventing a voltage leakage of the odd memory node 1Qmo from occurring. For example, the 18th TFT T18 can turn off the 16th TFT T16 turned off by the line sensing preparation signal LSPS of a low voltage by increasing a voltage difference between the gate voltage of the 16th TFT T16 and the third connection control node Nc3. As a result, a voltage drop (or current leakage) of the odd memory node 1Qmo through the 16th TFT T16 which is turned off can be prevented from occurring, whereby the voltage of the odd memory node 1Qmo can stably be maintained.

The precharging capacitor Cpc can be formed between the odd memory node 1Qmo and the first gate high potential voltage line to store a differential voltage between the voltage of the odd memory node 1Qmo and the first gate high potential voltage GVdd1. For example, a first electrode of the precharging capacitor Cpc can electrically be connected with the odd memory node 1Qmo connected to a gate electrode of the 18th TFT T18, and a second electrode of the precharging capacitor Cpc can electrically be connected with the fifth gate high potential voltage line. The precharging capacitor Cpc stores the high voltage of the (n−2)th carry signal CS[n−2] in accordance with turn-on of the 16th, 17th and 18th TFTs T16, T17 and T18, and maintains the voltage of the odd memory node 1Qmo for a certain time period by the voltage stored when the 16th, 17th and 18th TFTs T16, T17 and T18 are turned off. For example, the voltage of the odd memory node 1Qmo can be maintained until the 16th and 17th TFTs T16 and T17 are again turned on by the line sensing release pulse LSP2 of the line sensing preparation signal LSPS.

The 19th and 20th TFTs T19 and T20 can be embodied to control the potential of the first odd control node 1Qo through the first gate high potential voltage GVdd1 in response to the voltage of the odd memory node 1Qmo and the first reset signal RST1. The 19th and 20th TFTs T19 and T20 can be expressed as sensing line selection circuits.

The 19th TFT T19 can output the first gate high potential voltage GVdd1 to a sharing node Ns in response to the voltage of the odd memory node 1Qmo. For example, the 19th TFT T19 can be turned on in accordance with the high voltage of the odd memory node 1Qmo precharged with the first gate high potential voltage GVdd1 to supply the first gate high potential voltage GVdd1 to the sharing node Ns.

The 20th TFT T20 can electrically connect the 19th TFT T19 to the first odd control node 1Qo in response to the first reset signal RST1. For example, the 20th TFT T20 can be turned on in accordance with the first reset signal RST1 of the high voltage to supply the first gate high potential voltage GVdd1 supplied through the 19th TFT T19 and the sharing node Ns, to the first odd control node 1Qo, thereby charging the first gate high potential voltage GVdd1 in the first odd control node 1Qo to activate the first odd control node 1Qo.

The 21st and 22nd TFTs T21 and T22 can be embodied to discharge or reset the potential of the first odd control node 1Qo to the third gate low potential voltage GVss3 in response to the display panel on signal POS supplied when the light emitting display apparatus is powered on. The 21st and 22nd TFTs T21 and T22 can be expressed as first stage initialization circuits.

The 21st TFT T21 can supply the third gate low potential voltage GVss3 supplied through the third gate low potential voltage line to the odd voltage hold node 1Qho in response to the display panel on signal POS. For example, the 21st TFT T21 can be turned on in accordance with the display panel on signal POS of the high voltage to discharge or reset the potential of the odd voltage hold node 1Qo to the third gate low potential voltage GVss3.

The 22nd TFT T22 can electrically connect the first odd control node 1Qo with the odd voltage hold node 1Qho in response to the display panel on signal POS. For example, the 22nd TFT T22 can be turned on in accordance with the display panel on signal POS of the high voltage simultaneously with the 21st TFT T21 to supply the third gate low potential voltage GVss3 supplied through the 21st TFT T21 and the odd voltage hold node 1Qho, to the first odd control node 1Qo, thereby charging or resetting the potential of the first odd control node 1Qo to the third gate low potential voltage GVss3.

The odd voltage hold node 1Qho between the 21st TFT T21 and the 22nd TFT T22 can be supplied with the first gate high potential voltage GVdd1 through the fourth TFTs T4a and T4b of the first control circuit NCC1. Therefore, the fourth TFTs T4a and T4b can completely turn off the 22st TFT T22 turned off by the display panel on signal POS of the low voltage by increasing a voltage difference between a gate voltage of the 22st TFT T22 and the odd voltage hold node 1Qho. As a result, a voltage drop (or current leakage) of the first odd control node 1Qo through the 22st TFT T22 which is turned off can be prevented from occurring, whereby the voltage of the first odd control node 1Qo can stably be maintained.

Optionally, the first sensing control circuit SCC1 can be omitted. For example, since the first sensing control circuit SCC1 is a circuit used to sense driving characteristics of the subpixel in accordance with the sensing mode, if the subpixel is not driven in the sensing mode, the first sensing control circuit SCC1 is an unnecessary element and thus can be omitted.

The first node reset circuit NRC1 according to one embodiment can include 23rd to 28th TFTs T21 to T28.

The 23rd TFT T23 can be embodied to control the potential of the second odd control node 1Qbo through the third gate low potential voltage GVss3 in response to the (n−4)th carry signal CS[n−4]. The 23rd TFT T23 can be expressed as a (1-1)th reset circuit.

The 23rd TFT T23 can be turned on in accordance with the (n−4)th carry signal CS[n−4] of the high voltage in the display mode to discharge or reset the potential of the second odd control node 1Qbo to the third gate low potential voltage GVss3.

The 24th and 25th TFTs T24 and T25 can be embodied to control the potential of the second odd control node 1Qbo through the third gate low potential voltage GVss3 in response to the voltage of the odd memory node 1Qmo and the first reset signal RST1. The 24th and 35th TFTs T24 and T25 can be expressed as (1-2)th reset circuits.

The 24th TFT T24 can supply the third gate low potential voltage GVss3 to a fourth connection node Nc4 in response to the odd memory node 1Qmo. For example, the 24th TFT T24 can be turned on in accordance with the high voltage of the odd memory node 1Qmo to supply the third gate low potential voltage GVss3 to the fourth connection node Nc4.

The 25th TFT T25 can electrically connect the second odd control node 1Qbo to the fourth connection node Nc4 in response to the first reset signal RST1. For example, the 25th TFT T25 can be turned on in accordance with the first reset signal RST1 of the high voltage to supply the third gate low potential voltage GVss3 supplied through the 24th TFT T24 and the fourth connection node Nc4, to the second odd control node 1Qbo. The fourth connection node Nc4 can be a connection line between the 24th TFT T24 and the 25th TFT T25.

The 26th to 28th TFTs T26, T27 and T28 can be embodied to control the potential of the first odd control node 1Qo through the third gate low potential voltage GVss3 in response to the voltage of the odd voltage hold node 1Qho, the voltage of the odd memory node 1Qmo and the second reset signal RST2 at the sensing mode. The 26th to 28th TFTs T26, T27 and T28 can be expressed as fourth odd discharge circuits.

The 26th to 28th TFTs T26, T27 and T28 can electrically be connected with one another in series between the first odd control node 1Qo and the fourth connection node Nc4 and can electrically connect the first odd control node 1Qo with the fourth connection node Nc4 in response to the voltage of the odd voltage hold node 1Qho, the voltage of the odd memory node 1Qmo and the second reset signal RST2.

The 26th TFT T26 can electrically connect the first odd control node 1Qo with the fifth connection node Nc5 in response to the second reset signal RST2. For example, the 26th TFT T26 can be turned on in accordance with the second reset signal RST2 of the high voltage to electrically connect the first odd control node 1Qo with the fifth connection node Nc5.

The 27th TFT T27 can electrically connect the fifth connection node Nc5 with the odd voltage hold node 1Qho in response to the voltage of the odd memory node 1Qmo. For example, the 27th TFT T27 can be turned on in accordance with the high voltage of the odd memory node 1Qmo to electrically connect the fifth connection node Nc5 with the odd voltage hold node 1Qho.

The 28th TFT T28 can electrically connect the odd voltage hold node 1Qho with the fourth connection node Nc4 in response to the second reset signal RST2. For example, the 28th TFT T28 can be turned on in accordance with the second reset signal RST2 of the high voltage to electrically connect the odd voltage hold node 1Qho with the fourth connection node Nc4.

Meanwhile, the 26th to 28th TFTs T26, T27 and T28 can be omitted when the first sensing control circuit SCC1 is omitted.

Since the first output buffer circuit OBC1 is the first output buffer circuit OBC1 shown in FIG. 10, its repeated description will be omitted.

The (n+1)th stage circuit ST[n+1] according to one embodiment of the present disclosure can include a second sensing control circuit SCC2, a second node control circuit NCC2, a second inverter circuit IC2, a second node reset circuit NRC2, and a second output buffer circuit OBC2, which are selectively connected to the first to third even control nodes 2Qo, 2Qbo and 2Qbe, the even voltage hold node 2Qho, and the even memory node 2Qme. The (n+1)th stage circuit ST[n+1] can be embodied to be substantially the same as the nth stage circuit ST[n] except the second sensing control circuit SCC2.

The (n+1)th stage circuit ST[n+1] according to one embodiment is substantially the same as the nth stage circuit ST[n] except that the (n+1)th stage circuit ST[n+1] shares the line sensing preparation circuit, the second odd control node 1Qbo, the third odd control node 1Qbe and the odd memory node 1Qmo. Therefore, the same reference numerals will be given to the same elements of the (n+1)th stage circuit ST[n+1] as those of the nth stage circuit ST[n], and a repeated description of the same elements will be omitted or simplified.

The second node control circuit NCC2 according to one embodiment can include first to tenth TFTs T1 to T10. Since the second node control circuit NCC2 that includes the first to tenth TFTs T1 to T10 operates with the same elements in the same manner as the first node control circuit NCC1 of the nth stage circuit ST[n] except that it is connected with the first to third even control nodes 2Qo, 2Qbo and 2Qbe and the even control hold node 2Qho, its repeated description will be omitted or simplified.

The first to fourth TFTs T1 to T4 serve to control or setup the potential of the second even control node 2Qbo, and thus can be expressed as second node setup circuits.

The first TFT T1 and the second TFT T2 can be embodied to be electrically connected between the first gate high potential voltage line for transferring the first gate high potential voltage GVdd1 and the first odd control node 1Qo in series and charge the first gate high potential voltage GVdd1 in the first even control node 2Qe in response to the (n−2)th carry signal CS[n−2].

The third TFTs T3a and T3b can be turned on in accordance with the second gate high potential voltage GVdd2 to always supply the second gate high potential voltage GVdd2 to the first connection node N1 between the first TFT T1 and the second TFT T2, thereby preventing off current of the first TFT T1 and current leakage of the first even control node 2Qe from occurring.

The fourth TFTs T4a and T4b can be turned on in accordance with the high voltage of the first even control node 2Qe to supply the first gate high potential voltage GVdd1 to the fourth even control node 2Qhe.

The fifth and sixth TFTs T5 and T6 can be embodied to control the potential of each of the second even control node 2Qbo and the fourth even control node 2Qhe through the third gate low potential voltage GVss3 in response to the (n+4)th carry signal CS[n+4]. The fifth and sixth TFTs T5 and T6 can be expressed as first even discharge circuits.

The seventh and eighth TFTs T7 and T8 can be embodied to control the potential of each of the first even control node 2Qe and the fourth even control node 2Qhe through the third gate low potential voltage GVss3 in response to the voltage of the second even control node 2Qbo. The seventh and eighth TFTs T7 and T8 can be expressed as second even discharge circuits.

The ninth and tenth TFTs T9 and T10 can be embodied to control the potential of each of the first even control node 2Qe and the fourth even control node 2Qhe through the third gate low potential voltage GVss3 in response to the voltage of the third even control node 2Qbe. The ninth and tenth TFTs T9 and T10 can be expressed as third even discharge circuits.

The second inverter circuit IC2 according to one embodiment can include 11th to 15th TFTs T11 to T15. Since the second inverter circuit IC2 that includes the 11th to 15th TFTs T11 to T15 operates with the same elements in the same manner as the first inverter circuit IC1 of the nth stage circuit ST[n] except that it is connected with the first even control node 2Qo and the first odd control node 1Qo of the nth stage circuit, its repeated description will be omitted or simplified.

The 11th TFTs T11a and T11b can include (11-1)th and (11-2)th TFTs T11a and T11b electrically connected with each other in series between the fourth gate high potential voltage line and the second connection node Nc2 to prevent the leakage current due to the off current from occurring.

The 12th TFT T12 can be turned on or turned off in accordance with a voltage of the second connection node Nc2, and can supply the fourth gate high potential voltage GVdde to the second even control node 2Qbo when it is turned on.

The 13th TFT T13 can be turned on or turned off in accordance with the voltage of the first even control node 2Qe, and can discharge or reset the potential of the second even control node 2Qbo to the third gate low potential voltage GVss3 when it is turned on.

The 14th TFT T14 can be turned on or turned off in accordance with the voltage of the first even control node 1Qo, and can discharge or reset the potential of the second connection node Nc2 to the second gate low potential voltage GVss2 when it is turned on.

The 15th TFT T15 can be turned on or turned off in accordance with the voltage of the first even control node 2Qe of the (n+1)th stage circuit ST[n+1], and can discharge or reset the potential of the second connection node Nc2 to the second gate low potential voltage GVss2 when it is turned on.

The second sensing control circuit SCC2 according to one embodiment can include 20th to 22th TFTs T20, T21 and T22.

The 20th TFT T20 can be embodied to control the potential of the first even control node 2Qe through the first gate high potential voltage GVdd1 supplied from the first sensing control circuit SCC1 of the nth stage circuit ST[n] in response to the first reset signal RST1.

The 20th TFT T20 can be turned on in accordance with the first reset signal RST1 of the high voltage to supply the first gate high potential voltage GVdd1 supplied through the sharing node Ns of the nth stage circuit ST[n], to the first even control node 2Qe, thereby charging the first gate high potential voltage GVdd1 in the first even control node 2Qe to activate the first even control node 2Qe.

The 21st and 22nd TFTs T21 and T22 can be embodied to discharge or reset the potential of the first even control node 2Qe to the third gate low potential voltage GVss3 in response to the display panel on signal POS supplied when the light emitting display apparatus is powered on. The 21st and 22nd TFTs T21 and T22 can be expressed as second stage initialization circuits.

The 21st TFT T21 can be turned on in accordance with the display panel on signal POS of the high voltage to discharge or reset the potential of the fourth even control node 2Qhe to the third gate low potential voltage GVss3.

The 22nd TFT T22 can be turned on in accordance with the display panel on signal POS simultaneously with the 21st TFT T21 to supply the third gate low potential voltage GVss3 supplied through the 21st TFT T21 and the fourth even control node 2Qhe, to the first even control node 2Qe, thereby charging or resetting the potential of the first even control node 2Qe to the third gate low potential voltage GVss3.

Optionally, the second sensing control circuit SCC2 can be omitted when the nth stage circuit ST[n] is omitted.

The second node reset circuit NRC2 according to one embodiment can include 23rd to 28th TFTs T23 to T28. Since the second node reset circuit NRC2 that includes the 23rd to 28th TFTs T23 to T28 operates with the same elements in the same manner as the first node reset circuit NRC1 of the nth stage circuit ST[n] except that it is connected with the first even control node 2Qo and the second even control node 2Qbo, its repeated description will be omitted or simplified.

The 23rd TFT T23 can be embodied to control the potential of the second even control node 2Qbo through the third gate low potential voltage GVss3 in response to the (n–4)th carry signal CS[n–4]. The 23rd TFT T23 can be expressed as (2-1)th reset circuit.

The 24th and 25th TFTs T24 and T25 can be embodied to control the potential of the second even control node 2Qbo through the third gate low potential voltage GVss3 in response to the voltage of the even memory node 2Qme and the first reset signal RST1. The 24th and 25th TFTs T24 and T25 can be expressed as (2-2)th reset circuits.

The 26th to 28th TFTs T26, T27 and T28 can be embodied to control the potential of the first even control node 2Qe through the third gate low potential voltage GVss3 in response to the voltage of the fourth even control node 2Qhe, the voltage of the even memory node 2Qme and the second reset signal RST2. The 26th to 28th TFTs T26, T27 and T28 can be expressed as fourth even discharge circuits.

Meanwhile, the 24th to 28th TFTs T24 to T28 can be omitted when the second sensing control circuit SCC2 is omitted.

Since the second output buffer circuit OBC2 is the second output buffer circuit OBC2 shown in FIG. 10, its repeated description will be omitted or may be brief.

Figure 13:
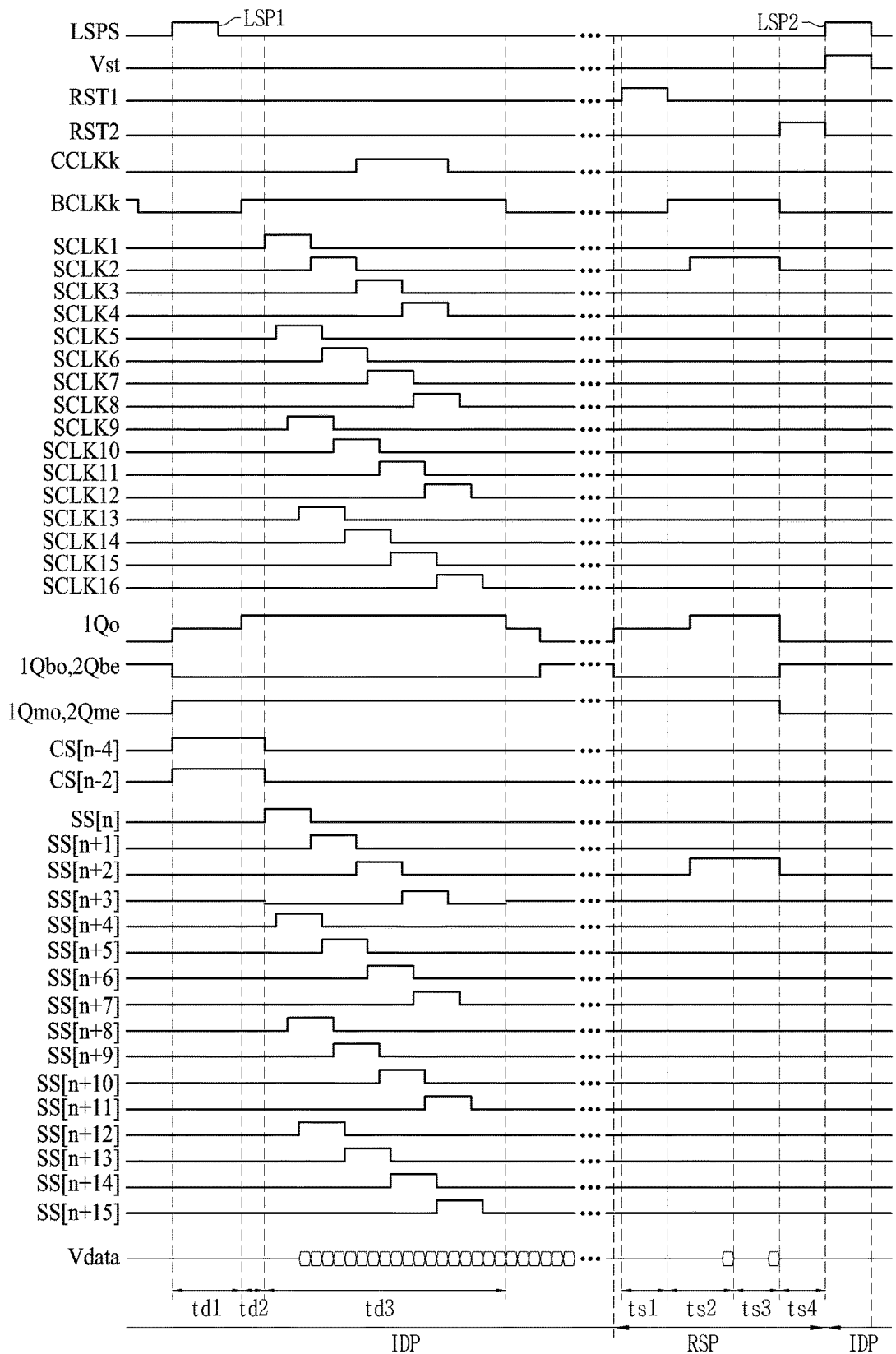
FIG. 13 is a view illustrating input and output waveforms of each of an nth stage circuit and an (n+1)th stage circuit shown in FIGS. 110 and 12.

FIG. 13 is a view illustrating input and output waveforms of each of an nth stage circuit and an (n+1)th stage circuit shown in FIGS. 10 and 12, and FIGS. 14A to 14G are views illustrating an operation process of each of an nth stage circuit and an (n+1)th stage circuit shown in FIG. 12. In FIGS. 14A to 14G, thick solid lines indicate nodes and turned-on TFTs, which have a potential of a high voltage or more, and thin solid lines indicate nodes and turned-off TFTs, which have a potential of a low voltage. In description of FIG. 13 and FIGS. 14A to 14G, operation description of TFTs embodied in the nth stage circuit and the (n+1)th stage circuit is substantially the same as the description in FIG. 12, its repeated description will be omitted or may be brief.

Figure 14A:
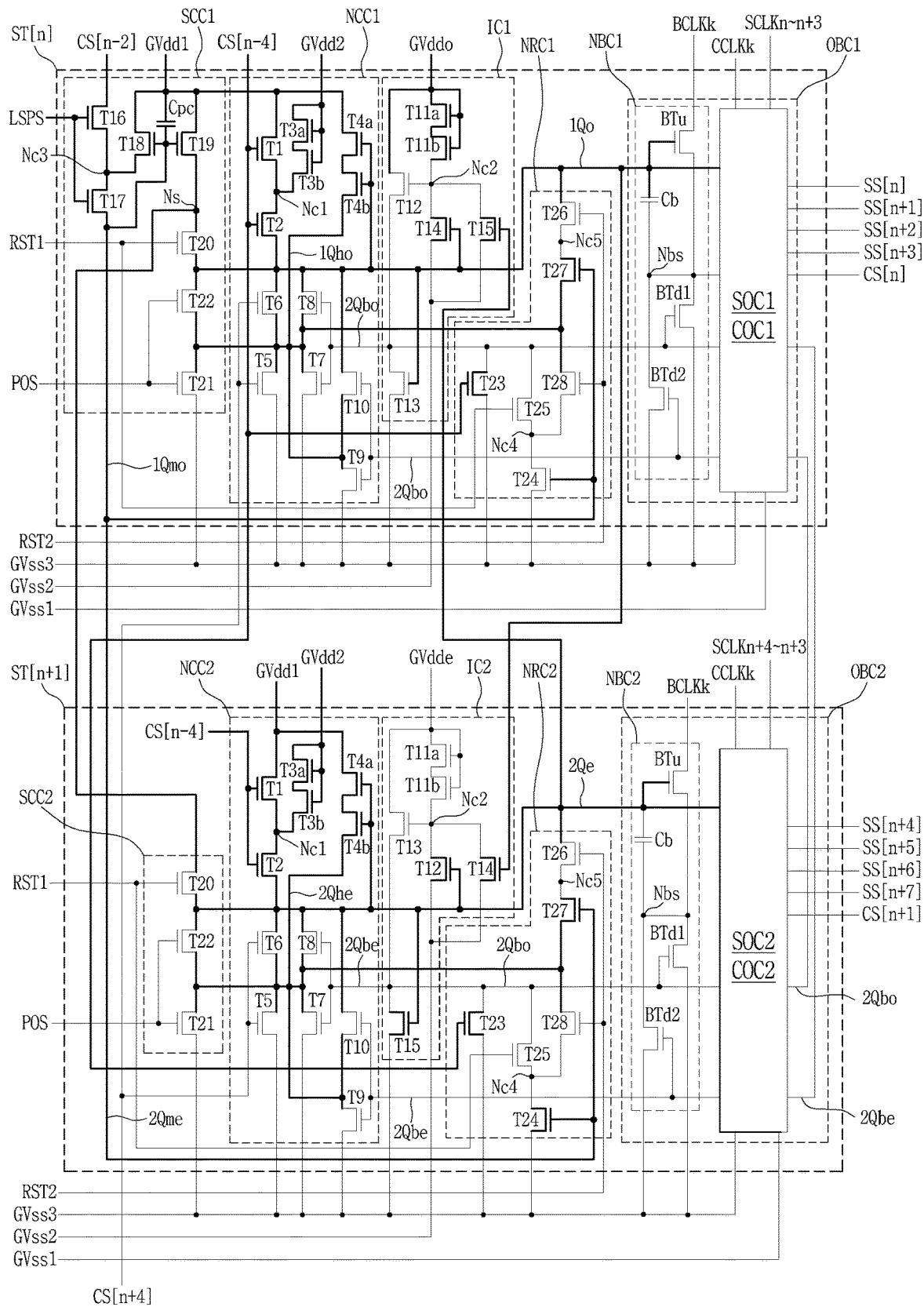
FIGS. 14A to 14G are views illustrating an operation process of each of an nth stage circuit and an (n+1)th stage circuit shown in FIG. 12.

Referring to FIGS. 10, 13 and 14A, for a first display period td1 of the image display period IDP of the display mode according to one embodiment of the present disclosure, each of the first odd control node 1Qo of the nth stage circuit ST[n] and the first even control node 2qe of the (n+1)th stage circuit ST[n+1] is charged with the first gate high potential voltage GVdd1 responding to the (n–4)th carry signal CS[n–4] of the high voltage.

According to one embodiment, the first odd control node 1Qo of the nth stage circuit ST[n] is charged with the first gate high potential voltage GVdd1 in accordance with the operation of the first node control circuit NCC1 responding to the (n–4)th carry signal CS[n–4] of the high voltage. The second odd control node 1Qbo of the nth stage circuit ST[n] is discharged with the third gate low potential voltage GVss3 in accordance with the operation of the first node reset circuit NRC1 responding to the (n–4)th carry signal CS[n–4] of the high voltage. At this time, the third even control node 2Qbe of the (n+1)th stage circuit ST[n+1] is connected with the second odd control node 1Qbo of the nth stage circuit ST[n] and thus discharged with the third gate low potential voltage GVss3.

The first even control node 2Qe of the (n+1)th stage circuit ST[n+1] is charged with the first gate high potential voltage GVdd1 in accordance with the operation of the second node control circuit NCC2 responding to the (n–4)th carry signal CS[n–4] of the high voltage. The second even control node 2Qbo of the (n+1)th stage circuit ST[n+1] is discharged with the third gate low potential voltage GVss3 in accordance with the operation of the second node reset circuit NRC2 responding to the (n–4)th carry signal CS[n–4] of the high voltage. At this time, the third odd control node 1Qbe of the nth stage circuit ST[n] is connected with the second even control node 2Qbo of the (n+1)th stage circuit ST[n+1] and thus discharged with the third gate low potential voltage GVss3.

At the first display period td1 of the image display period IDP, the first gate high potential voltage GVdd1 charged in the first odd control node 1Qo of the nth stage circuit ST[n] is supplied from the first gate high potential voltage line by passing through two TFTs T1 and T2, whereby voltage charging characteristic of the first odd control node 1Qo can be enhanced. Likewise, the first gate high potential voltage GVdd1 charged in the first even control node 2Qe of the (n+1)th stage circuit ST[n+1] is supplied from the first gate high potential voltage line by passing through two TFTs T1 and T2, whereby voltage charging characteristic of the first even control node 2Qe can be enhanced.

At the first display period td1 of the image display period IDP, as the kth boosting shift clock BCLKk is maintained at the second low voltage, bootstrapping is not generated in each of the first odd control node 1Qo and the first even control node 1Qe, whereby each of the pull-up TFTs BTu, ST11, ST12, ST13, ST14 and CTu of each of the first output buffer circuit OBC1 and the second output buffer circuit OBC2 is maintained at the turn-off state without being turned on.

At the first display period td1 of the image display period IDP, the line sensing selection pulse LSP1 of the line sensing preparation signal LSPS having a high voltage and the (n–2)th carry signal SC[n–2] of the high voltage can be input. In this case, the odd memory node 1Qmo of the nth stage circuit ST[n] is charged with the first gate high potential voltage GVdd1 in accordance with the operation of the first sensing control circuit SCC1 responding to the line sensing selection pulse LSP1 of the line sensing preparation signal LSPS having a high voltage and the (n–2)th carry signal SC[n–2] of the high voltage. The first even control node 2Qe of the (n+1)th stage circuit ST[n+1] is charged with the first gate high potential voltage GVdd1 in accordance with the operation of the second node control circuit NCC2 responding to the (n–2)th carry signal SC[n–2] of the high voltage. Therefore, the first gate high potential voltage GVdd1 is charged in the odd memory node 1Qmo of the nth stage circuit ST[n], whereby a sensing preparation operation can be completed for subpixels connected to the gate line connected to the nth stage circuit ST[n] or the (n+1)th stage circuit ST[n+1].

Figure 14B:
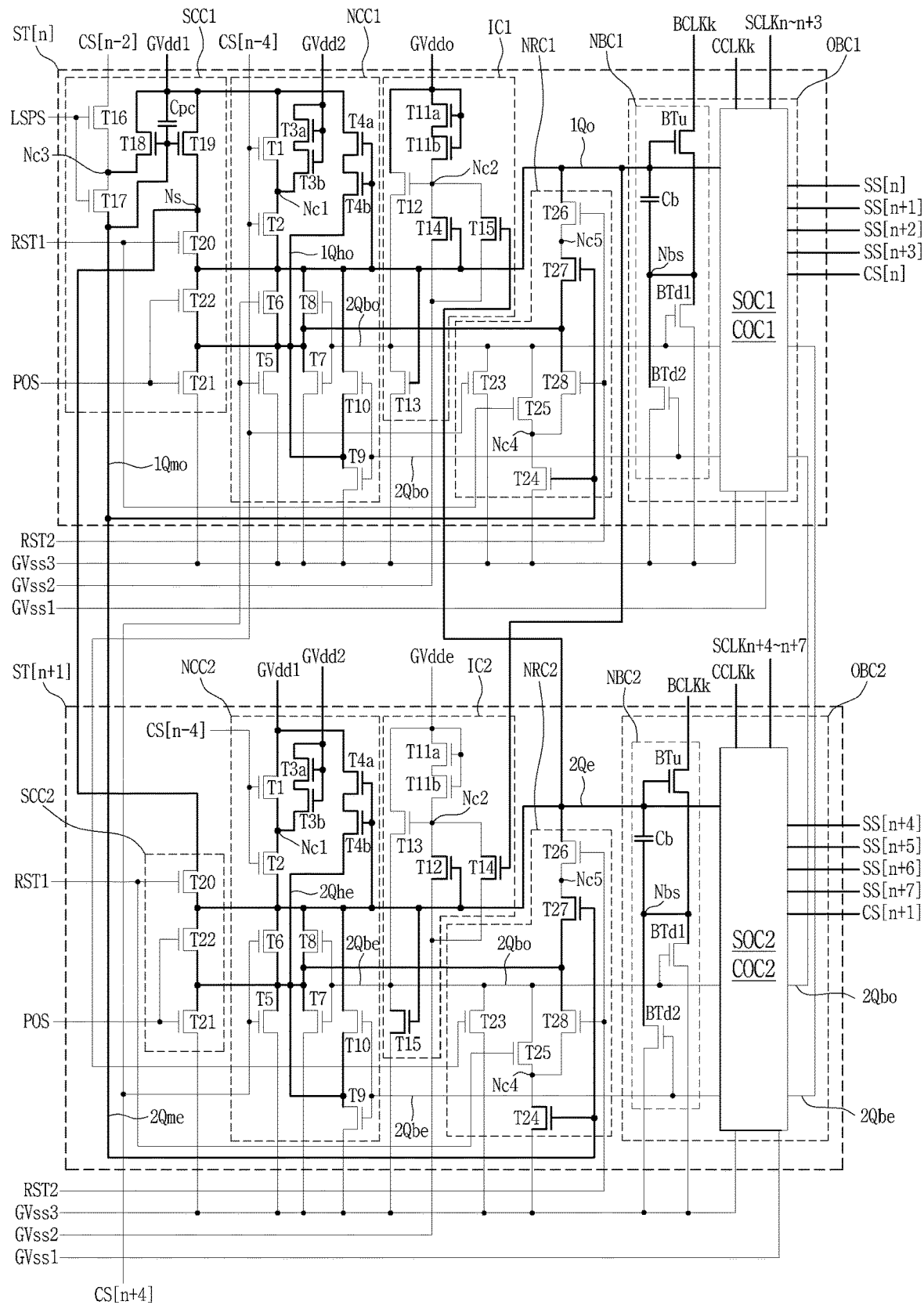

Referring to FIGS. 10, 13 and 14B, for a second display period td2 of the image display period IDP of the display mode according to one embodiment of the present disclosure, each of the second control nodes 1Qbo and 2Qbo, the third control nodes 1Qbe and 2Qbe, the voltage hold nodes 1Qho and 2Qhe and the memory nodes 1Qmo and 2Qme of each of the nth stage circuit ST[n] and the (n+1)th stage circuit ST[n+1] maintains a voltage stage at the first display period td1 as it is.

At the second display period td2 of the image display period IDP, as the kth boosting shift clock BCLKk is input as the second high voltage, bootstrapping is generated in each of the first odd control node 1Qo of the nth stage circuit ST[n] and the first even control node 2Qe of the (n+1)th stage circuit ST[n+1] by coupling between the second high voltage of the kth boosting shift clock BCLKk and the boosting capacitor Cb, and the boosting voltage of each of the first odd control node 1Qo and the first even control node 2Qe can be maintained for more than a time period when 16 scan signals SS[n] to SS[n+1] are output from the stage group STG that includes the nth stage circuit ST[n] and the (n−1)th stage circuit ST[n−1].

Each of the pull-up TFTs BTu, ST11, ST12, ST13, ST14 and CTu of each of the first output buffer circuit OBC1 and the second output buffer circuit OBC2 is completely turned on by the boosting voltage of the corresponding control nodes 1Qo and 2Qe. Therefore, the first high voltages of the nth to (n+7)th scan shift clocks SCLKn to SCLKn+7 input to the scan output circuits SOC1 and SOC2 of each of the nth stage circuit ST[n] and the (n+1)th stage circuit ST[n+1] can be output as the nth to (n+7)th scan signals SS[n] to SS[n+7] in due order, and the first high voltage of the kth carry shift clock CCLKk input to the carry output circuits COC1 and COC2 of each of the nth stage circuit ST[n] and the (n+1)th stage circuit ST[n+1] can be output as the nth carry signal CS[n] through the second output node No5. For example, the boosting maximum voltage of each of the first odd control node 1Qo and the first even control node 2Qe based on the kth boosting shift clock BCLKk can have a voltage level higher than the maximum voltage of scan shift clocks SCLKn to SCLKn+7 having the first high voltage or the maximum voltage of the kth carry shift clock CCLKk having the first high voltage. For this reason, each of the nth to (n+7)th scan signals SS[n] to SS[n+7] and the nth carry signal CS[n] can be output as the maximum voltage level without reduction of the voltage level.

According to one embodiment, the nth stage circuit ST[n] and the (n−1)th stage circuit ST[n−1], as shown in FIG. 8, can output a total of 8 scan signals SS[n], SS[n+4], SS[n+1], SS[n+5], SS[n+2], SS[n+6], SS[n+3] and SS[n+7] in a non-sequential manner in accordance with a given order. The (n+2)th stage circuit ST[n+2] and the (n+3)th stage circuit ST[n+3], which are grouped into the same stage group STG together with the nth stage circuit ST[n] and the (n−1)th stage circuit ST[n−1], as shown in FIG. 8, can output a total of 8 scan signals SS[n+8], SS[n+12], SS[n+9], SS[n+13], SS[n+10], SS[n+14], SS[n+11] and SS[n+15] in a non-sequential manner in accordance with a given order. In this case, the non-sequential manner can be understood that 16 scan signals sequentially shifted are alternately output to four stage circuits grouped into the stage group STG. For example, 16 scan signals can alternately be output to four stage circuits grouped into the stage group STG in the form of N.

At the second display period td2 of the image display period IDP, the data driving circuit portion, as shown in FIGS. 7A to 7D, can output first to fourth pixel data voltages Vdata[P1], Vdata[P2], Vdata[P3] and Vdata[P4] synchronized with 16 scan signals SS[n] to SS[n+15] output from the stage circuit STG that includes the nth stage circuit ST[n] and the (n−1)th stage circuit ST[n−1], to the corresponding data line by time division of the first to fourth pixel data voltages for 4-horizontal period. Therefore, an image data addressing period for the pixels disposed in the nth to (n+1)th horizontal lines can be performed.

Figure 14C:
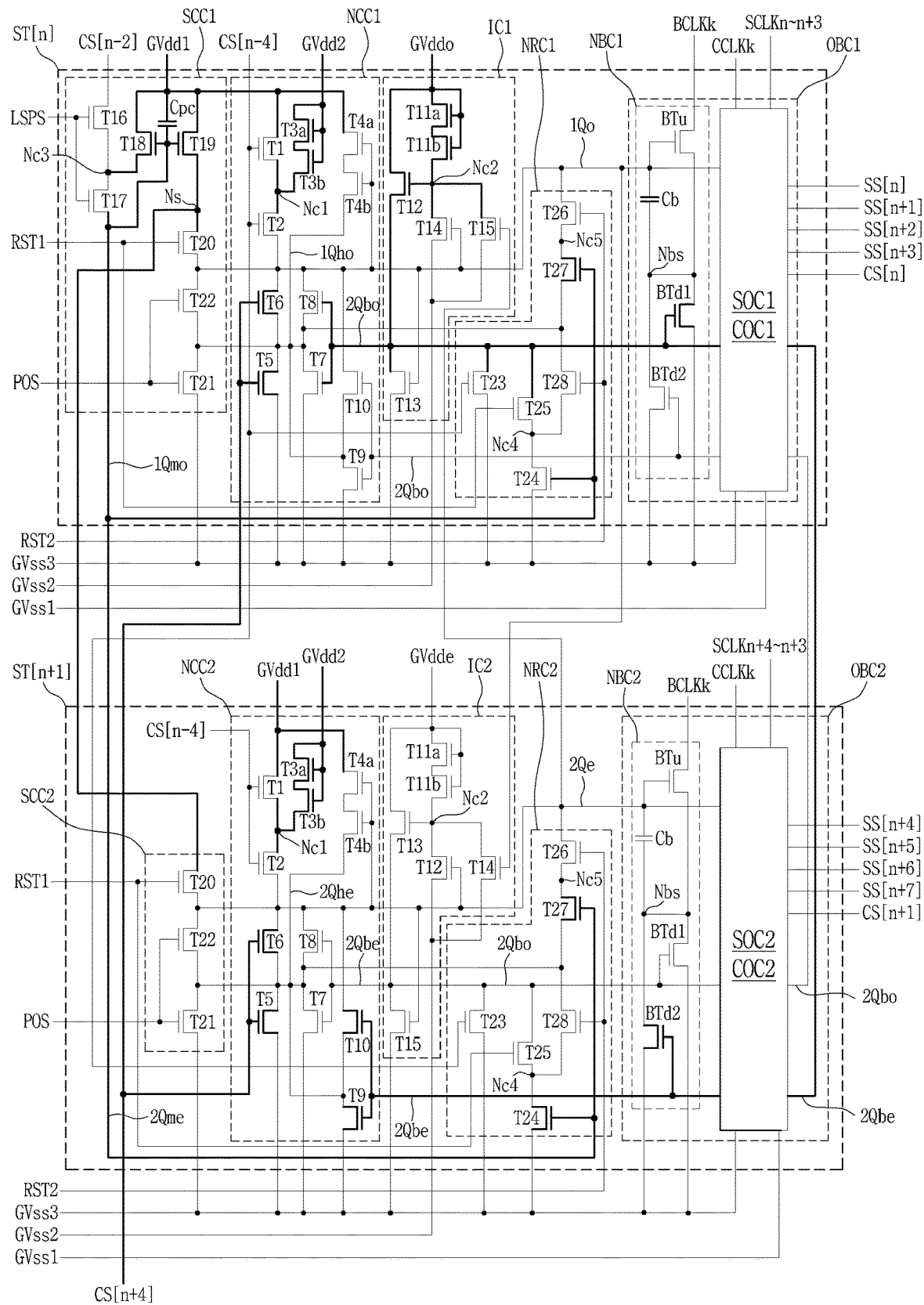

Referring to FIGS. 10, 13 and 14C, after a third display period td3 of the image display period IDP of the display mode according to one embodiment of the present disclosure, the odd memory node 1Qmo of the nth stage circuit ST[n] maintains the charging state as it is.

After the third display period td3 of the image display period IDP, each of the first odd control node 1Qo of the nth stage circuit ST[n] and the first even control node 2Qe of the (n+1)th stage circuit ST[n+1] is discharged with the third gate low potential voltage GVss3 in accordance with the operation of the node control circuits NCC1 and NCC2 responding to the (n+4)th carry signal CS[n+4] (or the (n+3)th carry signal CS[n+3]) of the high voltage.

The second odd control node 1Qbo of the nth stage circuit ST[n] is charged with the third gate high potential voltage GVddo in accordance with the operation of the first inverter circuit IC1 responding to discharge of the first odd control node 1Qo. Therefore, as each of the odd pull-down TFTs BTd1, ST21, ST22, ST23, ST24 and CTd1 is turned on by the charging voltage of the second odd control node 1Qbo, the first output buffer circuit OBC1 outputs the scan signals SS[n] to SS[n+3] of the low voltage corresponding to the first gate low potential voltage GVss1 through the first to fifth output nodes No1 to No5. The boosting source node Nbs of the first node boosting circuit NBC1 embodied in the first output buffer circuit OBC1 can be discharged with the third gate low potential voltage GVss3.

At the same time, the third even control node 2Qbe of the (n+1)th stage circuit ST[n+1] connected with the second odd control node 1Qbo of the nth stage circuit ST[n] is charged with the third gate high potential voltage GVddo. Therefore, as each of the odd pull-down TFTs BTd2, ST31, ST32, ST33, ST34 and CTd2 is turned on by the charging voltage of the third even control node 2Qbe, the second output buffer circuit OBC2 outputs the scan signals SS[n+4] to SS[n+7] of the low voltage corresponding to the first gate low potential voltage GVss1 through the first to fifth output nodes No1 to No5. The boosting source node Nbs of the second node boosting circuit NBC2 embodied in the second output buffer circuit OBC2 can be discharged with the third gate low potential voltage GVss3.

Optionally, after the third display period td3 of the image display period IDP of the display mode according to one embodiment of the present disclosure, each voltage of the first odd control node 1Qo of the nth stage circuit ST[n] and the first even control node 2Qe of the (n+1)th stage circuit ST[n+1] is reset and then, at the black display period of the black mode, the nth stage circuit ST[n] and the (n+1)th stage circuit ST[n+1] can operate in the same manner as the display periods td1, td2 and td3 of FIGS. 14A to 14C in accordance with the (n−4)th carry signal CS[n−4] of the high voltage to additionally output 16 scan signals SS[n] to SS[n+15] for displaying a black image.

Figure 14D:
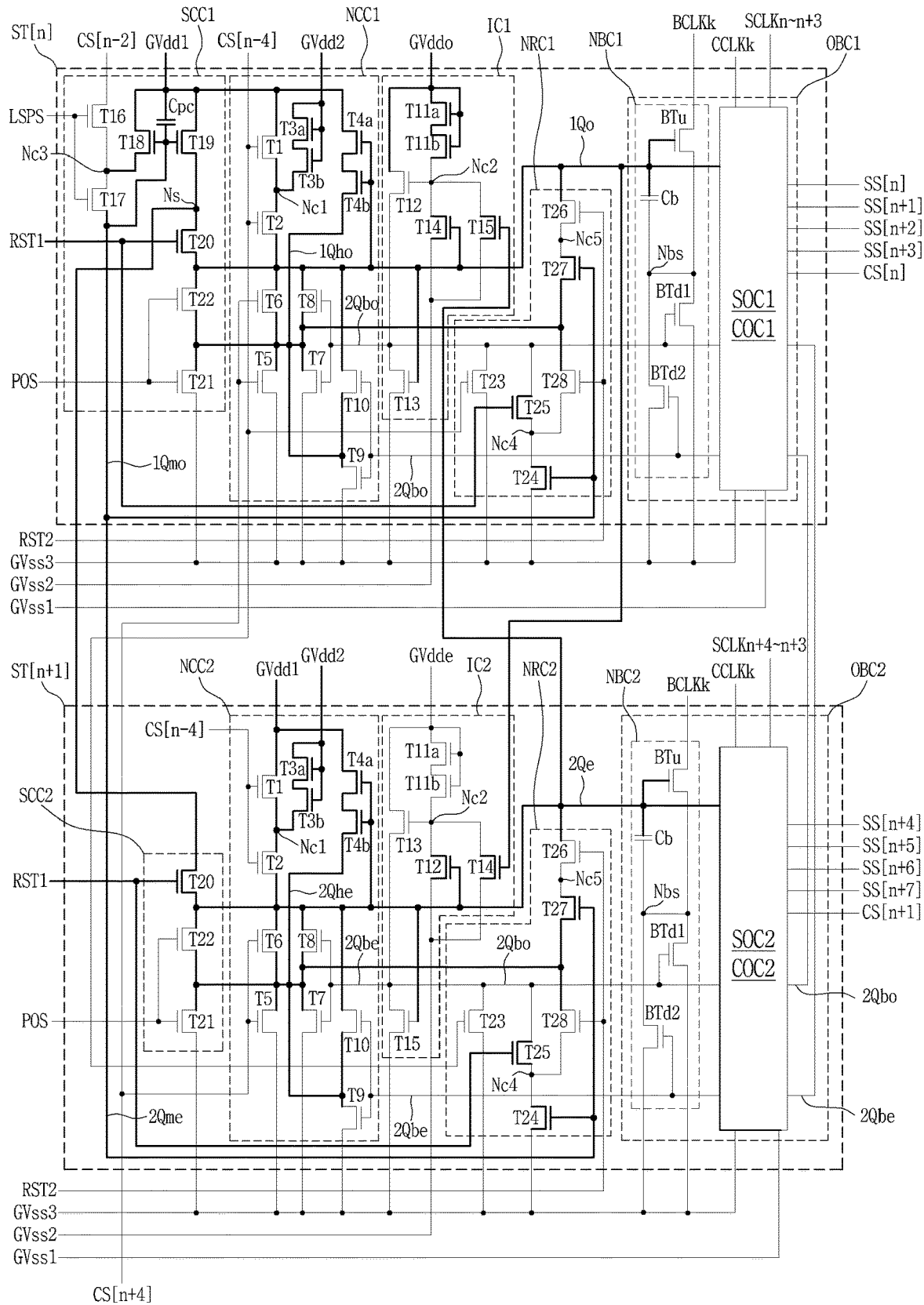

Referring to FIGS. 10, 13 and 14D, at the first sensing period ts1 of the sensing period RSTP of the sensing mode according to one embodiment of the present disclosure, the first odd control node 1Qo of the nth stage circuit ST[n] is charged with the first gate high potential voltage GVdd1 in accordance with the operation of the first sensing control circuit SCC1 responding to the first reset signal RST1 of the high voltage. The second odd control node 1Qbo of the nth stage circuit ST[n] is discharged with the third gate low potential voltage GVss3 in accordance with the operation of the first inverter circuit IC responding to the charging voltage of the first odd control node 1Qo.

For the first sensing period ts1 of the sensing period RSP, the first even control node 2Qe of the (n+1)th stage circuit ST[n+1] is charged with the first gate high potential voltage GVdd1 supplied through the sharing node Ns of the nth stage circuit ST[n] in accordance with the operation of the second sensing control circuit SCC2 responding to the first reset signal RST1 of the high voltage. The second even control node 2Qbo of the (n+1)th stage circuit ST[n+1] is discharged with the third gate low potential voltage GVss3 in accordance with the operation of the second inverter circuit IC2 responding to the charging voltage of the first even control node 2Qe.

At the first sensing period ts1 of the sensing period RSP, as the kth boosting shift clock BCLKk is maintained at the second low voltage, bootstrapping is not generated in each of the first odd control node 1Qo and the first even control node 1Qe, whereby each of the pull-up TFTs BTu, ST11, ST12, ST13, ST14 and CTu of each of the first output buffer circuit OBC1 and the second output buffer circuit OBC2 is maintained at the turn-off state without being turned on.

Figure 14E:
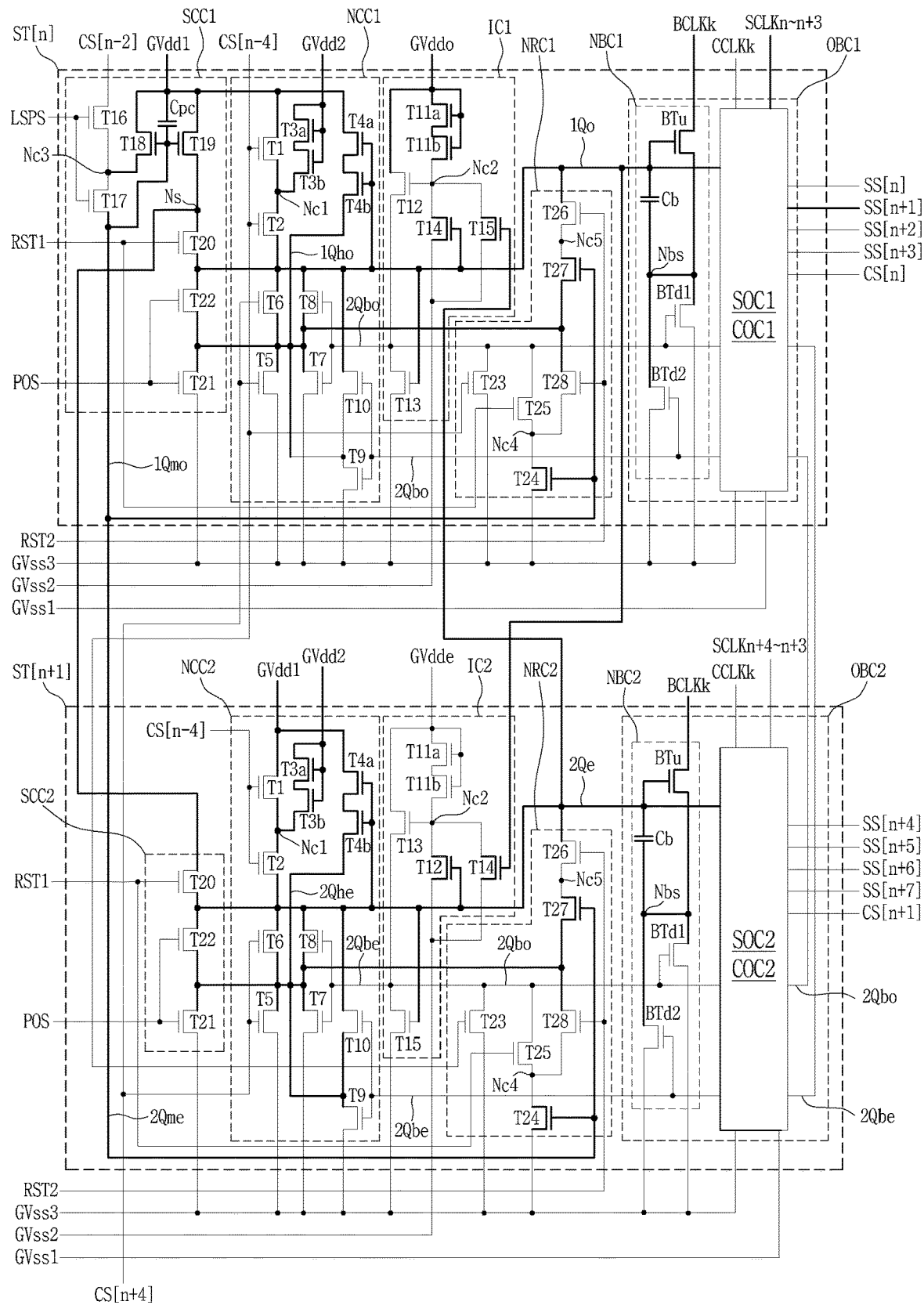

Referring to FIGS. 10, 13 and 14E, for the second sensing period ts2 of the sensing period RSP of the sensing mode according to one embodiment of the present disclosure, each of the second control nodes 1Qbo and 1Qbo, the third control nodes 1Qbe and 2Qbe, the voltage hold nodes 1Qho and 2Qhe and the memory nodes 1Qmo and 2Qme of each of the nth stage circuit ST[n] and the (n+1)th stage circuit ST[n+1] maintains the voltage state at the first sensing period ts1 as it is.

At the second sensing period ts2 of the sensing period RSP, as the kth boosting shift clock BCLKk is input as the second high voltage, bootstrapping is generated in each of the first odd control node 1Qo of the nth stage circuit ST[n] and the first even control node 2Qe of the (n+1)th stage circuit ST[n+1] by coupling between the second high voltage of the kth boosting shift clock BCLKk and the boosting capacitor Cb.

Each of the pull-up TFTs BTu, ST11, ST12, ST13, ST14 and CTu of each of the first output buffer circuit OBC1 and the second output buffer circuit OBC2 is completely turned on by the boosting voltage of the corresponding control nodes 1Qo and 2Qe.

In a state that each of the pull-up TFTs BTu, ST11, ST12, ST13, ST14 and CTu of each of the first output buffer circuit OBC1 and the second output buffer circuit OBC2 is completely turned on, the (n+2)th scan shift clock SCLKn+2 of the nth to (n+3)th scan shift clocks SCLKn to SCLKn+3 supplied to the nth stage circuit ST[n] is only input as the first high voltage. Therefore, the nth stage circuit ST[n] outputs the (n+2)th scan signal SC[n+2] having a third scan pulse SCP3 of a first high voltage through the third output node No3. Therefore, a sensing data addressing period for the pixels disposed in the (n+2)th horizontal line can be performed for the second sensing period ts2 of the sensing period RSP.

After the sensing period ts2 of the sensing period RSP, the (n+2)th scan signal SC[n+2] can maintain the first high voltage for the third sensing period ts3, whereby a sampling period for sensing driving characteristics of the subpixels disposed in the (n+2)th horizontal line can be performed.

At the third sensing period ts3 of the sensing period RSP, the (n+2)th scan signal SC[n+2] can maintain the first high voltage as it is, whereby a data restoring period for restoring a light emission state of the pixels disposed in the (n+2)th horizontal line to a previous state of the sensing period RSP can be performed.

Figure 14F:
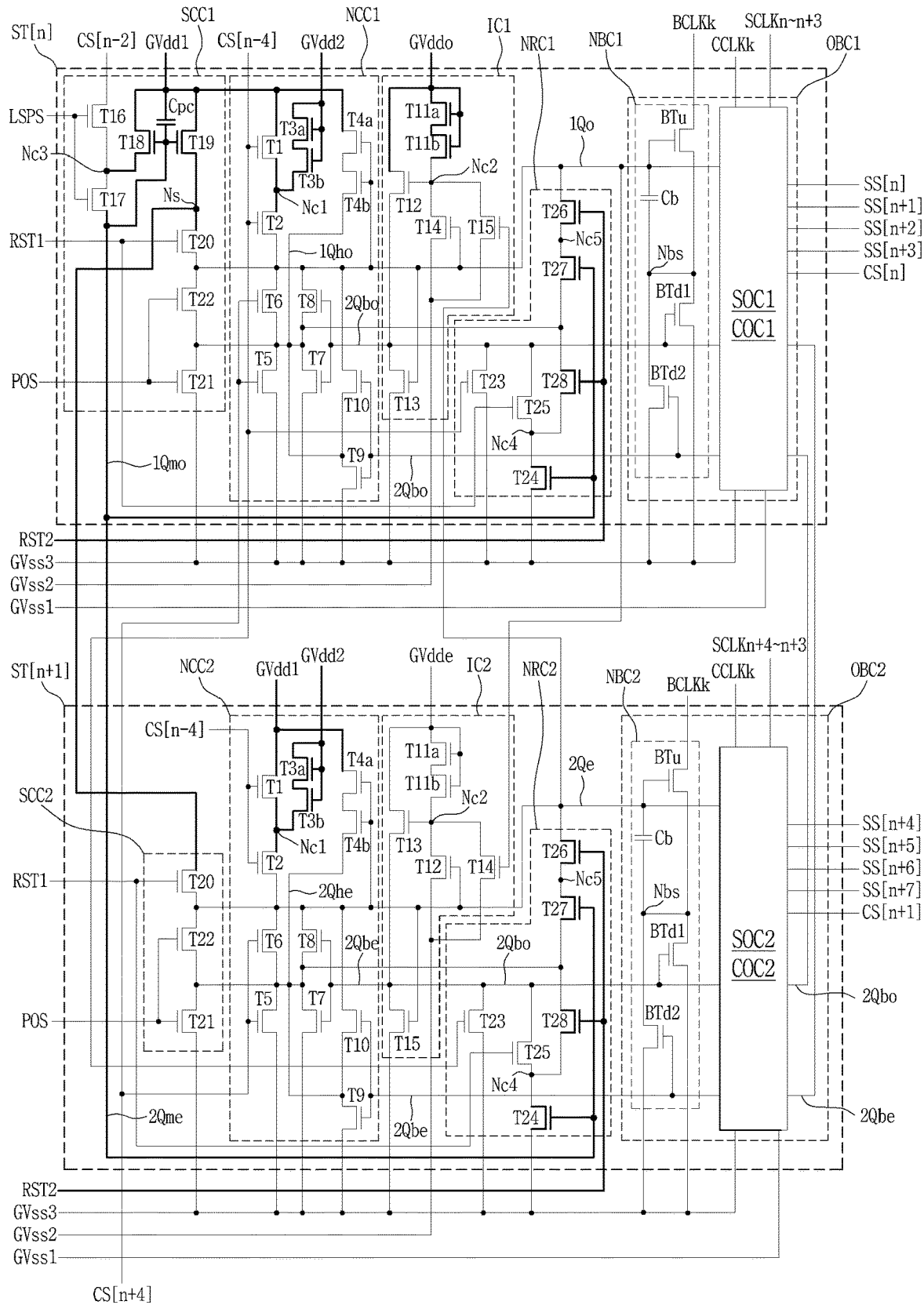

Referring to FIGS. 10, 13 and 14F, for the fourth sensing period ts4 of the sensing period RSP according to one embodiment of the present disclosure, the first odd control node 1Qo of the nth stage circuit ST[n] is discharged with the third gate low potential voltage GVss3 in accordance with the operation of the first node reset circuit NRC1 responding to the second reset signal RST2 of the high voltage and the charging voltage of the odd memory node 1Qmo. Therefore, the sensing mode for the subpixels disposed in the nth horizontal line can be released.

For the fourth sensing period ts4 of the sensing period RSP, the second odd control node 1Qbo of the nth stage circuit ST[n] is charged with the third gate low potential voltage GVss3 in accordance with the operation of the first inverter circuit IC responding to the discharge voltage of the first odd control node 1Qo. Therefore, as each of the odd full-down TFTs BTd1, ST21, ST22, ST23, ST24 and CTd1 is turned on by the charging voltage of the second odd control node 1Qbo, the first output buffer circuit OBC1 outputs the scan signals SS[n] to SS[n+3] of the low voltage corresponding to the first gate low potential voltage GVss1 through the first to fifth output nodes No1 to No5. The boosting source node Nbs of the first node boosting circuit NBC1 embodied in the first output buffer circuit OBC1 can be discharged with the third gate low potential voltage GVss3.

For the fifth sensing period ts5 of the sensing period RSP, the first even control node 2Qe of the (n+1)th stage circuit ST[n+1] is discharged with the third gate low potential voltage GVss3 in accordance with the operation of the second node reset circuit NRC2 responding to the second reset signal RST2 of the high voltage and the charging voltage of the odd memory node 1Qmo. The third even control node 2Qbe of the (n+1)th stage circuit ST[n+1] is connected with the second odd control node 2Qbo of the nth stage circuit ST[n] and thus charged with the third gate high potential voltage GVddo. Therefore, as each of the odd full-down TFTs BTd2, ST31, ST32, ST33, ST34 and CTd2 is turned on by the charging voltage of the third even control node 2Qbe, the second output buffer circuit OBC2 outputs the scan signals SS[n+4] to SS[n+7] of the low voltage corresponding to the first gate low potential voltage GVss1 through the first to fifth output nodes No1 to No5. The boosting source node Nbs of the second node boosting circuit NBC2 embodied in the second output buffer circuit OBC2 can be discharged with the third gate low potential voltage GVss3.

Figure 14G:
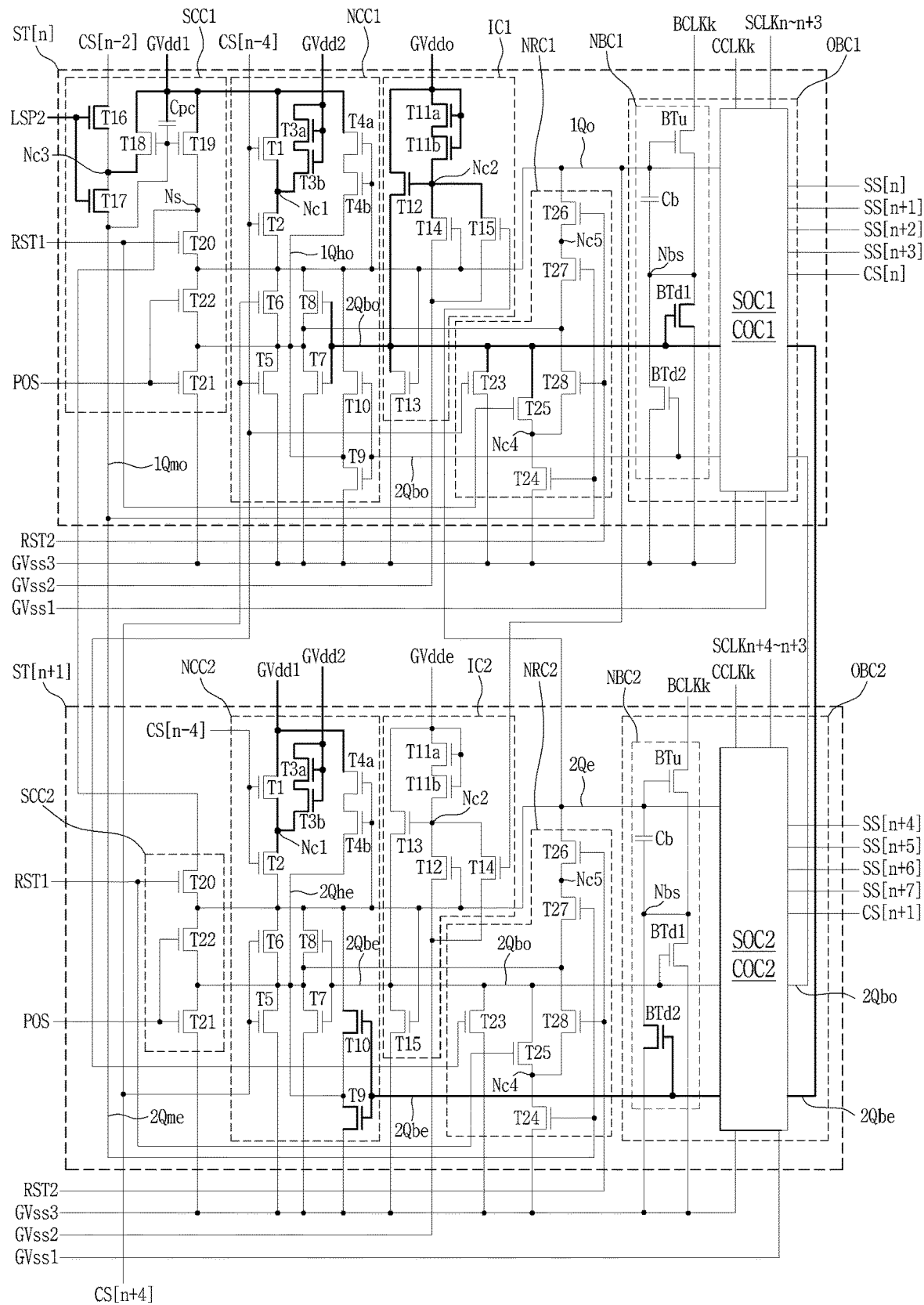

Referring to FIGS. 10, 13 and 14G, at the start timing of the display mode after the sensing mode according to one embodiment of the present disclosure, the odd memory node 1Qmo of the nth stage circuit ST[n] is charged or discharged with the low voltage of the (n−2)th carry signal CS[n−2] in accordance with the operation of the first sensing control circuit SCC1 responding to the line sensing release pulse LSP2 having a high voltage of the line sensing preparation signal LSPS. The second odd control node 1Qbo of the nth stage circuit ST[n] maintains the charged state with the third gate high potential voltage GVddo. Therefore, as each of the odd pull-down TFTs BTd1, ST21, ST22, ST23, ST24 and CTd1 is turned on by the charging voltage of the second odd control node 1Qbo, the first output buffer circuit OBC1 outputs the scan signals SS[n] to SS[n+3] of the low voltage corresponding to the first gate low potential voltage GVss1 through the first to fifth output nodes No1 to No5. The boosting source node Nbs of the first node boosting circuit NBC1 embodied in the first output buffer circuit OBC1 can be discharged with the third gate low potential voltage GVss3.

At the same time, the third even control node 2Qbe of the (n+1)th stage circuit ST[n+1] connected with the second odd control node 1Qbo of the nth stage circuit ST[n] is charged with the third gate high potential voltage GVddo. Therefore, as each of the odd pull-down TFTs BTd2, ST31, ST32, ST33, ST34 and CTd2 is turned on by the charging voltage of the third even control node 2Qbe, the second output buffer circuit OBC2 outputs the scan signals SS[n+4] to SS[n+7] of the low voltage corresponding to the first gate low potential voltage GVss1 through the first to fifth output nodes No1 to No5. The boosting source node Nbs of the second node boosting circuit NBC2 embodied in the second output buffer circuit OBC2 can be discharged with the third gate low potential voltage GVss3.

Figure 15A:
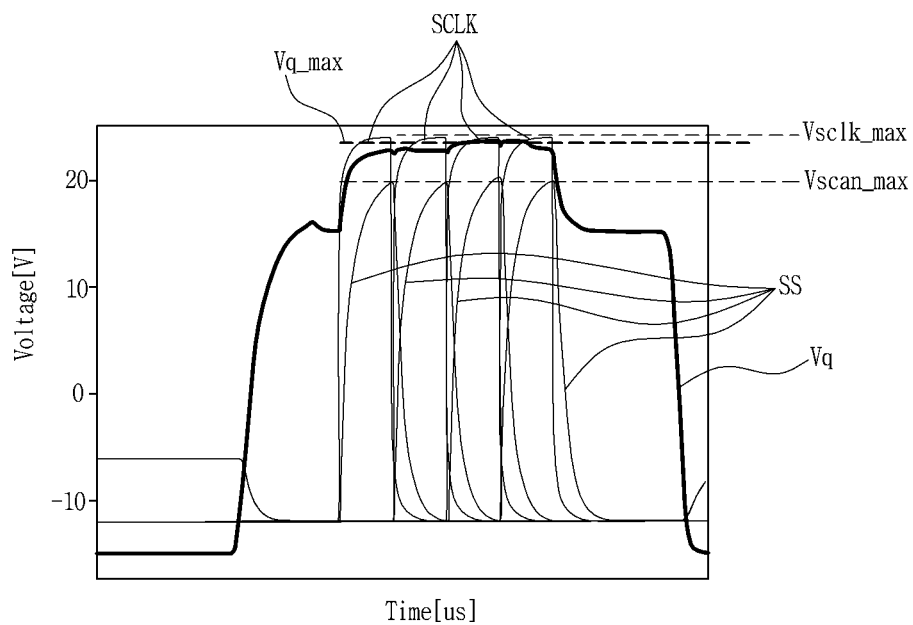
FIGS. 15A and 15B are views illustrating that output waveforms of a first control node and a scan signal according to one embodiment of the present disclosure are compared with those according to a comparison example.
Figure 15B:
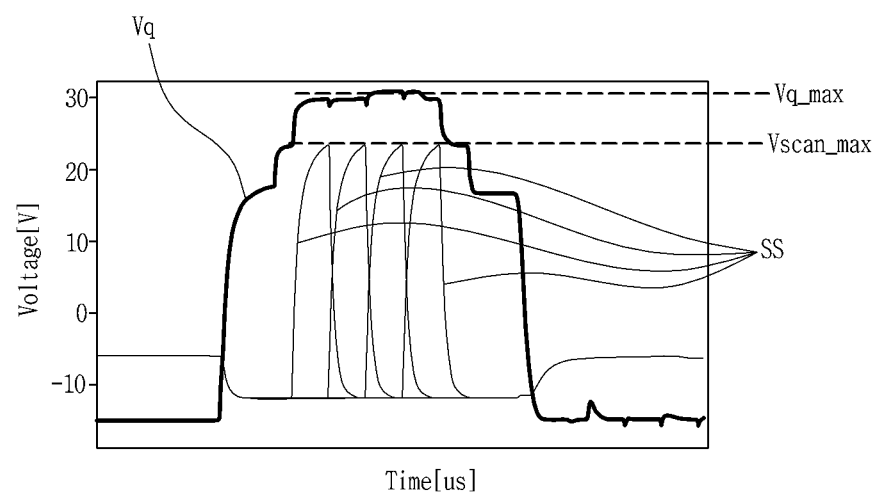

FIGS. 15A and 15B are views illustrating that output waveforms of a first control node and a scan signal according to one embodiment of the present disclosure are compared with those according to a comparison example.

Referring to FIG. 15A, in the comparison example, a scan shift clock SCLK for generating bootstrapping in the first control node is used. Therefore, it is noted from the comparison example that the scan signal SS having a voltage level Vcl_max lower than a maximum voltage level Vsclk_max of the scan shift clock SCLK is output. Particularly, it is noted that a maximum boosting voltage Vq_max of the control node according to the comparison example has a voltage level lower than the maximum voltage level Vsclk_max of the scan shift clock SCLK and thus the maximum voltage level Vscan of each of the plurality of scan signals SS is reduced.

Referring to FIG. 15B, in one embodiment of the present disclosure, a separate boosting shift clock for generating bootstrapping in the first control node is used. Therefore, in one embodiment of the present disclosure, since the boosting shift clock has a voltage level higher than that of the scan shift clock without being affected by transition of the scan shift clock, the maximum boosting voltage Vq_max of the control node has a voltage level higher than the maximum voltage level Vsclk_max of the scan shift clock SCLK, whereby it is noted that each of the plurality of scan signals SS has the maximum voltage level Vscan_max.

Therefore, in one embodiment of the present disclosure, when one stage circuit sequentially outputs a plurality of scan signals, the maximum voltage level of each of the plurality of scan signals can be prevented from being deteriorated or reduced.

A gate driving circuit and a display apparatus comprising the same according to one or more embodiments of the present disclosure will be described below.

A gate driving circuit according to one embodiment of the present disclosure can comprise first to mth stage circuits, wherein each of the first to mth stage circuits can include a logic circuit portion controlling a voltage of each of a first control node and a second control node, a node boosting circuit boosting the voltage of each of the control nodes in accordance with boosting shift clocks, a scan output circuit outputting each of first to ith scan shift clocks as first to ith scan signals (i is a natural number of 3 or more) in response to the boosting voltage of the first control node, and a carry output circuit outputting carry shift clocks as carry signals in response to the boosting voltage of the first control node.

According to one embodiment of the present disclosure, a boosting maximum voltage of the control node based on the boosting shift clocks can be higher than a maximum voltage of the scan shift clocks or a maximum voltage of the carry shift clocks.

According to one embodiment of the present disclosure, a voltage swing width of the boosting shift clocks can be greater than that of the carry shift clocks.

According to one embodiment of the present disclosure, each of the first to ith scan shift clocks can have a first high voltage of a first period and a first low voltage of a second period, the boosting shift clock can have a second high voltage of a third period different from the first period and a second low voltage of a fourth period different from the second period, and the third period of the boosting shift clock can be overlapped with the first period of each of the first to ith scan shift clocks.

According to one embodiment of the present disclosure, a high voltage of the boosting shift clock can be higher than that of the scan shift clock.

According to one embodiment of the present disclosure, the carry shift clock can be swung between the first high voltage and the first low voltage, the boosting shift clock can be swung between the second high voltage and the second low voltage, and the second high voltage of the boosting shift clock can be higher than the first high voltage of the carry shift clock.

According to one embodiment of the present disclosure, the node boosting circuit can include a boosting pull-up thin film transistor receiving the boosting shift clock, switched in accordance with the voltage of the first control node, a boosting pull-down thin film transistor connected to a source electrode of the boosting pull-up thin film transistor and switched in accordance with the voltage of the second control node, and a capacitor embodied between a gate electrode and the source electrode of the boosting pull-up thin film transistor.

According to one embodiment of the present disclosure, the scan output circuit can include first to ith scan pull-up thin film transistors switched in accordance with the voltage of the first control node, outputting each of the first to ith scan shift clocks as each of the first to ith scan signals through each of first to ith scan output nodes, and first to ith scan pull-down thin film transistors switched in accordance with the voltage of the second control node, individually outputting a gate low potential voltage through each of the first to ith scan output nodes.

According to one embodiment of the present disclosure, the carry output circuit can include a carry pull-up thin film transistor switched in accordance with the voltage of the first control node, outputting the carry shift clock as the carry signal through a carry output node, and a carry pull-down thin film transistor switched in accordance with the voltage of the second control node, outputting a gate low potential voltage through the carry output node.

According to one embodiment of the present disclosure, each of the first to mth stage circuits can further include a third control node and a memory node, and the logic circuit portion can include a node control circuit controlling a voltage of each of the first to third control nodes based on the first front carry signal, an inverter circuit controlling the voltage of the second control node in accordance with the voltage of the first control node, a sensing control circuit controlling the voltage of the memory node based on a line sensing preparation signal, a second front carry signal and a first reset signal, and a node reset circuit resetting the voltage of the second control node to a gate low potential voltage based on the first front carry signal, the voltage of the memory node and the first reset signal.

According to one embodiment of the present disclosure, the second control node embodied in an nth stage circuit of the first to mth stage circuits can be electrically connected with the third control node embodied in an (n+1)th stage circuit, and the third control node embodied in the nth stage circuit can be electrically connected with the second control node embodied in the (n+1)th stage circuit.

According to one embodiment of the present disclosure, an inverter circuit of the nth stage circuit can additionally control the voltage of the second control node of the nth stage circuit in accordance with the voltage of the first control node of the (n+1)th stage circuit, and an inverter circuit of the (n+1)th stage circuit can additionally control the voltage of the second control node of the (n+1)th stage circuit in accordance with the voltage of the first control node of the nth stage circuit.

According to one embodiment of the present disclosure, the node reset circuit of the nth stage circuit can discharge the voltage of the first control node of the nth stage circuit with the gate low potential voltage in response to the first reset signal and the voltage of the memory node, and discharge the voltage of the first control node of the nth stage circuit with the gate low potential voltage in response to a second reset signal and the voltage of the memory node.

According to one embodiment of the present disclosure, the sensing control circuit of the nth stage circuit can control the voltage of the memory node through a voltage of the second front carry signal in response to the line sensing preparation signal and the second front carry signal, output a first gate high potential voltage to a sharing node in accordance with the voltage of the memory node, and the sensing control circuit of the (n+1)th stage circuit can be electrically connected with the memory node of the nth stage circuit and switched in accordance with the first reset signal to supply the first gate high potential voltage supplied through the sharing node of the nth stage circuit, to the first control node of the (n+1)th stage circuit.

According to one embodiment of the present disclosure, each of the first to mth stage circuits can sequentially output the scan signal and the carry signal at a vertical active period of each frame period, and any one of the first to mth stage circuits can output the scan signal at a vertical blank period of each frame period.

A display apparatus according to one embodiment of the present disclosure can comprise a display panel including a plurality of data lines, a plurality of gate lines crossing the plurality of data lines, and a plurality of subpixels connected to their adjacent data and gate lines, a gate driving circuit portion including first to mth stage circuits outputting scan signals corresponding to a given order of a unit of i number of gate lines of the plurality of gate lines, a data driving circuit portion connected to each of the plurality of data lines, and a timing controller controlling a driving timing of each of the gate driving circuit portion and the data driving circuit portion, wherein each of the first to mth stage circuits can include a logic circuit portion controlling a voltage of each of a first control node and a second control node, a node boosting circuit boosting the voltage of each of the control nodes in accordance with boosting shift clocks, a scan output circuit outputting each of first to ith scan shift clocks as first to ith scan signals (i is a natural number of 3 or more) in response to the boosting voltage of the first control node, and a carry output circuit outputting carry shift clocks as carry signals in response to the boosting voltage of the first control node.

A display apparatus according to one embodiment of the present disclosure can comprise a display panel including a plurality of data lines, first to mth gate line groups having first to ith gate lines and a plurality of unit pixels having first to ith subpixels connected to their respective gate lines within the first to mth gate line groups and commonly connected to one data line, a gate driving circuit portion including first to mth stage circuits connected to the first to mth gate line groups, a data driving circuit portion sequentially supplying data voltages respectively corresponding to the first to ith subpixels, to each of the plurality of data lines, and a timing controller supplying subpixel data suitable for a driving order of the first to ith subpixels to the data driving circuit portion and controlling a driving timing of each of the gate driving circuit portion and the data driving circuit portion, wherein each of the first to mth stage circuits can include a logic circuit portion controlling a voltage of each of a first control node and a second control node, a node boosting circuit boosting the voltage of each of the control nodes in accordance with boosting shift clocks, a scan output circuit outputting each of first to ith scan shift clocks as first to ith scan signals (i is a natural number of 3 or more) in response to the boosting voltage of the first control node, and a carry output circuit outputting carry shift clocks as carry signals in response to the boosting voltage of the first control node.

According to one embodiment of the present disclosure, the first to mth stage circuits can be grouped into n number of stage groups (n is m/i) having i number of stage circuits adjacent to one another, each of the i number of stage circuits can sequentially output the first to ith scan signals, and a kth stage scan signal (k is 1 to i) output from a jth stage circuit (is 1 to i−1) of the i number stage circuits can be prior to a kth scan signal output from a (j+1)th stage circuit.

According to one embodiment of the present disclosure, the first to ith scan signals can be non-overlapped with one another, and the scan signals output from the stage group can be overlapped with one another.

According to one embodiment of the present disclosure, the data driving circuit portion can output first to ith data voltages respectively synchronized with the first to ith scan signals to display their respective colors different from one another, and the kth data voltage of the first to ith data voltages can be supplied to the kth subpixel.

According to one embodiment of the present disclosure, the display panel can further include a plurality of reference lines crossing the first to mth gate line groups, connected to the data driving circuit portion, the timing controller can control the display panel in a display mode and a sensing mode, the gate driving circuit portion can supply the scan signal to any one of the gate lines in the sensing mode, and the data driving circuit portion can supply a sensing data voltage synchronized with the scan signal to the plurality of data lines and sense driving characteristics of the subpixels through the plurality of reference lines in the sensing mode.

According to one embodiment of the present disclosure, the timing controller can control the display mode in an image display period and a black display period, the gate driving circuit portion can supply only the scan signal to the gate lines at the black display period, and the data driving circuit portion can supply a black data voltage synchronized with the scan signal to the plurality of data lines at the black display period.

According to one embodiment of the present disclosure, each of the plurality of unit pixels can display an image at the image display period, and display a black image at the black display period.

A gate driving circuit and display apparatus including the same according to an embodiment of the present disclosure can be applied to all electronic apparatus including a display panel and/or a gate driving circuit built in the display panel. Example, gate driving circuit and display apparatus including the same according to an embodiment of the present disclosure can be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), wall paper display apparatuses, signage devices, game machines, notebook computers, monitors, cameras, camcorders, home appliances, etc.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A gate driving circuit comprising:
   first to mth stage circuits where m is a positive number, each of the first to mth stage circuits including:
      a logic circuit portion configured to control a voltage of each of a first control node and a second control node;
      a node boosting circuit configured to boost the voltage of each of the control nodes in accordance with boosting shift clock signals;
      a scan output circuit configured to output each of first to ith scan shift clock signals as first to ith scan signals in response to the boosting voltage of the first control node, where i is a natural number of 3 or more; and
      a carry output circuit configured to output carry shift clock signals as carry signals in response to the boosting voltage of the first control node,
   wherein:
      each of the first to ith scan shift clock signals has a first high voltage of a first period and a first low voltage of a second period,
      the boosting shift clock signal has a second high voltage of a third period different from the first period and a second low voltage of a fourth period different from the second period, and
      the third period of the boosting shift clock signal is overlapped with the first period of each of the first to ith scan shift clock signals.

2. The gate driving circuit of claim 1, wherein a boosting maximum voltage of the control node based on the boosting shift clock signals is higher than a maximum voltage of the scan shift clock signals or a maximum voltage of the carry shift clock signals.

3. The gate driving circuit of claim 1, wherein a voltage swing width of the boosting shift clock signals is greater than a voltage swing width of the carry shift clock signals.

4. The gate driving circuit of claim 1, wherein a high voltage of the boosting shift clock signal is higher than a high voltage of the scan shift clock signal.

5. The gate driving circuit of claim 1, wherein:
   the carry shift clock signal is swung between the first high voltage and the first low voltage,
   the boosting shift clock signal is swung between the second high voltage and the second low voltage, and
   the second high voltage of the boosting shift clock signal is higher than the first high voltage of the carry shift clock signal.

6. The gate driving circuit of claim 1, wherein the node boosting circuit includes:
   a boosting pull-up thin film transistor configured to receive the boosting shift clock signal, switched in accordance with the voltage of the first control node;
   a boosting pull-down thin film transistor connected to a source electrode of the boosting pull-up thin film transistor and switched in accordance with the voltage of the second control node; and
   a capacitor embodied between a gate electrode and the source electrode of the boosting pull-up thin film transistor.

7. The gate driving circuit of claim 1, wherein the scan output circuit includes:
   first to ith scan pull-up thin film transistors switched in accordance with the voltage of the first control node, outputting each of the first to ith scan shift clock signals as each of the first to ith scan signals through each of first to ith scan output nodes; and
   first to ith scan pull-down thin film transistors switched in accordance with the voltage of the second control node, individually outputting a gate low potential voltage through each of the first to ith scan output nodes.

8. The gate driving circuit of claim 1, wherein the carry output circuit includes:
   a carry pull-up thin film transistor switched in accordance with the voltage of the first control node, outputting the carry shift clock signal as the carry signal through a carry output node; and
   a carry pull-down thin film transistor switched in accordance with the voltage of the second control node, outputting a gate low potential voltage through the carry output node.

9. The gate driving circuit of claim 1, wherein each of the first to mth stage circuits further includes a third control node and a memory node, and
the logic circuit portion includes:
a node control circuit configured to control a voltage of each of the first to third control nodes based on the first front carry signal;
an inverter circuit configured to control the voltage of the second control node in accordance with the voltage of the first control node;
a sensing control circuit configured to control the voltage of the memory node based on a line sensing preparation signal, a second front carry signal and a first reset signal; and
a node reset circuit configured to reset the voltage of the second control node to a gate low potential voltage based on the first front carry signal, the voltage of the memory node and the first reset signal.

10. The gate driving circuit of claim 9, wherein:
the second control node embodied in an nth stage circuit of the first to mth stage circuits is electrically connected with the third control node embodied in an (n+1)th stage circuit, and
the third control node embodied in the nth stage circuit is electrically connected with the second control node embodied in the (n+1)th stage circuit.

11. The gate driving circuit of claim 10, wherein:
an inverter circuit of the nth stage circuit additionally controls the voltage of the second control node of the nth stage circuit in accordance with the voltage of the first control node of the (n+1)th stage circuit, and
an inverter circuit of the (n+1)th stage circuit additionally controls the voltage of the second control node of the (n+1)th stage circuit in accordance with the voltage of the first control node of the nth stage circuit.

12. The gate driving circuit of claim 10, wherein the node reset circuit of the nth stage circuit discharges the voltage of the first control node of the nth stage circuit with the gate low potential voltage in response to the first reset signal and the voltage of the memory node, and discharges the voltage of the first control node of the nth stage circuit with the gate low potential voltage in response to a second reset signal and the voltage of the memory node.

13. The gate driving circuit of claim 10, wherein:
the sensing control circuit of the nth stage circuit controls the voltage of the memory node through a voltage of the second front carry signal in response to the line sensing preparation signal and the second front carry signal, outputs a first gate high potential voltage to a sharing node in accordance with the voltage of the memory node, and
the sensing control circuit of the (n+1)th stage circuit is electrically connected with the memory node of the nth stage circuit and switched in accordance with the first reset signal to supply the first gate high potential voltage supplied through the sharing node of the nth stage circuit, to the first control node of the (n+1)th stage circuit.

14. The gate driving circuit of claim 1, wherein:
each of the first to mth stage circuits sequentially outputs the scan signal and the carry signal at a vertical active period of each frame period, and
any one of the first to mth stage circuits outputs the scan signal at a vertical blank period of each frame period.

15. A display apparatus comprising:
a display panel including a plurality of data lines, a plurality of gate lines crossing the plurality of data lines, and a plurality of subpixels connected to their adjacent data and gate lines;
a gate driving circuit portion including first to mth stage circuits outputting scan signals corresponding to a given order of a unit of i number of gate lines of the plurality of gate lines;
a data driving circuit portion connected to each of the plurality of data lines; and
a timing controller configured to control a driving timing of each of the gate driving circuit portion and the data driving circuit portion,
wherein the gate driving circuit portion includes the gate driving circuit of claim 1.

16. A display apparatus comprising:
a display panel including a plurality of data lines, first to mth gate line groups having first to ith gate lines and a plurality of unit pixels having first to ith subpixels connected to their respective gate lines within the first to mth gate line groups and commonly connected to one data line;
a gate driving circuit portion including first to mth stage circuits connected to the first to mth gate line groups;
a data driving circuit portion configured to sequentially supply data voltages respectively corresponding to the first to ith subpixels, to each of the plurality of data lines; and
a timing controller configured to supply subpixel data suitable for a driving order of the first to ith subpixels to the data driving circuit portion and control a driving timing of each of the gate driving circuit portion and the data driving circuit portion,
wherein the gate driving circuit portion includes the gate driving circuit of claim 1.

17. The display apparatus of claim 16, wherein:
the first to mth stage circuits are grouped into n number of stage groups having i number of stage circuits adjacent to one another, where n is m/i,
each of the i number of stage circuits sequentially outputs first to ith scan signals, and
a kth stage scan signal output from a jth stage circuit of the i number stage circuits is prior to a kth scan signal output from a (j+1)th stage circuit, where k is 1 to i and j is 1 to i−1.

18. The display apparatus of claim 17, wherein the first to ith scan signals are non-overlapped with one another, and the scan signals output from the stage group are overlapped with one another.

19. The display apparatus of claim 17, wherein:
the data driving circuit portion outputs first to ith data voltages respectively synchronized with the first to ith scan signals to display their respective colors different from one another, and
the kth data voltage of the first to ith data voltages is supplied to the kth subpixel.

20. The display apparatus of claim 17, wherein:
the display panel further includes a plurality of reference lines crossing the first to mth gate line groups, connected to the data driving circuit portion,
the timing controller controls the display panel in a display mode and a sensing mode,
the gate driving circuit portion supplies the scan signal to any one of the gate lines in the sensing mode, and
the data driving circuit portion supplies a sensing data voltage synchronized with the scan signal to the plurality of data lines and senses driving characteristics of the subpixels through the plurality of reference lines in the sensing mode.

21. The display apparatus of claim 20, wherein:
the timing controller controls the display mode in an image display period and a black display period,
the gate driving circuit portion supplies only the scan signal to the gate lines at the black display period, and
the data driving circuit portion supplies a black data voltage synchronized with the scan signal to the plurality of data lines at the black display period.

22. The display apparatus of claim 20, wherein each of the plurality of unit pixels displays an image at the image display period, and displays a black image at the black display period.

23. A gate driving circuit comprising:
first to mth stage circuits where m is a positive number, each of the first to mth stage circuits including:
a logic circuit portion configured to control a voltage of each of a first control node and a second control node;
a node boosting circuit configured to boost the voltage of each of the control nodes in accordance with boosting shift clock signals;
a scan output circuit configured to output each of first to ith scan shift clock signals as first to ith scan signals in response to the boosting voltage of the first control node, where i is a natural number of 3 or more; and
a carry output circuit configured to output carry shift clock signals as carry signals in response to the boosting voltage of the first control node,
wherein the carry output circuit includes:
a carry pull-up thin film transistor switched in accordance with the voltage of the first control node, outputting the carry shift clock signal as the carry signal through a carry output node; and
a carry pull-down thin film transistor switched in accordance with the voltage of the second control node, outputting a gate low potential voltage through the carry output node.

* * * * *